(12) United States Patent
Masuyama et al.

(10) Patent No.: US 8,951,709 B2
(45) Date of Patent: Feb. 10, 2015

(54) RESIST COMPOSITION AND METHOD FOR PRODUCING RESIST PATTERN

(75) Inventors: Tatsuro Masuyama, Osaka (JP); Satoshi Yamamoto, Osaka (JP); Koji Ichikawa, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/280,969

(22) Filed: Oct. 25, 2011

(65) Prior Publication Data

US 2012/0100482 A1  Apr. 26, 2012

(30) Foreign Application Priority Data

Oct. 26, 2010 (JP) ................................ 2010-239428

(51) Int. Cl.

| G03F 7/00 | (2006.01) |
|---|---|
| G03F 7/20 | (2006.01) |
| G03F 7/004 | (2006.01) |
| G03F 7/039 | (2006.01) |

(52) U.S. Cl.
CPC ............ *G03F 7/2041* (2013.01); *G03F 7/0046* (2013.01); *G03F 7/0397* (2013.01); *G03F 7/0045* (2013.01)
USPC ........................................ 430/270.1; 430/322

(58) Field of Classification Search
None
See application file for complete search history.

(56) References Cited

U.S. PATENT DOCUMENTS

| 3,779,778 | A | 12/1973 | Smith et al. | |
|---|---|---|---|---|
| 3,849,137 | A | 11/1974 | Barzynski et al. | |
| 4,576,902 | A | 3/1986 | Saenger et al. | |
| 4,822,716 | A | 4/1989 | Onishi et al. | |
| 4,857,437 | A | 8/1989 | Banks et al. | |
| 5,017,453 | A | 5/1991 | Onishi et al. | |
| 5,073,476 | A | 12/1991 | Meier et al. | |
| 5,198,520 | A | 3/1993 | Onishi et al. | |
| 5,260,410 | A | 11/1993 | Schwalm | |
| 5,453,341 | A | 9/1995 | Schwalm | |
| 7,465,528 | B2 | 12/2008 | Nishiyama et al. | |
| 2007/0087288 | A1 | 4/2007 | Nishiyama et al. | |
| 2008/0081293 | A1* | 4/2008 | Harada et al. | 430/287.1 |
| 2009/0197204 | A1* | 8/2009 | Shiono et al. | 430/286.1 |
| 2009/0317743 | A1 | 12/2009 | Shiono et al. | |
| 2010/0022730 | A1* | 1/2010 | Hatakeyama et al. | 526/246 |
| 2010/0035185 | A1 | 2/2010 | Hagiwara et al. | |
| 2010/0062365 | A1* | 3/2010 | Shimada et al. | 430/270.1 |
| 2010/0266957 | A1* | 10/2010 | Harada et al. | 430/285.1 |
| 2012/0028189 | A1* | 2/2012 | Asano et al. | 430/285.1 |
| 2012/0034560 | A1* | 2/2012 | Nakahara et al. | 430/270.1 |
| 2012/0034563 | A1 | 2/2012 | Ichikawa et al. | |
| 2012/0082934 | A1* | 4/2012 | Nakahara et al. | 430/285.1 |

FOREIGN PATENT DOCUMENTS

| DE | 39 14 407 | A1 | 10/1990 |
|---|---|---|---|
| EP | 0 126 712 | A1 | 11/1984 |
| JP | 55-164824 | A | 12/1980 |
| JP | 62-69263 | A | 3/1987 |
| JP | 62-153853 | A | 7/1987 |
| JP | 63-26653 | A | 2/1988 |
| JP | 63-146029 | A | 6/1988 |
| JP | 63-146038 | A | 6/1988 |
| JP | 63-163452 | A | 7/1988 |
| JP | 11-52575 | A | 2/1999 |
| JP | 2002-226436 | A | 8/2002 |
| JP | 2007-108581 | A | 4/2007 |
| JP | 2010-152341 | A | 7/2010 |
| JP | 2010-197413 | A | 9/2010 |
| JP | 2010-204646 | A | 9/2010 |
| WO | WO 2008/015876 | A1 | 2/2008 |
| WO | WO 2008/099869 | A1 | 8/2008 |

* cited by examiner

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

A resist composition contains a resin having a structural unit represented by the formula (aa) and a structural unit represented by the formula (ab); and an acid generator,

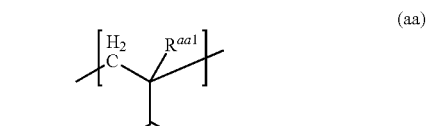

(aa)

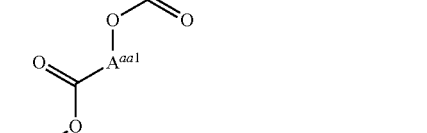

(ab)

wherein $R^{aa1}$ represents a hydrogen atom and a methyl group; $A^{aa1}$ represents an optionally substituted $C_1$ to $C_6$ alkanediyl group etc.; $R^{aa2}$ represents an optionally substituted $C_1$ to $C_{18}$ aliphatic hydrocarbon group; $R^{ab1}$ represents a hydrogen atom and a methyl group; $A^{ab1}$ represents a single bond, an optionally substituted $C_1$ to $C_6$ alkanediyl group etc.; $W^1$ represents an optionally substituted $C_4$ to $C_{36}$ alicyclic hydrocarbon group; n represents 1 or 2; $A^{ab2}$ in each occurrence independently represents an optionally substituted $C_1$ to $C_6$ aliphatic hydrocarbon group; $R^{ab2}$ in each occurrence independently represents a $C_1$ to $C_{12}$ fluorinated alkyl group.

6 Claims, No Drawings

RESIST COMPOSITION AND METHOD FOR PRODUCING RESIST PATTERN

CROSS-REFERENCE TO RELATED APPLICATIONS

This application claims priority to Japanese Application No. 2010-239428 filed on Oct. 26, 2010. The entire disclosures of Japanese Application No. 2010-239428 is incorporated hereinto by reference.

BACKGROUND OF THE INVENTION

1. Field of the Invention

The present invention relates to a resin, a resist composition and a method for producing a resist pattern.

2. Background Information

Various kinds of photolithographic technique in which short wavelength light such as ArF excimer laser (193 nm of wavelength) is a exposure light source have been actively studied in the past as the semiconductor microfabrication. A resist composition used for such photolithographic technique contains a resin which is insoluble or poorly soluble in aqueous alkali solution, but becomes soluble in aqueous alkali solution by the action of acid and an acid generator.

A resist composition used for such photolithographic technique contains a resin having a polymer obtained by polymerizing a compound represented by the formula (u-A) and a compound represented by the formula (u-B), and a polymer obtained by polymerizing a compound represented by the formula (u-B), a compound represented by the formula (u-C) and a compound represented by the formula (u-D); an acid generator; and a solvent, is described in Patent document, pamphlet of JP-2010-197413-A.

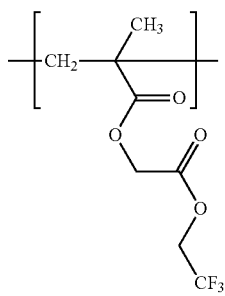
(u-A)

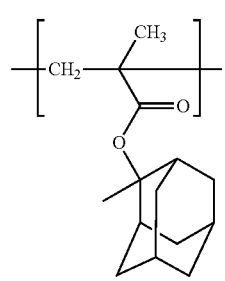
(u-B)

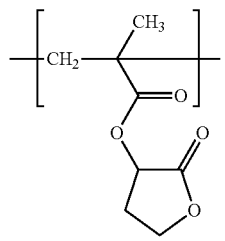
(u-C)

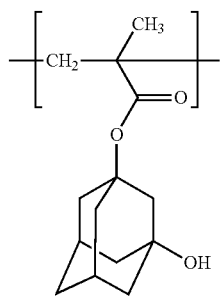
(u-D)

However, with the conventional resist composition containing the above resin, the critical dimension uniformity (CDU) of the obtained resist pattern may be not always satisfied with.

SUMMARY OF THE INVENTION

The present invention provides following inventions.

<1> A resist composition comprising;
a resin having a structural unit represented by the formula (aa) and a structural unit represented by the formula (ab); and an acid generator,

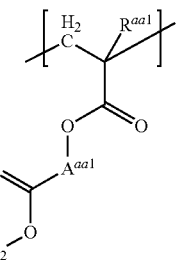
(aa)

wherein $R^{aa1}$ represents a hydrogen atom or a methyl group;
$A^{aa1}$ represents an optionally substituted $C_1$ to $C_6$ alkanediyl group or a group represented by the formula (a-1);

(a-1)

wherein s represents 0 or 1;
$X^{10}$ and $X^{11}$ independently represents an oxygen atom, a carbonyl group, a carbonyloxy group or an oxycarbonyl group;
$A^{10}$, $A^{11}$ and $A^{12}$ independently represent an optionally substituted $C_1$ to $C_5$ aliphatic hydrocarbon group;
* represents a bond to a carbon atom;

$R^{aa2}$ represents an optionally substituted $C_1$ to $C_{18}$ aliphatic hydrocarbon group, and one or more —$CH_2$— contained in the aliphatic hydrocarbon group may be replaced by —O— or —CO—;

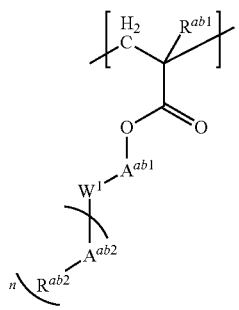

(ab)

wherein $R^{ab1}$ represents a hydrogen atom or a methyl group;

$A^{ab1}$ represents a single bond, an optionally substituted $C_1$ to $C_6$ alkanediyl group or a group represented by the formula (a-2);

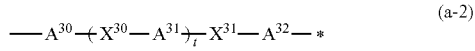

(a-2)

wherein t represents 0 or 1;

$X^{30}$ and $X^{31}$ independently represents an oxygen atom, a carbonyl group, a carbonyloxy group or an oxycarbonyl group;

$A^{30}$ and $A^{31}$ independently represent an optionally substituted $C_1$ to $C_5$ aliphatic hydrocarbon group;

$A^{32}$ represents an optionally substituted $C_1$ to $C_5$ aliphatic hydrocarbon group or a single bond;

* represents a bond to $W^1$;

$W^1$ represents an optionally substituted $C_4$ to $C_{36}$ alicyclic hydrocarbon group, and one or more —$CH_2$— contained in the alicyclic hydrocarbon group may be replaced by —O— or —CO—;

n represents 1 or 2;

$A^{ab2}$ in each occurrence independently represents an optionally substituted $C_1$ to $C_6$ aliphatic hydrocarbon group, and one or more —$CH_2$— contained in the aliphatic hydrocarbon group may be replaced by —O— or —CO—; and $R^{ab2}$ each occurrence independently represents a $C_1$ to $C_{12}$ fluorinated alkyl group, and one or more hydrogen atom contained in the fluorinated alkyl group may be replaced by a hydroxy group or a hydroxymethyl group.

<2> The resist composition according to <1>, wherein $A^{aa1}$ of the formula (aa) is a $C_1$ to $C_6$ alkanediyl group.

<3> The resist composition according to <1> or <2>, wherein $A^{aa1}$ of the formula (aa) is a methylene group.

<4> The resist composition according to any one of <1> to <3>, wherein n of the formula (ab) is 1, and $W^1$ of the formula (ab) is an adamantanediyl group or a cyclohexanediyl group.

<5> The resist composition according to any one of <1> to <4>, wherein the acid generator is an acid generator represented by the formula (B1);

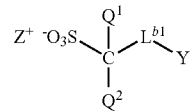

(B1)

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and one or more —$CH_2$— contained in the aliphatic hydrocarbon group may be replaced by —O— or —CO—;

Y represents an optionally substituted $C_1$ to $C_{18}$ aliphatic hydrocarbon group, and one or more —$CH_2$— contained in the aliphatic hydrocarbon group may be replaced by —O—, —CO— or —$SO_2$—; and Z+ represents an organic cation.

<6> The resist composition according to <5>, wherein Y of the formula (B1) is an optionally substituted $C_3$ to $C_{18}$ alicyclic hydrocarbon group.

<7> The resist composition according to any one of <1> to <6>, further comprising a resin which is insoluble or poorly soluble in aqueous alkali solution, but becomes soluble in aqueous alkali solution by the action of acid.

<8> The resist composition according to any one of <1> to <7>, further comprising a solvent.

<9> A method for producing a resist pattern comprising steps of;

(1) applying the resist composition according to any one of <1> to <8> onto a substrate;

(2) drying the applied composition to form a composition layer;

(3) exposing the composition layer;

(4) heating the exposed composition layer; and (5) developing the heated composition layer.

According to a resist composition of the present invention, it is possible to produce a resist pattern with excellent CDU, and with few defects in the obtained resist pattern.

DETAILED DESCRIPTION OF THE PREFERRED EMBODIMENTS

<Definition>

In the present specification, any group exemplified below is applicable to any of the chemical formulae having a similar group with optionally selecting the number of carbon atoms, unless otherwise specified. The number attached to "C" means the carbon number of each group. When a group can form linear and branched chain and/or cyclic structures, all structures are included and may simultaneously present in one group, unless otherwise specified. When one group or moiety takes a stereoisomeric form, all stereoisomeric forms are included. Each group can form monovalent, or di- or more-valent group depending on the bonded position and bonding form.

A hydrocarbon group includes an aliphatic hydrocarbon group and an aromatic group. The aliphatic hydrocarbon group includes a chain aliphatic hydrocarbon group, an alicyclic hydrocarbon group and a combination thereof.

Examples of a monovalent chain aliphatic hydrocarbon group include methyl, ethyl, propyl, butyl, pentyl, hexyl, heptyl, octyl, decyl, dodecyl, hexadecyl, pentadecyl, hexyldecyl, heptadecyl and octadecyl groups. The aliphatic hydrocarbon group may be any of a liner and a branched chain aliphatic hydrocarbon groups. The chain aliphatic hydrocarbon group may include a carbon-carbon double bond, but a saturated chain aliphatic hydrocarbon group, i.e., alkyl group, is preferable.

Examples of a divalent chain aliphatic hydrocarbon group include a group in which one hydrogen atom is removed from the above the monovalent chain aliphatic hydrocarbon group, i.e., alkanediyl group.

The cyclic aliphatic hydrocarbon group may be any of a monocyclic or a polycyclic aliphatic hydrocarbon groups. The cyclic aliphatic hydrocarbon group hereinafter may be referred to as "alicyclic hydrocarbon group". The alicyclic hydrocarbon group may include a carbon-carbon double bond, but a saturated alicyclic hydrocarbon group is preferable.

Examples of a monovalent alicyclic hydrocarbon group include a group in which one hydrogen atom is removed from an alicyclic hydrocarbon. Examples of a divalent alicyclic hydrocarbon group include a group in which two hydrogen atoms are removed from the alicyclic hydrocarbon group.

Examples of the alicyclic hydrocarbon typically include a cycloalkane below.

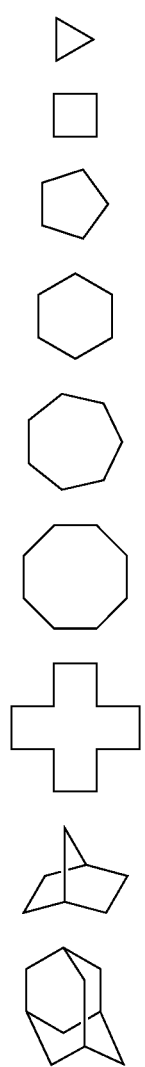

(KA-1)
(KA-2)
(KA-3)
(KA-4)
(KA-5)
(KA-6)
(KA-7)
(KA-8)
(KA-9)

-continued

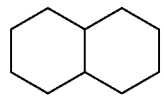 (KA-10)

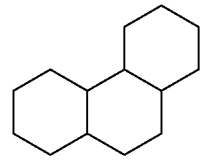 (KA-11)

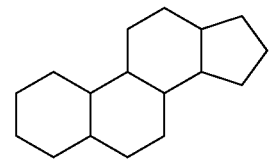 (KA-12)

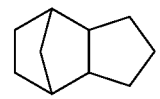 (KA-13)

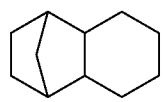 (KA-14)

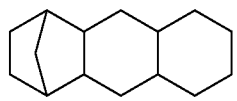 (KA-15)

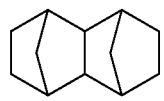 (KA-16)

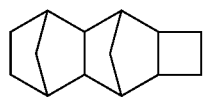 (KA-17)

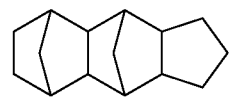 (KA-18)

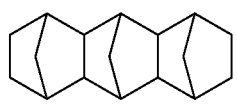 (KA-19)

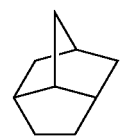 (KA-20)

 (KA-21)

(KA-22)

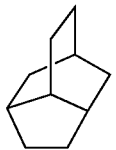

Examples of the aromatic hydrocarbon group typically include an aryl group such as phenyl, naphthyl, anthryl, biphenyl, phenanthryl and fluorenyl groups.

The aliphatic hydrocarbon group and the aromatic hydrocarbon group may be substituted with a substituent.

Typical examples of the substituent of the aliphatic hydrocarbon group include a halogen atom, an alkoxy group, an acyl group, an aryl group, an aralkyl group and an aryloxy group.

Typical examples of the substituent of the aromatic hydrocarbon group include a halogen atom, an alkoxy group, an acyl group, an alkyl group and an aryloxy group.

Examples of the halogen atom include fluorine, chlorine, bromine and iodine atoms.

Examples of the alkoxyl group include methoxy, ethoxy, propoxy, butoxy, pentyloxy, hexyloxy, heptyloxy, octyloxy, decyloxy and dodecyloxy groups. The alkoxyl group may be any of a liner and a branched chain alkoxyl groups.

Examples of the acyl group include a group bonding a carbonyl group to the alkyl group, such as, acetyl, propionyl, butyryl, valeryl, hexylcarbonyl, heptylcarbonyl, octylcarbonyl, decylcarbonyl and dodecylcarbonyl groups, and a group bonding a carbonyl group to the aryl group, such as, benzoyl group. The alkyl group in the acyl group may be any of a liner and a branched chain alkyl groups.

Examples of the aryloxy group include a group bonding an oxygen atom to the above aryl group.

Examples of the aralkyl group include benzyl, phenethyl, phenylpropyl, naphthylmethyl and naphthylethyl groups.

"(meth)acrylic monomer" means at least one monomer having a structure of "$CH_2$=CH—CO—" or "$CH_2$=C($CH_3$)—CO—", as well as "(meth)acrylate" and "(meth)acrylic acid" mean "at least one acrylate or methacrylate" and "at least one acrylic acid or methacrylic acid", respectively.

<Resist Composition>

The resist composition of the present invention contains; a resin (hereinafter may be referred to as "resin (X)"), and an acid generator (hereinafter may be referred to as "acid generator (B)").

The resist composition can be produced a resist pattern with excellent CDU by using the resin (X).

Further, the present resist composition preferably contains a resin having properties which is insoluble or poorly soluble in alkali aqueous solution, but becomes soluble in an alkali aqueous solution by the action of an acid. Hereinafter such resin may be referred to as "resin (A)". The resin (A) is different from the resin (X).

The resin (X) may have the above properties. Therefore, it is possible to form a good resist pattern by using the present resist composition through a synergetic effect of the resin and the acid generator (B).

When the resin (X) may have the above properties, the present resist composition may not always contain the resin (A).

Also, the present resist composition preferably contains a solvent (hereinafter may be referred to as "solvent (D)") and/or an additive such as a basic compound (hereinafter may be referred to as "basic compound (C)") which is known as a quencher in this technical field, as needed.

<Resin (X)>

The resin (X) has a structural unit represented by the formula (aa) (hereinafter may be referred to as "structural unit (aa)") and a structural unit represented by the formula (ab) (hereinafter may be referred to as "structural unit (ab)").

<Structural Unit (aa)>

The structural unit (aa) represents by the formula (aa) below.

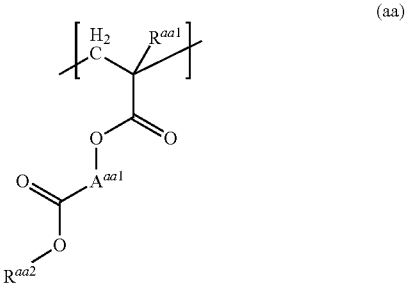

(aa)

wherein $R^{aa1}$ represents a hydrogen atom or a methyl group;

$A^{aa1}$ represents an optionally substituted $C_1$ to $C_6$ alkanediyl group or a group represented by the formula (a-1);

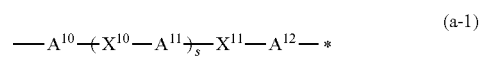

(a-1)

wherein s represents 0 or 1;

$X^{10}$ and $X^{11}$ independently represents an oxygen atom, a carbonyl group, a carbonyloxy group or an oxycarbonyl group;

$A^{10}$, $A^{11}$ and $A^{12}$ independently represent an optionally substituted $C_1$ to $C_5$ aliphatic hydrocarbon group;

* represents a bond to a carbon atom;

$R^{aa2}$ represents an optionally substituted $C_1$ to $C_{18}$ aliphatic hydrocarbon group, and one or more —$CH_2$— contained in the aliphatic hydrocarbon group may be replaced by —O— or —CO—.

The alkanediyl group of the $A^{aa1}$ may be either a linear or a branched chain alkanediyl group. Examples of the alkanediyl group include a linear alkanediyl group such as methylene, ethylene, propane-1,3-diyl, propane-1,2-diyl, butane-1,4-diyl, pentane-1,5-diyl, pentane-1,4-diyl, hexane-1,6-diyl and hexane-1,5-diyl; a branched chain alkanediyl group such as 1-methylpropane-1,3-diyl, 2-methylpropane-1,2-diyl, 1-methylbutane-1,4-diyl and 2-methylbutane-1,4-diyl groups.

Examples of the substituent of the alkanediyl group include a hydroxy group and a $C_1$ to $C_6$ alkoxy group.

The group (a-1) is a divalent group containing an atom or atomic group of an oxygen atom, a carbonyl group, a carbonyloxy group or an oxycarbonyl group such as $X^{10}$ and $X^{11}$.

Examples of the aliphatic hydrocarbon group of $A^{10}$, $A^{11}$ and $A^{12}$ in the group (a-1) include an alkanediyl group such as methylene, ethylene, propane-1,3-diyl, propane-1,2-diyl, butane-1,4-diyl, 1-methylpropane-1,3-diyl, 2-methylpropane-1,3-diyl and 2-methylpropane-1,2-diyl groups.

Examples of the substituent of $A^{10}$, $A^{11}$ and $A^{12}$ include a hydroxy group and a $C_1$ to $C_6$ alkoxy group.

Examples of the group (a-1) containing an oxygen atom include as below. In the formula, * represents a bond (the similar shall apply hereinafter for "bond"). In particular, the bond here represents a bonding site.

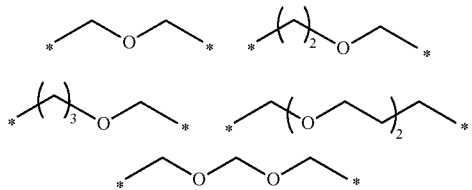

Examples of the group (a-1) containing a carbonyl group include as below.

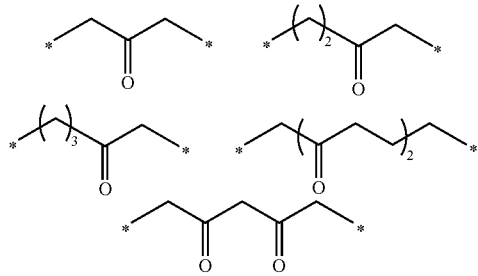

Examples of the group (a-1) containing a carbonyloxy group include as below.

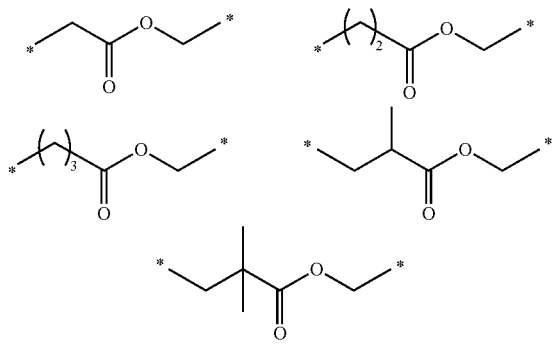

Examples of the group (a-1) containing an oxycarbonyl group include as below.

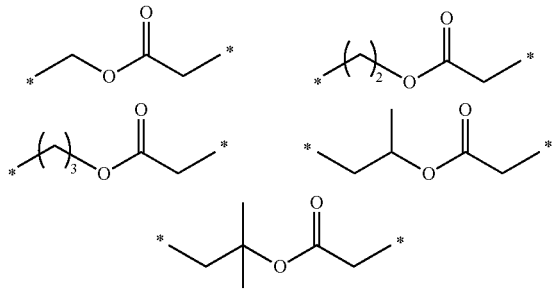

Among these, $A^{aa1}$ is preferably a $C_1$ to $C_6$ alkanediyl group, more preferably a $C_1$ to $C_4$ alkanediyl group, and still more preferably a methylene group.

The aliphatic hydrocarbon group of $R^{aa2}$ may include a carbon-carbon double bond, but a saturated aliphatic hydrocarbon group is preferable. Preferable examples of the aliphatic hydrocarbon group include either a linear or a branched chain alkyl group and an alicyclic hydrocarbon group.

Examples of an alkyl group include methyl, ethyl, propyl, butyl group, pentyl, hexyl, heptyl and octyl groups.

Examples of an alicyclic hydrocarbon group include a mono-alicyclic hydrocarbon group, i.e., a cycloalkyl group, such as cyclopentyl, cyclohexyl, methylcyclohexyl, dimethylcyclohexyl, cycloheptyl and cyclooctyl groups; and polyalicyclic hydrocarbon groups such as decahydronaphtyl, adamantyl, norbornyl (i.e., bicyclo[2.2.1]hexyl) and methyl norbornyl groups as well as groups as below, and a group in combination thereof.

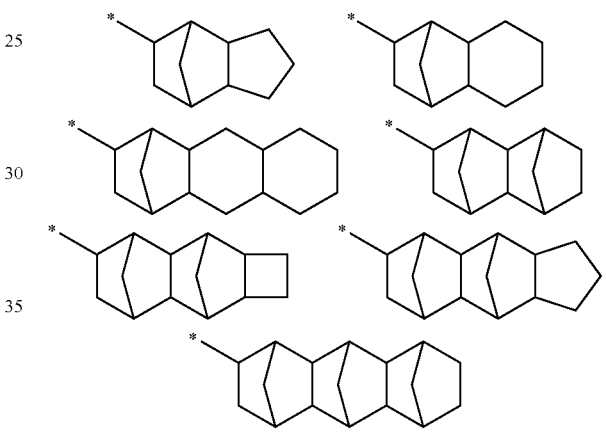

The —$CH_2$— contained in the aliphatic hydrocarbon group of $R^{aa2}$ may be replaced by at most two of oxygen atom and/or carbonyl group.

The aliphatic hydrocarbon group of $R^{aa2}$ may have a substituent, and the substituent is preferably a fluorine atom. The aliphatic hydrocarbon group substituted with a fluorine atom of $R^{aa2}$ is preferably an aliphatic hydrocarbon group in which all hydrogen atoms contained in the group is substituted with fluorine atoms (e.g., perfluoroalkyl group or perfluorocycloalkyl group), and more preferably a saturated liner chain aliphatic hydrocarbon group substituted with a fluorine atom, in particular, perfluotoalkyl group.

Examples of the fluorinated chain aliphatic hydrocarbon group include difluoramethyi, trifluoromethyl, 1,1-difluoroethyl, 2,2-difluoroethyl, 1,1,1-trifluoroethyl, 2,2,2-trifluoroethyl, perfluoroethyl, 1,1,2,2-tetrafluoropropyl, 1,1,1,2,2-pentafluoropropy , 1,1,2,2,3,3-hexafluoropropyl, perfluoroethylmethyl , 1-(trifluoromethyl-1,2,2,2-tetralluoreethyl, perfluoropropyl , 1,1,2,2-tetrafluorobutyl, 1,1,1,2,2, 3-pentafluorobutyl, 1,1,2,2,3,3-hexafluorobutyl, 1,2,2,3,3,4, 4-octafluorobutyl, perfluorobutyl, 1,1-bis(trifluoro) methyl ,2,2,2-trifluoroethyl, 2-(perfluoropropyl)ethyl, 1,1,2, 2,3,3,4,4-octafluoropentyl, 1,1,1,2,2,3,3,4,4-nonafluoropentyl, perfluoropelentyl, 1,1,2,2,3,3,4,4,5,5-decafluoropentyl, 1,1-bis(trifluoromethyl)-2,2,3,3,3-pentafluoropropyl, 1,1,1,2,2,3,3,4,4-nonafluoropentyl, perfluoropentyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl, perfluorohexyl, perfluoroheptyl and perfluorooctyl groups.

Among these, trifluoromethyl, 1,1,1-trifluoroethyl, perfluoroethyl, 1,1,1,2,2-pentafluoropropyl, perfluoropropyl, 1,1,1,2,2,3,3-heptafluorobutyl, perfluorobuty, 1,1,1,2,2,3,3,4,4-nonafluoropentyl, perfluoropentyl, perfluorohexyl, perfluoroneptyl and perfluorooetyl groups are preferable, a $C_1$ to $C_6$ perfluoroalkyl group is more perferable and a $C_1$ to $C_3$ perfluoroalkyl group is still more preferable.

Example of the structural unit (aa) in which $A^{aa1}$ is an alkanediyl group include structural units below.

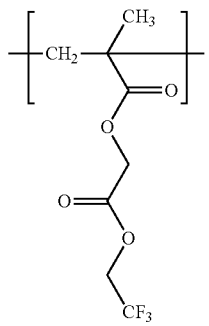
(aa-1)

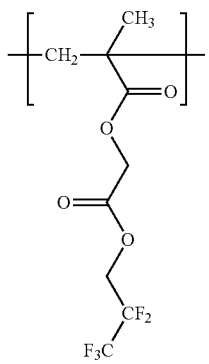
(aa-2)

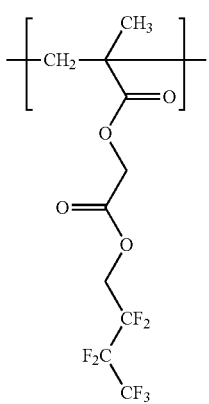
(aa-3)

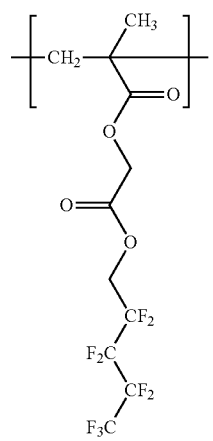
(aa-4)

-continued

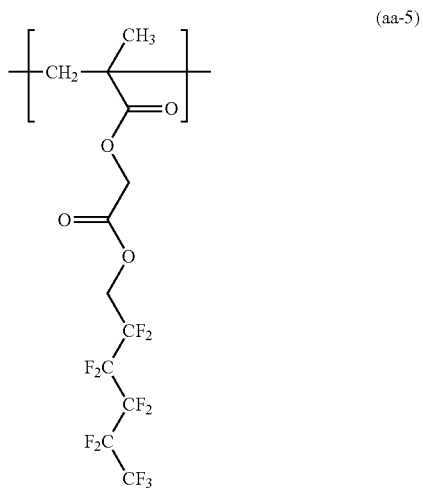
(aa-5)

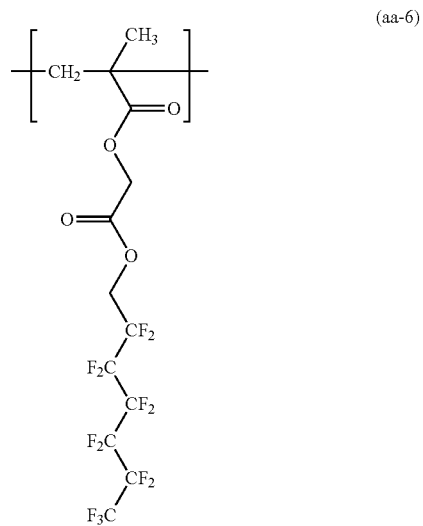
(aa-6)

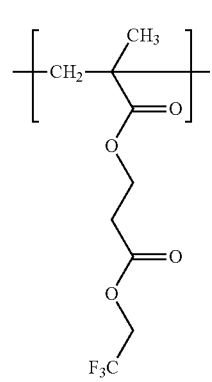
(aa-7)
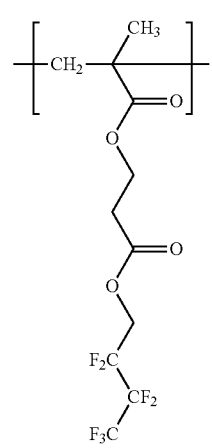
(aa-8)
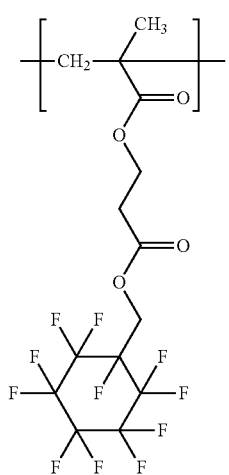
(aa-9)
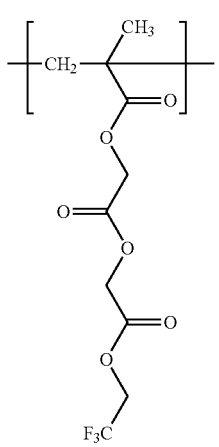
(aa-10)
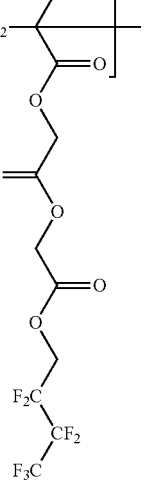
(aa-11)
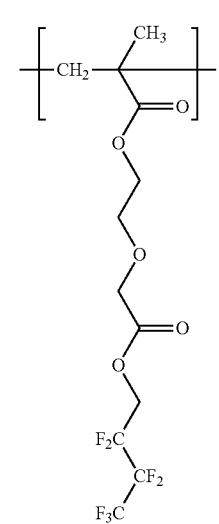
(aa-12)

(aa-13)

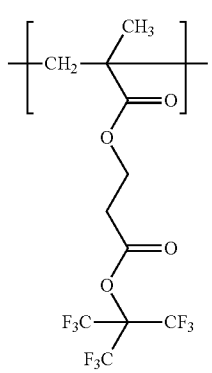

(aa-14)

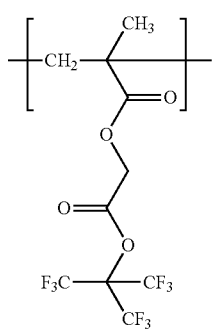

Also, examples of the structural units above include structural units in which a partial structure M in the structural units represented by the above is replaced by a partial structure A as described below.

Partial structure M:

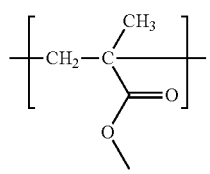

Partial structure A:

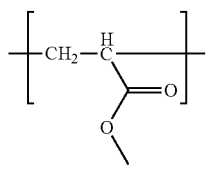

The structural unit (aa) is derived from the compound represented by the formula (aa'), hereinafter may be referred to as "compound (aa')".

(aa')

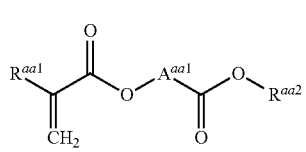

wherein $A^{aa1}$, $R^{aa1}$ and $R^{aa2}$ have the same definition of the above.

The compound (aa') can be produced, for example, by reacting a compound represented by the formula (aas-1) with a compound represented by the formula (aas-2) in presence of a catalyst in a solvent.

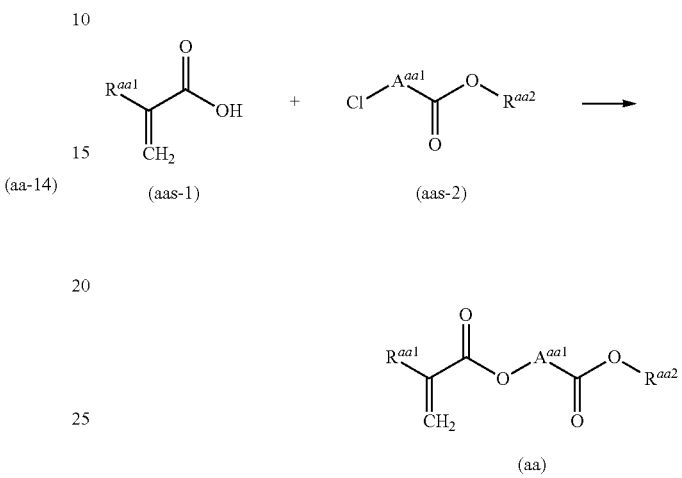

wherein $A^{aa1}$, $R^{aa1}$ and $R^{aa2}$ have the same definition of the above.

Preferred examples of the solvent include dimethylformamide.

Preferred examples of the catalyst include potassium carbonate and potassium iodide.

As the compound represented by the formula (aas-1), a marketed product is preferable. Examples of the marketed product include methacrylic acid.

The compound represented by the formula (aas-2) can be obtained by reacting a compound represented by the formula (aas-3) with a compound represented by the formula (aas-4). This reaction is generally performed in presence of a basic catalyst in a solvent.

Examples of the solvent preferably include tetrahydrofuran.

Examples of the basic catalyst include pyridine.

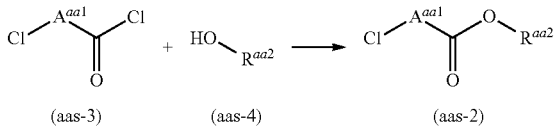

wherein $A^{aa1}$ and $R^{aa2}$ have the same definition of the above.

The compound represented by the formula (aas-3) is a chloroacetyl chloride, which is a marketed product.

The compound represented by the formula (aas-4) is 2,2,3,3,4,4,4-heptafluoro-1-butanole, which is a marketed product.

<Structural Unit (ab)>

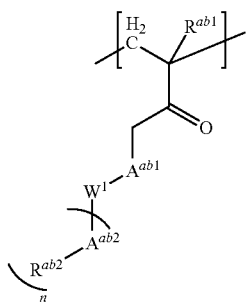

(ab)

wherein $R^{ab1}$ represents a hydrogen atom or a methyl group;

$A^{ab1}$ represents a single bond, an optionally substituted $C_1$ to $C_6$ alkanediyl group or a group represented by the formula (a-2);

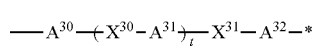

(a-2)

wherein t represents 0 or 1;

$X^{30}$ and $X^{31}$ independently represents an oxygen atom, a carbonyl group, a carbonyloxy group or an oxycarbonyl group;

$A^{30}$ and $A^{31}$ independently represent an optionally substituted $C_1$ to $C_5$ aliphatic hydrocarbon group;

$A^{32}$ represents an optionally substituted $C_1$ to $C_5$ aliphatic hydrocarbon group or a single bond;

* represents a bond to $W^1$;

$W^1$ represents an optionally substituted $C_4$ to $C_{24}$ alicyclic hydrocarbon group, and one or more —$CH_2$— contained in the alicyclic hydrocarbon group may be replaced by —O— or —CO—;

n represents 1 or 2;

$A^{ab2}$ in each occurrence independently represents an optionally substituted $C_1$ to $C_6$ aliphatic hydrocarbon group, and one or more —$CH_2$—contained in the aliphatic hydrocarbon group may be replaced by —O— or —CO—; and $R^{ab2}$ in each occurrence independently represents a $C_1$ to $C_{12}$ fluorinated alkyl group, and one or more hydrogen atom contained in the fluorinated alkyl group may be replaced by a hydroxy group or a hydroxymethyl group.

Examples of the alkanediyl group of the $A^{ab1}$ include the same examples described in $A^{aa1}$ of the formula (aa). Examples of the substituent of the alkanediyl group include the same examples described above, i.e., a hydroxy group and a $C_1$ to $C_6$ alkoxy group.

Examples of the aliphatic hydrocarbon group of $A^{30}$, $A^{31}$ and $A^{32}$ in the group (a-2) include the same examples described in $A^{10}$, $A^{11}$ and $A^{12}$ of the group (a-1).

Examples of the group (a-2) except a group (a-2) in which $A^{32}$ is a single bond include the same examples described in the formula (a-1)

Examples of the group (a-2) containing an oxygen atom in which $A^{32}$ is a single bond include as below. In the formula, * represents a bond.

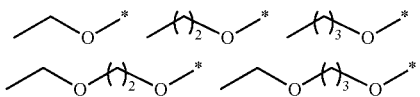

Examples of the group (a-2) containing a carbonyl group in which $A^{32}$ is a single bond include as below.

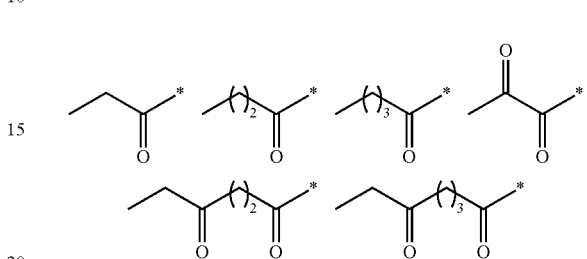

Examples of the group (a-2) containing a carbonyloxy group in which $A^{32}$ is a single bond include as below.

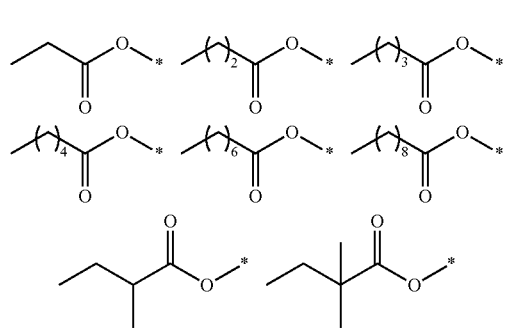

Examples of the group (a-2) containing an oxycarbonyl group in which $A^{32}$ is a single bond include as below.

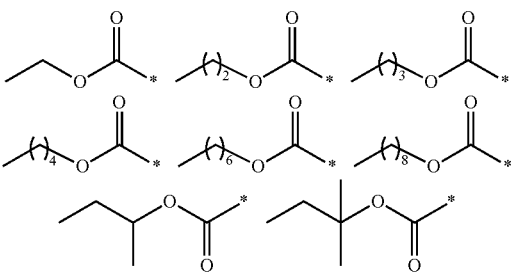

The group (a-2) may be a group containing two or more atoms or groups selected by the group consisting of an oxygen atom, a carbonyl group, an oxycarbonyl group and a carbonyloxy group. Examples of the group (a-2) containing an oxygen atom and a carbonyloxy group include as below.

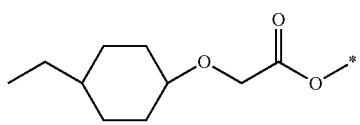

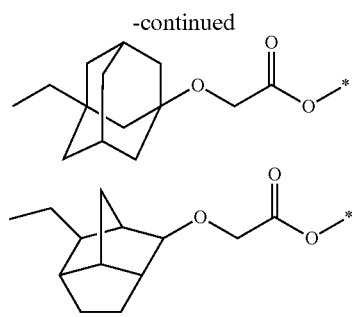

Among theses, $A^{ab1}$ is preferably an optionally substituted alkanediyl group or a single bond, more preferably non-substituted alkanediyl group or a single bond, and more preferably a single bond.

Examples of the alicyclic hydrocarbon group of $W^1$ include a group in which (n+1) hydrogen atoms are removed from the above groups represented by the formula (KA-1) to the formula (KA-22), is preferably a $C_5$ to $C_{24}$ alicyclic hydrocarbon group, more preferably a $C_5$ to $C_{18}$ alicyclic hydrocarbon group, and still more preferably a $C_6$ to $C_{12}$ alicyclic hydrocarbon group. Among these, a group in which (n+1) hydrogen atoms are removed from adamantane, cyclohexane, norbornane or norbornene ring is preferable, a group in which (n+1) hydrogen atoms are removed from adamantane or cyclohexane ring is more preferable, and a group in which (n+1) hydrogen atoms are removed from adamantane ring is still more preferable.

Examples of the alicyclic hydrocarbon group of $W^1$ in which one or more —$CH_2$— contained in the aliphatic hydrocarbon group is replaced by —O— or —CO— include, for example, alicyclic hydrocarbons below. The —$CH_2$— contained in an alicyclic hydrocarbon group may preferably replaced by at most about two of —O— and/or —CO—.

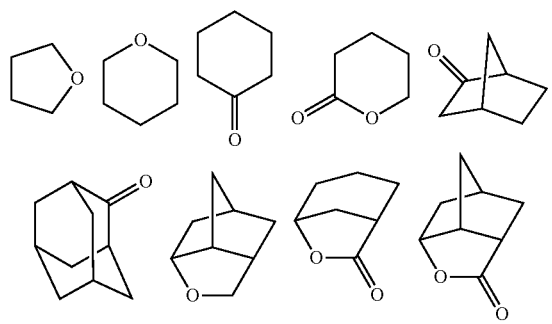

When one or more —$CH_2$— contained in the alicyclic hydrocarbon group is replaced by —O— or —CO—, the carbon number thereof is a carbon number before the —$CH_2$— contained in the alicyclic hydrocarbon group is replaced by —O— or —CO—.

The alicyclic hydrocarbon group of $W^1$ may have a substituent.

Examples of the substituent thereof include a hydroxy group, a $C_1$ to $C_{12}$ alkyl group, a $C_1$ to $C_{12}$ alkoxy group, a $C_3$ to $C_{12}$ alicyclic hydrocarbon group or a $C_6$ to $C_{10}$ aromatic hydrocarbon group.

Provided that the total carbon atom of the alicyclic hydrocarbon group and the substituent of $W^1$ is preferably 4 to 36.

Examples of the alkyl group include methyl, ethyl, propyl, butyl, heptyl, hexyl and octyl groups. The alkyl group may be a liner or branched chain alkyl group.

Examples of the alkoxy group include methoxy, ethoxy, propoxy, butoxy, hexyloxy and octyloxy groups. The alkoxyl group may be a liner or branched chain alkoxyl group.

Examples of the alicyclic hydrocarbon group include cyclohexyl, adamantyl and norbornyl groups.

Examples of the aromatic hydrocarbon group include phenyl and naphtyl groups.

Examples of the —$W^1$-($A^{ab2}$-$R^{ab2}$)$_n$ include a group represented by the formula ($W^1$-1) and a group represented by the formula ($W^1$-2).

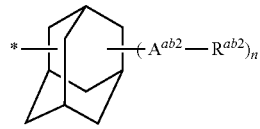

($W^1$-1)

wherein one or more —$CH_2$— contained in the adamantane ring may be replaced by —O— or —CO—;
one or more hydrogen atom contained in the adamantane ring may be replaced by a hydroxy group, a $C_1$ to $C_{12}$ alkyl group, a $C_1$ to $C_{12}$ alkoxy group, a $C_3$ to $C_{12}$ alicyclic hydrocarbon group or a $C_6$ to $C_{10}$ aromatic hydrocarbon group;
* represents a bond to $A^{ab1}$;
$A^{ab2}$, $R^{ab2}$ and n have the same definition of the above.

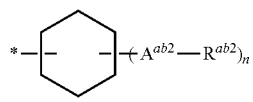

($W^1$-2)

wherein one or more —$CH_2$— contained in the cyclohexane ring may be replaced by —O— or —CO—;
one or more hydrogen atom contained in the cyclohexane ring may be replaced by a hydroxy group, a $C_1$ to $C_{12}$ alkyl group, a $C_1$ to $C_{12}$ alkoxy group, a $C_3$ to $C_{12}$ alicyclic hydrocarbon group or a $C_6$ to $C_{10}$ aromatic hydrocarbon group;
* represents a bond to $A^{ab1}$;
$A^{ab2}$, $R^{ab2}$ and n have the same definition of the above.

When one or more —$CH_2$— contained in the adamantane ring or cyclohexane ring is replaced by —O— or —CO—, the number of the —$CH_2$— to be replaced may be at most two, and preferably zero.

When one or more hydrogen atom contained in the adamantane ring or cyclohexane ring is replaced by the above substituent, the number of the substituent may be at most three, and the substituent(s) is in each occurrence independent.

n is preferably 1, and, therefore, $W^1$ is preferably a divalent group. When n is 1, adamantanediyl and cyclohexandiyl groups are preferable for $A^{ab2}$ may be an aliphatic hydrocarbon group which is either a saturated or an unsaturated group, preferably a saturated aliphatic hydrocarbon group, i.e., an alkanediyl group. Examples of the alkanediyl group of the $A^{ab2}$ include the same examples described in $A^{aa1}$ of the formula (aa).

Examples of the aliphatic hydrocarbon group in which one or more —$CH_2$— contained therein is replaced by —O— or —CO— include groups below. In the formula, * represents a bond.

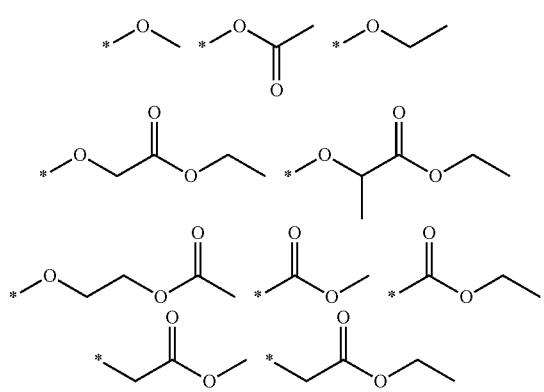

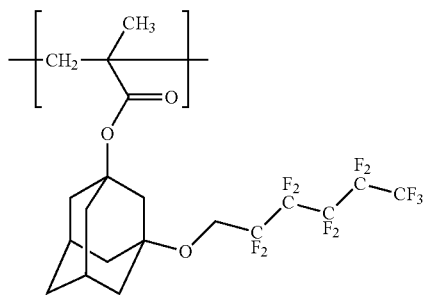

Among these, $A^{ab2}$ is preferably an alkanediyl group in which one or more —$CH_2$— contained therein is replaced by —O— or —CO—.

Examples of the fluorinated alkyl group of $R^{ab2}$ include a liner or branched chain fluorinated alkyl group such as difluoromethyl, trifluoromethyl, 1,1-difluoroethyl, 2,2-difluoroethyl, 2,2,2-trifluoroethyl, perfluoroethyl, 1,1,2,2-tetrafluoropropyl, 1,1,2,2,3,3-hexafluoropropyl, perfluoroethylmethyl, 1-(trifluoromethyl)-1,2,2,2-tetratrifluoroethyl, perfluoropropyl, 1,1,2,2-tetrafluorobutyl, 1,1,2,2,3,3-hexafluorobutyl, 1,1,2,2,3,3,4,4-octafluorobutyl, perfluorobutyl, 1,1-bis(trifluoro)methyl-2,2,2-trifluoroethyl, 2-(perfluoropropyl)ethyl, 1,1,2,2,3,3,4,4-octafluoropentyl, perfluoropentyl, 1,1,2,2,3,3,4,4,5,5-decafluoropentyl, 1,1-bis(trifluoromethyl)-2,2,3,3,3-pentafluoropropyl, perfluoropentyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl and perfluorohexyl groups.

Among these, a perfluoroalkyl group is preferable, and trifluoromethyl, perfluoroethyl, perfluoropropyl, perfluorobutyl, perfluoropentyl, perfluorohexyl, perfluoroheptyl and perfluorooctyl groups are more preferable.

The fluorinated alkyl group may be substituted with a group such as a hydroxyl and a hydroxymethyl group.

Examples of the structural unit (ab) in which n is 1 includes below. In addition, examples of the structural unit (ab) also include compounds in which the adamantane ring in the structural unit below is replaced by the cyclohexane ring. When n is 2, examples of the structural unit (ab) may includes structural units in which one or more hydrogen atom contained in the adamantane group is replaced by -$A^{ab2}$-$R^{ab2}$ (the definitions of $A^{ab2}$ and $R^{ab2}$ have the same meaning in the structural unit (ab)).

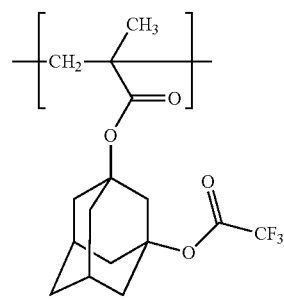

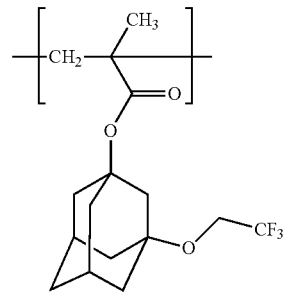

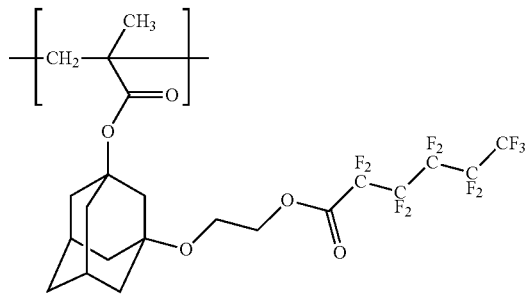

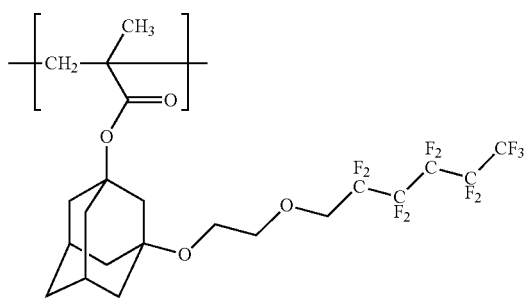
(ab-6)

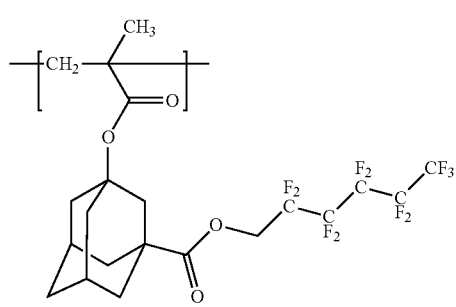
(ab-7)

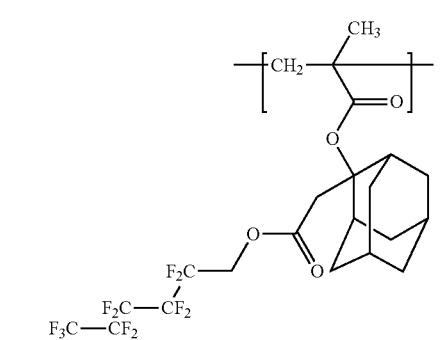
(ab-8)

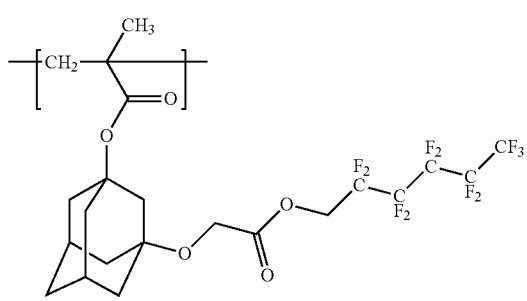
(ab-9)

(ab-10)

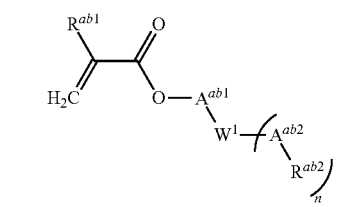
(ab-11)

Further, examples of the structural units (ab) include structural units in which a partial structure M of the structural units described above is replaced by a partial structure A as described above.

The structural unit (ab) is derived from the compound represented by the formula (ab'), hereinafter may be referred to as "compound (ab')".

$$\text{(ab')}$$

wherein $A^{ab1}$, $A^{ab2}$, $R^{ab1}$, $R^{ab2}$ and n have the same definition of the above.

The compound (ab') can be produced by a known method or a modified method thereof, for example, according to the method described in the pamphlet of WO 2008/015876, for example.

When the resin (X) is produced, the compound (aa') and the compound (ab') may be used as a single compound or as a mixture of two or more compounds, respectively, and it is preferable that one compound (aa') and one compound (ab') is used from the aspect of easy production of the resin (X).

Examples of the combination of the structural unit (aa) and the structural unit (ab) in the resin (X) as described below.

TABLE 1

| Resin (X) | Structural Unit (aa) | Structural Unit (ab) |
| --- | --- | --- |
| X-1 | (aa-3) | (ab-1) |
| X-2 | (aa-3) | (ab-3) |
| X-3 | (aa-5) | (ab-1) |
| X-4 | (aa-5) | (ab-3) |
| X-5 | (aa-1) | (ab-1) |
| X-6 | (aa-1) | (ab-3) |
| X-7 | (aa-3) | (ab-5) |
| X-8 | (aa-3) | (ab-7) |
| X-9 | (aa-3) | (ab-2) |
| X-10 | (aa-8) | (ab-1) |
| X-11 | (aa-11) | (ab-1) |
| X-12 | (aa-12) | (ab-1) |
| X-13 | (aa-13) | (ab-1) |
| X-14 | (aa-14) | (ab-1) |

TABLE 1-continued

| Resin (X) | Structural Unit (aa) | Structural Unit (ab) |
|---|---|---|
| X-15 | (aa-8) | (ab-3) |
| X-16 | (aa-11) | (ab-3) |
| X-17 | (aa-12) | (ab-3) |
| X-18 | (aa-13) | (ab-3) |
| X-19 | (aa-14) | (ab-3) |
| X-20 | (aa-1)/(aa-3) | (ab-1) |
| X-21 | (aa-1)/(aa-3) | (ab-3) |
| X-22 | (aa-1)/(aa-3) | (ab-1)/(ab-3) |
| X-23 | (aa-3) | (ab-1)/(ab-3) |
| X-24 | (aa-3)/(aa-14) | (ab-1)/(ab-3) |
| X-25 | (aa-3)/(aa-5) | (ab-1)/(ab-3) |

The total proportion of the structural unit (aa) and the structural unit (ab) in the resin (X) is generally 1 to 100 mol %, preferably 5 to 100 mol %, more preferably 10 to 100 mol %, still more preferably 30 to 100 mol %, and further more preferably 50 to 100 mol %, with respect to the total structural unit (100 mol %) of the resin (X).

The mol ratio of the structural unit (aa): the structural unit (ab) in the resin (X) may be 1:99 to 99:1, preferably 3:97 to 97:3, more preferably 50:50 to 95:5, still more preferably 60:40 to 90:10, and further more preferably 70:30 to 90:10.

For achieving the proportion of the structural unit (aa) and the structural unit (ab) in the resin (X) within the above range, the amount of the compound (aa') and the compound (ab') to be used can be adjusted with respect to the total amount of the monomer to be used when the resin (X) is produced (the same shall apply hereinafter for corresponding adjustment of the proportion).

The resin (X) may have one or more structural unit(s) other than the structural unit (aa) and the structural unit (ab). Examples of such structural unit(s) include any of structural units or monomers as described below, and known compounds, among these, the structural unit derived from an acid stable monomer (a4) as described below is preferable.

<Resin (A)>

The resin (A) has properties that are insoluble or poorly soluble in alkali aqueous solution, but become soluble in an alkali aqueous solution by the action of an acid as described above. Therefore, the resin (A) has one or more acid-labile group in its molecular, i.e., the resin (A) has one or more structural unit having one or more acid-labile group. Hereinafter, the structural unit having the acid-labile group may refer to as a "structural unit (a1)", and a monomer giving the structural unit (a1) may refer to as an "acid-labile monomer (a1)".

Here, the "acid-labile group" means a group in which an elimination group (i.e., the protecting group) is cleaved in contact with the acid and resulting in having a hydrophilic group. Examples of the hydrophilic group include a carboxy and a hydroxy group, and a carboxy group is preferable.

The resin (A) may have the structural unit (aa) or the structural unit (ab), but may not have both of the structural unit (aa) and the structural unit (ab).

When the resin (X) has the above properties, the acid-labile group is preferably contained in the resin (X) in addition to the structural unit (aa) and the structural unit (ab).

A resist pattern with excellent CDU can be produced from the present resist composition by using such resin through the synergism of the resin and the acid generator (B).

<Acid-labile Group>

Examples of the acid-labile group when the hydrophilic group is carboxy group include a group in which one or more hydrogen atom of the carboxyl group (i.e., —COOH) is replaced with an organic group and an atom of the organic group which bonds to —O— of the carboxyl group is tertiary carbon atom, i.e., an ester of a tertiary alcohol.

Among such the acid-labile group, preferred examples thereof include a group represented by the formula (1) below. Hereinafter the group represented by the formula (1) may refer to as an "acid-labile group (1)".

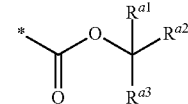
(1)

wherein $R^{a1}$, $R^{a2}$ and $R^{a3}$ independently represent a $C_1$ to $C_8$ alkyl group, a $C_3$ to $C_{20}$ alicyclic hydrocarbon group, or $R^{a1}$ and $R^{a2}$ may be bonded together with a carbon atom bonded to $R^{a1}$ and $R^{a2}$ to form a $C_3$ to $C_{20}$ ring, one or more —CH$_2$— contained in the alkyl group, the alicyclic hydrocarbon group and the ring may be replaced by —O—, —S— or —CO—, * represents a bond.

Examples of the alkyl group of $R^{a1}$ to $R^{a3}$ include methyl, ethyl, propyl, pentyl and hexyl groups.

Examples of the alicyclic hydrocarbon group of $R^{a1}$ to $R^{a3}$ include a monocyclic hydrocarbon groups such as cyclopentyl, cyclohexyl, methylcyclohexyl, dimethylcyclohexyl, cycloheptyl, cycloortyl groups; and polycyclic hydrocarbon groups such as decahydronaphtyl, adamantyl, norbornyl (i.e., bicyclo[2.2.1]hexyl), and methyl norbornyl groups as well as groups as below.

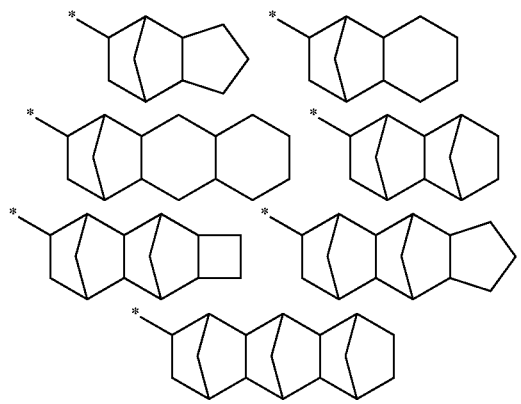

When $R^{a1}$ and $R^{a2}$ are bonded together to form a ring, examples of the group —C($R^{a1}$)($R^{a2}$)($R^{a3}$) include a group below.

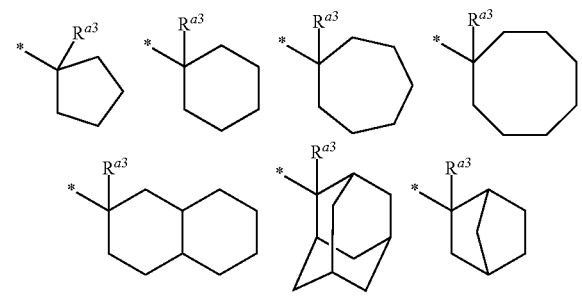

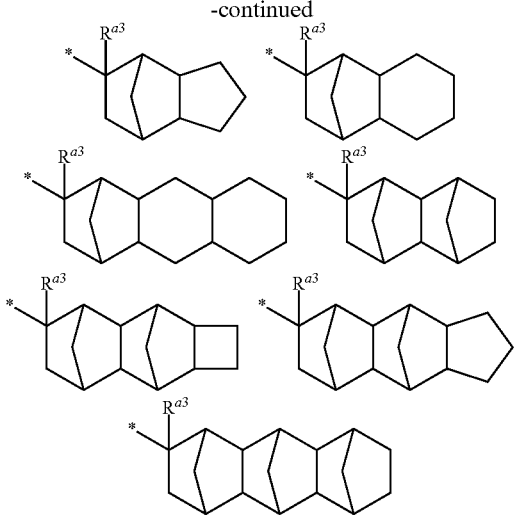

The ring preferably has 3 to 12 carbon atoms.

In the formula (1), the alicyclic hydrocarbon group of $R^{a1}$ to $R^{a3}$ preferably has 3 to 16 carbon atoms, and more preferably has 3 to 12 carbon atoms.

Specific examples of the acid-labile group include, for example, 1,1-dialkylalkoxycarbonyl group (a group in which $R^{a1}$ to $R^{a3}$ are alkyl groups, preferably tert-butoxycarbonyl group, in the formula (1)), 2-alkyladamantane-2-yloxycarbonyl group (a group in which $R^{a1}$, $R^{a2}$ and a carbon atom forms adamantyl group, and $R^{a3}$ is alkyl group, in the formula (1)), and 1-(adamantine-1-yl)-1-alkylalkoxycarbonyl group (a group in which $R^{a1}$ and $R^{a2}$ are alkyl group, and $R^{a3}$ is adamantyl group, in the formula (1)).

Examples of the acid-labile group when the hydrophilic group is a hydroxy group include a group in which a hydrogen atom of the hydroxy group is replaced by an organic group and resulting in having an acetal structure or a ketal structure. Among such the acid-labile group, preferred examples thereof include a group represented by the formula (2) below. Hereinafter the group represented by the formula (2) may refer to as an "acid-labile group (2)".

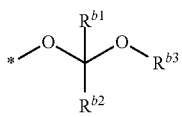

(2)

wherein $R^{b1}$ and $R^{b2}$ independently represent a hydrogen atom or a $C_1$ to $C_{20}$ hydrocarbon group, $R^{b3}$ represents a $C_1$ to $C_{20}$ hydrocarbon group, or $R^{b2}$ and $R^{b3}$ may be bonded together with a carbon atom and an oxygen atom bonded to $R^{b2}$ and $R^{b3}$ respectively to form a $C_3$ to $C_{20}$ ring. One or more —$CH_2$— contained in the hydrocarbon group and the ring may be replaced by —O—, —S— or —CO—, * represents a bond.

The hydrocarbon group of $R^{b1}$ to $R^{b3}$ includes any of an alkyl group, an alicyclic hydrocarbon group and an aromatic hydrocarbon group.

Examples of the ring which is formed by bonding with $R^{b2}$ and $R^{b3}$ include rings in which a carbon atom is replaced by an oxygen atom in the ring which are formed by bonding with $R^{a1}$ and $R^{a2}$.

At least one of $R^{b1}$ and $R^{b2}$ is preferably a hydrogen atom.

Specific examples of the acid-labile group (2) include a group below.

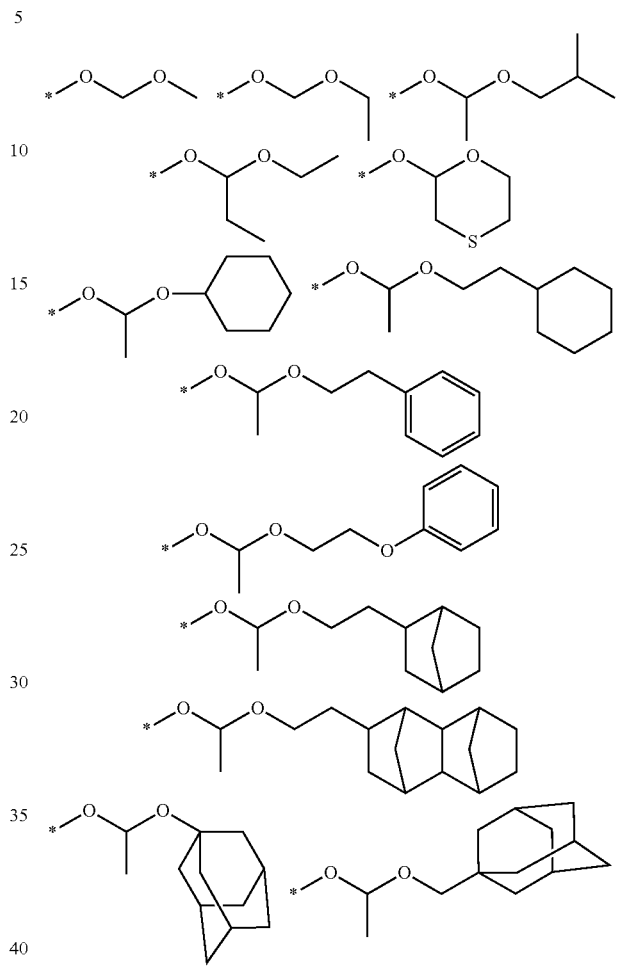

The structural unit having the acid-labile group is preferably a structural unit having an acid-labile group and a carbon-carbon double bond, and more preferably a structural unit derived from a (meth)acrylic monomer having the acid-labile group.

Preferable examples of the structural unit (a1) include a structural unit having an acid-labile group (1) and/or an acid-labile group (2), and a structural unit having an acid-labile group (1) is more preferable.

Among the structural unit having an acid-labile group (1), it is preferably a structural unit containing an acid-labile group (1) having a $C_5$ to $C_{20}$ alicyclic hydrocarbon structure. When the resin (A) which can be obtained by polymerizing monomers having bulky structure such as the alicyclic hydrocarbon group is used, the resist composition having excellent resolution tends to be obtained during the production of a resist pattern.

<Acid-labile Structural Unit (a1)>

As the structural unit derived from the (meth)acrylic monomer containing an acid-labile group (1) having the alicyclic hydrocarbon structure, examples thereof include a structural unit represented by the formula (a1-1) (hereinafter may be referred to as a "structural unit (a1-1)") and a structural unit represented by the formula (a1-2) (hereinafter may be referred to as a "structural unit (a1-2)"). The structural unit (a1-1) and the structural unit (a1-2) may be used as a single unit or as a combination of two or more units.

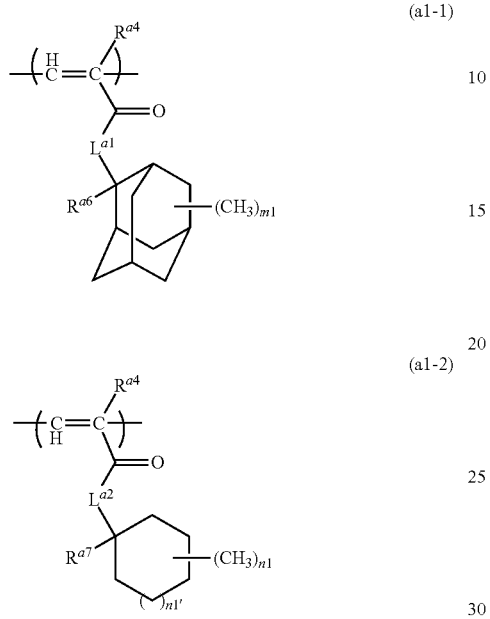

wherein $L^{a1}$ and $L^{a2}$ independently represent *—O— or *—O—$(CH_2)_{k1}$—CO—O—, k1 represents an integer of 1 to 7, * represents a bond to the carbonyl group (—CO—);

$R^{a4}$ and $R^{a5}$ independently represent a hydrogen atom or a methyl group;

$R^{a6}$ and $R^{a7}$ independently represent a $C_1$ to $C_{10}$ aliphatic hydrocarbon group;

m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably *—O— or *—O—$(CH_2)_{k1'}$—CO—O—, here k1' represents an integer of 1 to 4, more preferably *—O— or *—O—$CH_2$—CO—O—, and still more preferably *—O—.

$R^{a4}$ and $R^{a5}$ are preferably a methyl group.

The aliphatic hydrocarbon groups of $R^{a6}$ and $R^{a7}$ are independently preferably a $C_1$ to $C_8$ alkyl group or $C_3$ to $C_{10}$ alicyclic hydrocarbon group, more preferably a $C_1$ to $C_8$ alkyl group or $C_3$ to $C_8$ alicyclic hydrocarbon group, and still more preferably a $C_1$ to $C_6$ alkyl group or $C_3$ to $C_6$ alicyclic hydrocarbon group.

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the structural unit (a1-1) include structural units below.

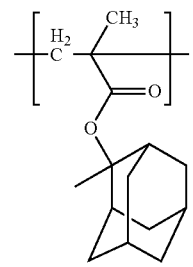
(a1-1-1)

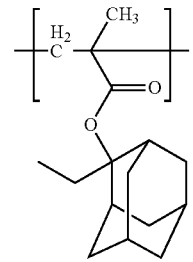
(a1-1-2)

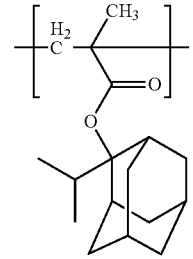
(a1-1-3)

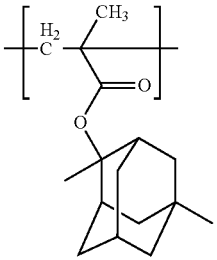
(a1-1-4)

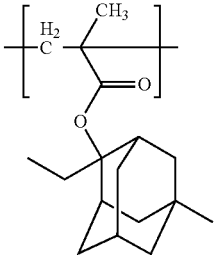
(a1-1-5)

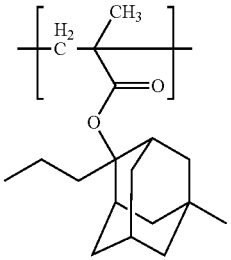
(a1-1-6)

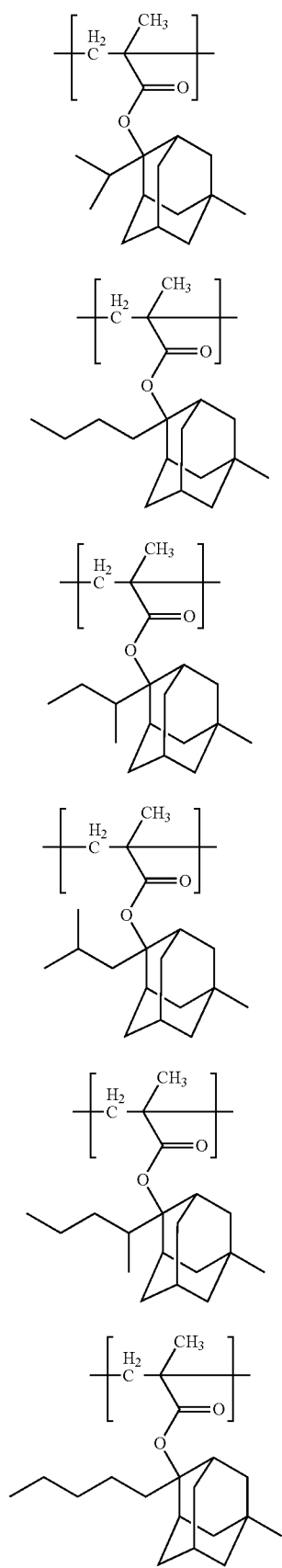
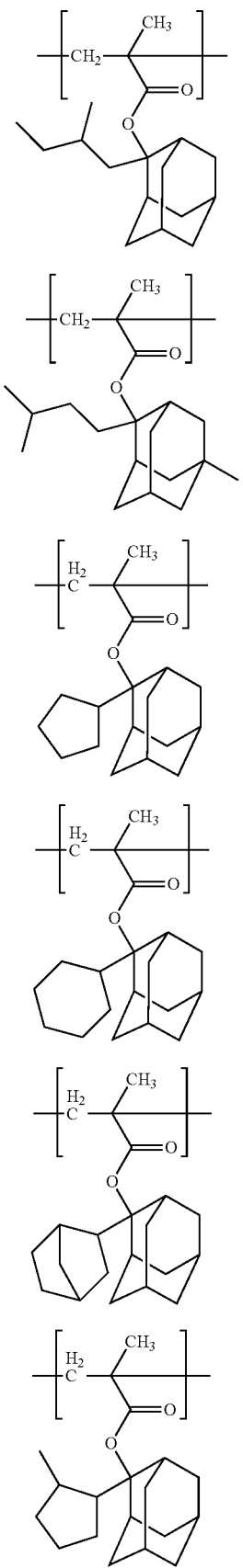

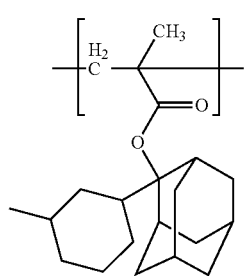 (a1-1-19)
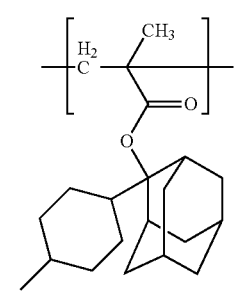 (a1-1-20)
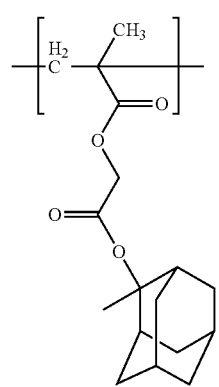 (a1-1-21)
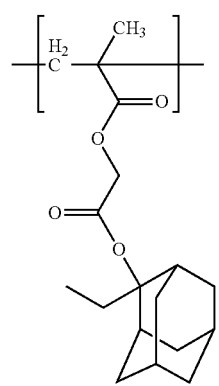 (a1-1-22)
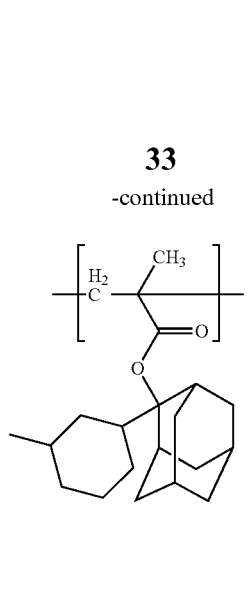 (a1-1-23)
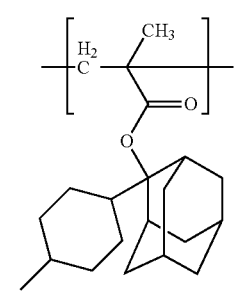 (a1-1-24)
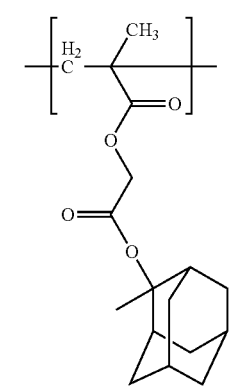 (a1-1-25)
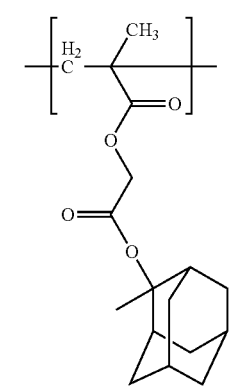 (a1-1-26)

-continued
(a1-1-27)
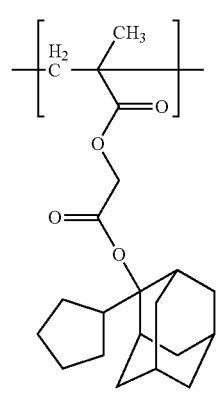
(a1-1-28)
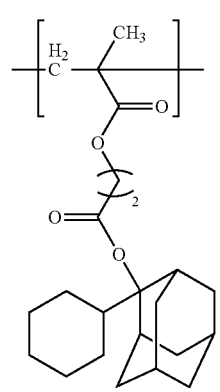
(a1-1-29)
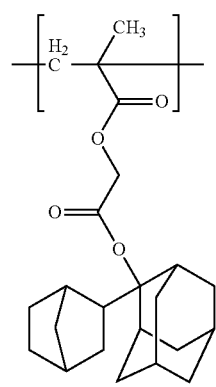
(a1-1-30)
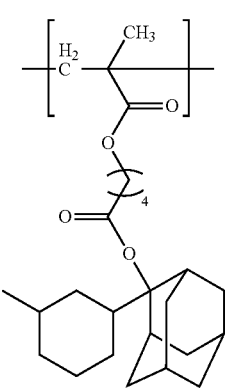
-continued
(a1-1-31)
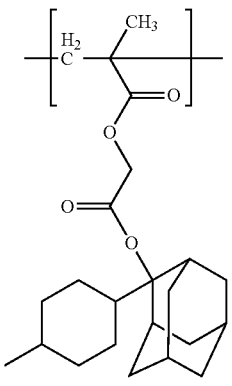
(a1-1-32)
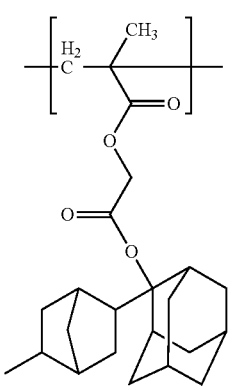
(a1-1-33)
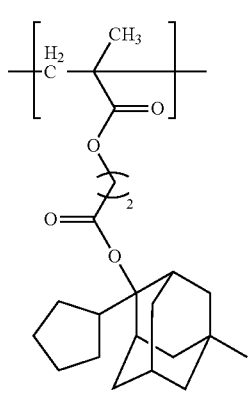
(a1-1-34)
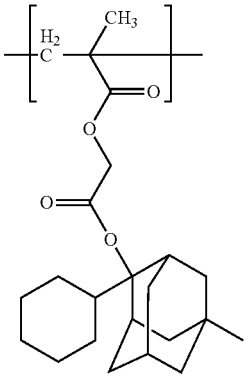

-continued

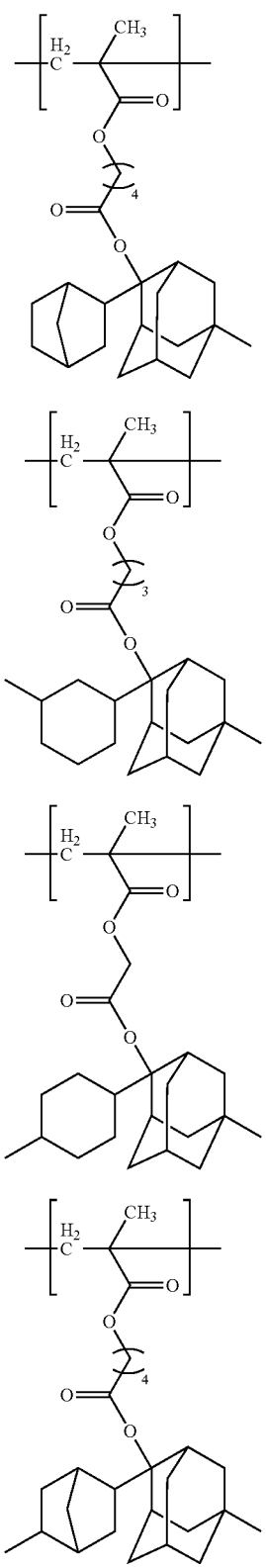

Also, examples of the structural units (a1-1) include structural units in which a partial structure M of the structural units represented by the formula (a1-1-1) to the formula (a1-1-38) is replaced by a partial structure A as described above.

Among these, structural units represented by the formula (a1-1-1), the formula (a1-1-2), the formula (a1-1-3) and the structural units in which a partial structure M of the structural units represented by the formula (a1-1-1), the formula (a1-1-2), the formula (a1-1-3) is replaced by a partial structure A are preferable, structural units represented by the formula (a1-1-1), the formula (a1-1-2) and the formula (a1-1-3) are more preferable, and structural units represented by the formula (a1-1-1) and the formula (a1-1-2) are still more preferable.

When the resin (A) having the structural unit of (a1-1) is produced, 2-methyl-2-adamantane-2-yl(meth)acrylate, 2-ethyl-2-adamantane-2-yl(meth)acrylate and 2-isopropyl-2-adamantane-2-yl (meth)acrylate may be used as a starting material (i.e., monomer).

Examples of the structural unit (a1-2) include structural units below.

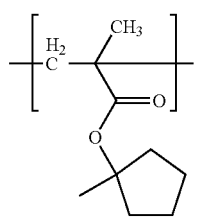
(a1-2-1)

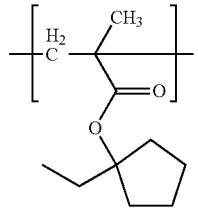
(a1-2-2)

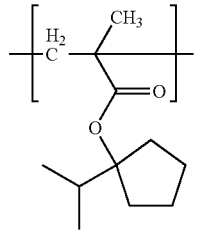
(a1-2-3)

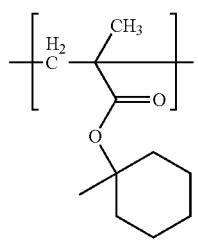
(a1-2-4)

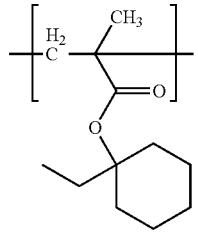
(a1-2-5)

(a1-2-6) 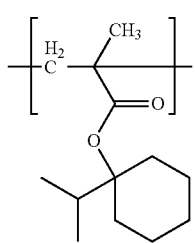

(a1-2-7) 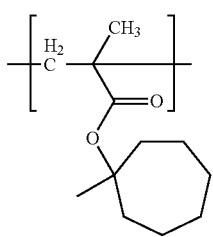

(a1-2-8) 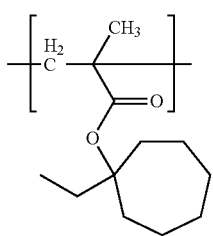

(a1-2-9) 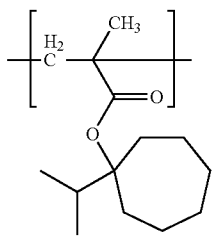

(a1-2-10) 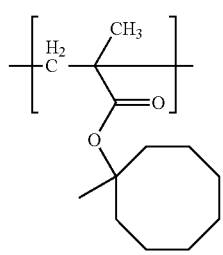

(a1-2-11) 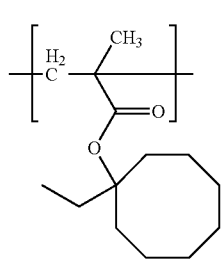

(a1-2-12) 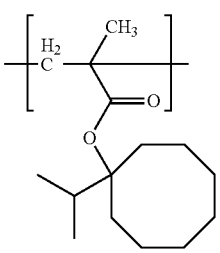

Also, examples of the structural units (a1-2) include structural units in which a partial structure M of the structural units represented by the formula (a1-2-1) to the formula (a1-2-12) is replaced by a partial structure A as described above.

Among these, structural units represented by the formula (a1-2-1), the formula (a1-2-2), the formula (a1-2-4), the formula (a1-2-5) and the structural units in which a partial structure M of the structural units represented by the formula (a1-2-1), the formula (a1-2-2), the formula (a1-2-4), the formula (a1-2-5) is replaced by a partial structure A are preferable, structural units represented by the formula (a1-2-4), the formula (a1-2-5) and the structural units in which a partial structure M of the structural units represented by the formula (a1-2-4) and the formula (a1-2-5) replaced by a partial structure A are more preferable.

When the resin (A) having the structural unit of (a1-2) is produced, 2-methylcyclohexane-2-yl(meth)acrylate may be used as a starting material (i.e., monomer).

When the resin (A) contains the structural unit (a1-1) and/or the structural unit (a1-2), the total proportion thereof is generally 10 to 95 mol %, preferably 15 to 90 mol %, more preferably 20 to 85 mol %, and more preferably 25 to 60 mol %, with respect to the total structural units (100 mol %) of the resin (A).

When the resin (X) contains the structural unit (a1-1) and/or the structural unit (a1-2), the total proportion thereof is generally 5 to 50 mol %, preferably 10 to 45 mol %, and more preferably 15 to 40 mol %, with respect to the total structural units (100 mol %) of the resin (X).

For achieving the proportion of the structural units (a1-1) and/or the structural units (a1-2) within the above range, the amount of the monomer giving the structural unit (a1-1) and/or the monomer giving the structural unit (a1-2) to be used can be adjusted with respect to the total amount of the monomer to be used when the resin (A) is produced.

When the resin (X) is produced, the amount of the monomer giving the structural unit (a1-1) and/or the monomer giving the structural unit (a1-2) to be used can be adjusted with respect to the total amount of the compound (aa') and the compound (ab') to be used.

<Acid-Labile Monomer>

Examples of the monomers having an acid-labile group (1) and a carbon-carbon double bond include a monomer having norbornene ring presented by the formula (a1-3). Such monomer may be hereinafter referred to as "monomer (a1-3)".

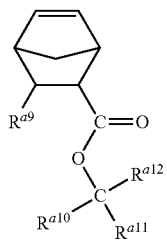

(a1-3)

wherein $R^{a9}$ represents a hydrogen atom, a $C_1$ to $C_3$ alkyl group that optionally has a hydroxy group, a carboxy group, a cyano group or a —$COOR^{a13}$, $R^{a13}$ represents a $C_1$ to $C_{20}$ aliphatic hydrocarbon group, one or more hydrogen atom contained in the aliphatic hydrocarbon group may be replaced by a hydroxy group, one or more —$CH_2$— contained therein may be replaced by —O— or —CO—;

$R^{a10}$, $R^{a11}$ and $R^{a12}$ independently represent a $C_1$ to $C_{20}$ aliphatic hydrocarbon group, or $R^{a10}$ and $R^{a11}$ may be bonded together to form a $C_1$ to $C_{20}$ ring, one or more hydrogen atom contained in the aliphatic hydrocarbon group and the ring may be replaced by a hydroxy group or the like, one or more —$CH_2$—contained in the aliphatic hydrocarbon group and the ring may be replaced by —O— or —CO—.

Examples of the alkyl group having a hydroxy group of $R^{a9}$ include hydroxymethyl and 2-hydroxyethyl groups.

The aliphatic hydrocarbon group of $R^{a10}$ to $R^{a12}$ is any of a chain aliphatic hydrocarbon group (e.g., alkyl group), an alicyclic hydrocarbon group and a combination thereof. Examples of the aliphatic hydrocarbon group of $R^{a10}$ to $R^{a12}$ include methyl, ethyl, cyclohexyl, methylcyclohexyl, hydroxycyclohexyl, oxocyclohexyl and adamantyl groups.

Preferable examples of the ring formed together with $R^{a10}$ and $R^{a11}$ include an alicyclic hydrocarbon group such as cyclohexane and adamantane rings.

The aliphatic hydrocarbon group of $R^{a13}$ is preferably a $C_1$ to $C_8$ alkyl group and a $C_3$ to $C_{20}$ alicyclic hydrocarbon group, examples of the —$COOR^{a13}$ group include a group in which a carbonyl group bonds to an alkoxy group, such as methoxycarbonyl and ethoxycarbonyl groups.

Examples of the monomer having a norbornene ring (a1-3) include, for example, tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantane-2-yl 5-norbornene-2-carboxylate, 2-ethyl-2-adamantane-2-yl 5-norbornene-2-carboxylate, 1-(4-methylcyclohexyl)-1-methylethyl 5-norbornene-2-carboxylate, 1-(4-hydroxycyclohexyl)-1-methylethyl 5-norbornene-2-carboxylate, 1-methyl-(4-oxocyclohexyl)-1-ethyl 5-norbornene-2-carboxylate, and 1-(1-adamantane-1-yl)-1-methylethyl 5-norbornene-2-carboxylate.

A resin having a structural unit derived from the monomer (a1-3) can improve the resolution of the obtained resist composition because it has a bulky structure, and also can improve a dry-etching tolerance of the obtained resist composition because of incorporated a rigid norbornene ring into a main chain of the resin (A).

When the resin (A) contains the structural unit derived from the monomer represented by the formula (a1-3), the proportion thereof is generally 10 to 95 mol %, preferably 15 to 90 mol %, and more preferably 20 to 85 mol %, with respect to the total structural units (100 mol %) constituting the resin (A), from the aspect of the improvement of the resolution and/or the dry-etching tolerance.

When the resin (X) contains the structural unit derived from the monomer represented by the formula (a1-3), the proportion thereof is generally 5 to 50 mol %, preferably 10 to 45 mol %, and more preferably 15 to 40 mol %, with respect to the total structural units (100 mol %) constituting the resin (X).

Examples of a monomer having an acid-labile group (2) and a carbon-carbon double bond include a monomer represented by the formula (a1-4). Such monomer may be hereinafter referred to as "monomer (a1-4)".

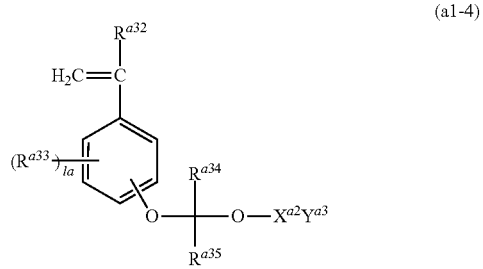

(a1-4)

wherein $R^{a32}$ represents a hydrogen atom, a halogen atom or a $C_1$ to $C_6$ alkyl group that optionally has a halogen atom (i.e., haloalkyl group);

$R^{a33}$ in each occurrence independently represent a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

1a represents an integer 0 to 4;

$R^{a34}$ and $R^{a35}$ independently represent a hydrogen atom or a $C_1$ to $C_{12}$ hydrocarbon group;

$X^{a2}$ represents a single bond or an optionally substituted $C_1$ to $C_{17}$ divalent aliphatic hydrocarbon group, one or more hydrogen atom contained therein may be replaced by a halogen atom, a hydroxy group, a $C_1$ to $C_6$ alkoxy group, a $C_2$ to $C_4$ acyl group or a $C_2$ to $C_4$ acyloxy group, and one or more —$CH_2$— contained therein may be replaced by —CO—, —O—, —S—, —$SO_2$— or —N($R^c$)—, $R^c$ represents a hydrogen atom or a $C_1$ to $C_6$ alkyl group;

$Y^{a3}$ represents a $C_1$ to $C_{18}$ hydrocarbon group, one or more hydrogen atom contained therein may be replaced by a halogen atom, a hydroxy group, a $C_1$ to $C_6$ alkoxy group, a $C_1$ to $C_6$ alkoxy group, a $C_2$ to $C_4$ acyl group, and a $C_2$ to $C_4$ acyloxy group.

Examples of the alkyl group that optionally has a halogen atom of $R^{a32}$ include trifluoromethyl, perfluoroethyl, perfluoropropyl, perfluoro-isopropyl, perfluorobutyl, perfluoro-sec-butyl, perfluoro-tert-butyl, perfluoropentyl, perfluorohexyl, trichloromethyl, triburomomethyl and triiodomethyl groups.

Examples of the alkoxyl group include methoxy, ethoxy, propoxy, butoxy, pentyloxy and hexyloxy groups.

Examples of the acyl group include acetyl, propionyl and butyryl groups.

Examples of the acyloxy group include acetyloxy, propionyloxy and butyryloxy groups.

In the formula (a1-4), the alkyl group of $R^{a32}$ and $R^{a33}$ is preferably a $C_1$ to $C_4$ alkyl group, more preferably a $C_1$ to $C_2$ alkyl group, and still more preferably methyl group.

The alkoxy group of $R^{a33}$ is preferably a $C_1$ to $C_4$ alkoxy group, more preferably a $C_1$ to $C_2$ alkoxy group, and still more preferably methoxy group.

Examples of the hydrocarbon group of $R^{a34}$ and $R^{a35}$ include any of a chain aliphatic hydrocarbon group, an alicyclic hydrocarbon group and an aromatic hydrocarbon group.

Preferred examples of the aliphatic hydrocarbon group include an alkyl group such as iso-propyl, n-butyl, sec-butyl, tert-butyl, pentyl, hexyl, octyl, and 2-ethylhexyl groups.

Preferred examples of the alicyclic hydrocarbon group include a monocyclic or polycyclic saturated hydrocarbon groups such as cyclohexyl, adamantyl, 2-alkyl-2-adamantan-2-yl, 1-(1-adamantan-1-yl)-1-alkyl, and isobornyl groups.

Preferred examples of the aromatic hydrocarbon group include phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

The aliphatic hydrocarbon group of $X^{a2}$ is preferably a chain aliphatic hydrocarbon group, and more preferably an alkyl group.

The hydrocarbon group of $Y^{a3}$ is preferably a $C_3$ to $C_{18}$ alicyclic hydrocarbon group and a $C_6$ to $C_{18}$ aromatic hydrocarbon group.

Preferred examples of the substituent that may be optionally substituted to $X^{a2}$ and $Y^{a3}$ include a hydroxy group.

Examples of the monomer represented by the formula (a1-4) include a monomer below.

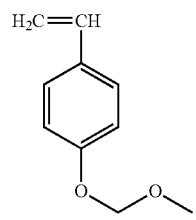
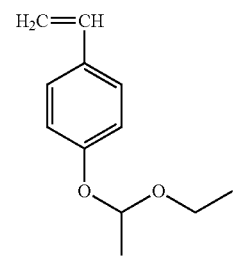
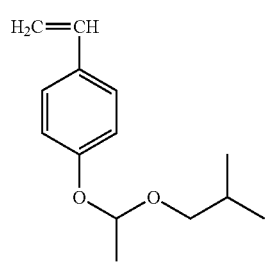
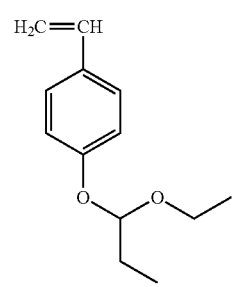
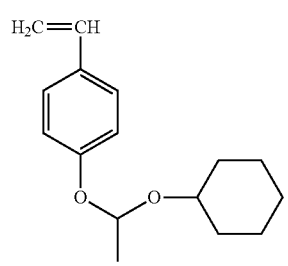

-continued

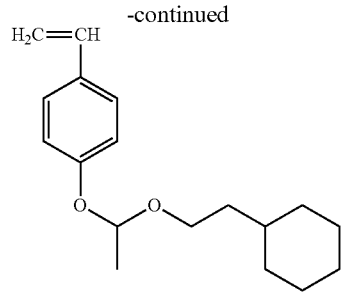
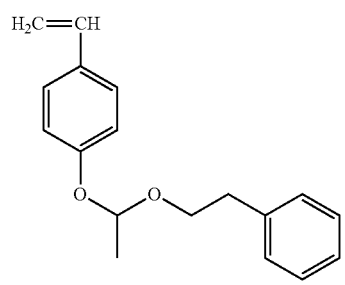
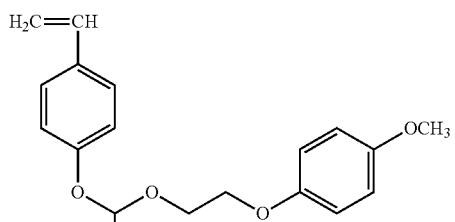
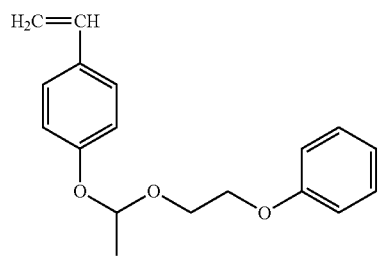
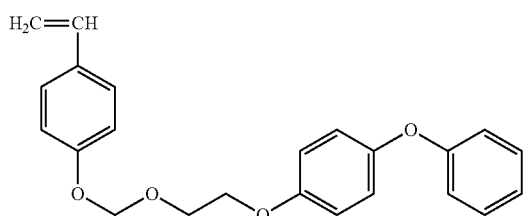
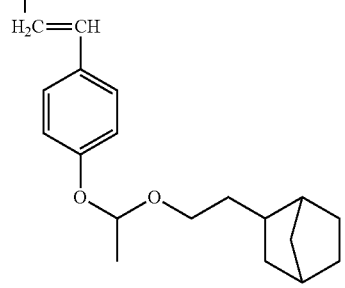

-continued
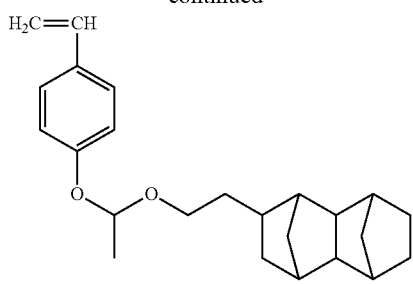
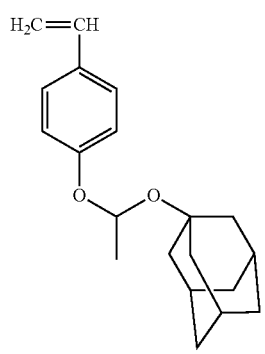
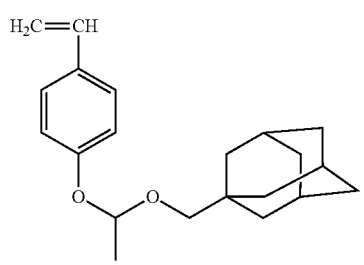
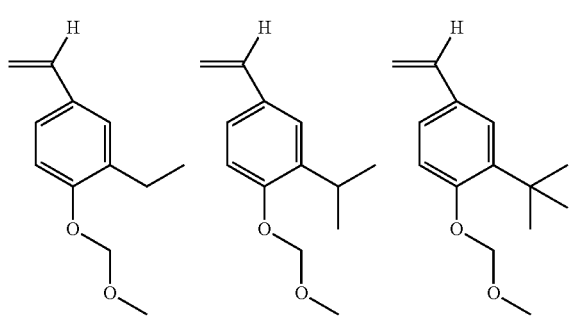
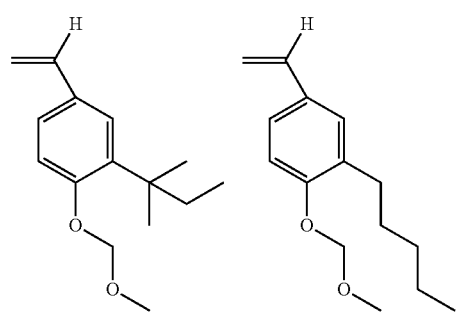
-continued
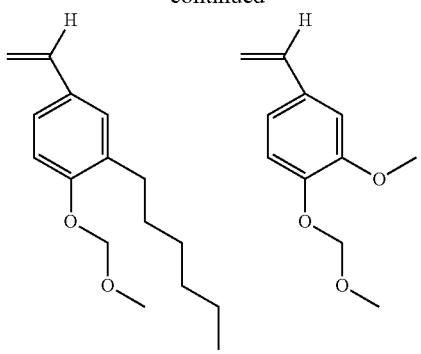
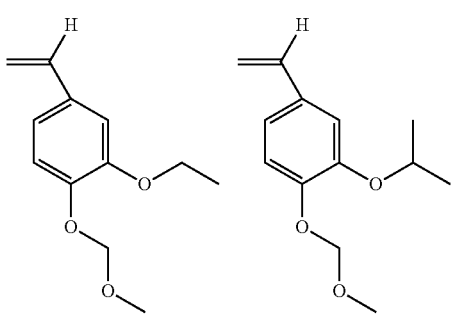
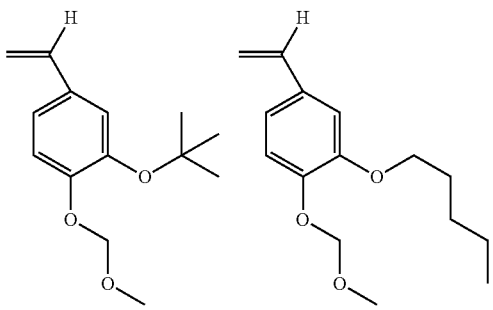
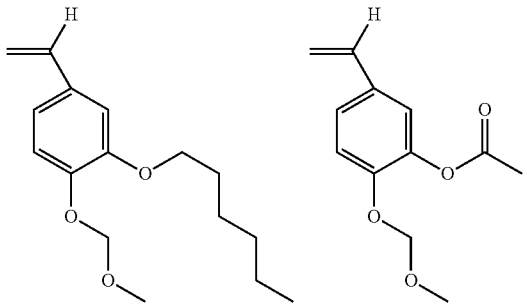
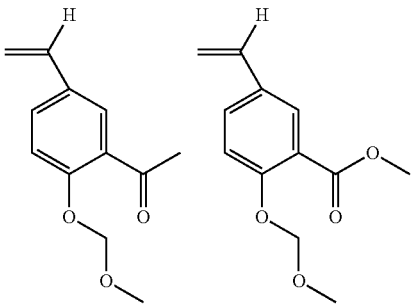
Also, examples of the monomer (a1-4) include monomers in which a partial structure P of the monomers above are replaced by a partial structure V as described below.

Partial structure V:

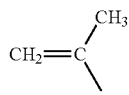

Partial structure P:

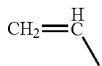

When the resin (A) contains the structural unit derived from the monomer represented by the formula (a1-4), the proportion thereof is generally 10 to 95 mol %, preferably 15 to 90 mol %, more preferably 20 to 85 mol %, with respect to the total structural units (100 mol %) constituting the resin (A).

When the resin (X) contains the structural unit derived from the monomer represented by the formula (a1-4), the proportion thereof is generally 5 to 50 mol %, preferably 10 to 45 mol %, and more preferably 15 to 40 mol %, with respect to the total structural units (100 mol %) constituting the resin (X).

Examples of a monomer having an acid-labile group (2) and a carbon-carbon double bond include a monomer represented by the formula (a1-5). Such monomer may be hereinafter referred to as "monomer (a1-5)".

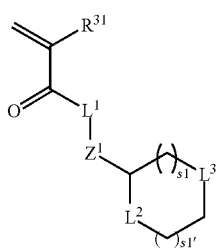

(a1-5)

wherein $R^{31}$ represents a hydrogen atom, a halogen atom or a $C_1$ to $C_6$ alkyl group that optionally has a halogen atom;

$L^1$, $L^2$ and $L^3$ independently represent *—O—, *—S— or *—O—$(CH_2)_{k1}$—CO—O—, k1 represents an integer of 1 to 7, * represents a bond to the carbonyl group (—CO—);

s1 represents an integer of 0 to 4;

s1' represents an integer of 0 to 4;

$Z^1$ represents a single bond or a $C_1$ to $C_6$ alkanediyl group, and one or more —$CH_2$— contained in the alkanediyl group may be replaced by —O— or —CO—.

In the formula (a1-5), $R^{31}$ is preferably a hydrogen atom or a methyl group;

$L^1$ is preferably —O—;

$L^2$ and $L^3$ are independently preferably *—O— or *—S—, and more preferably —O— for one and —S— for another;

s1 is preferably 1;

s1' is preferably an integer of 0 to 2;

$Z^1$ is preferably a single bond or —$CH_2$—CO—O—.

Examples of the compound represented by the formula (a1-5) include compounds below.

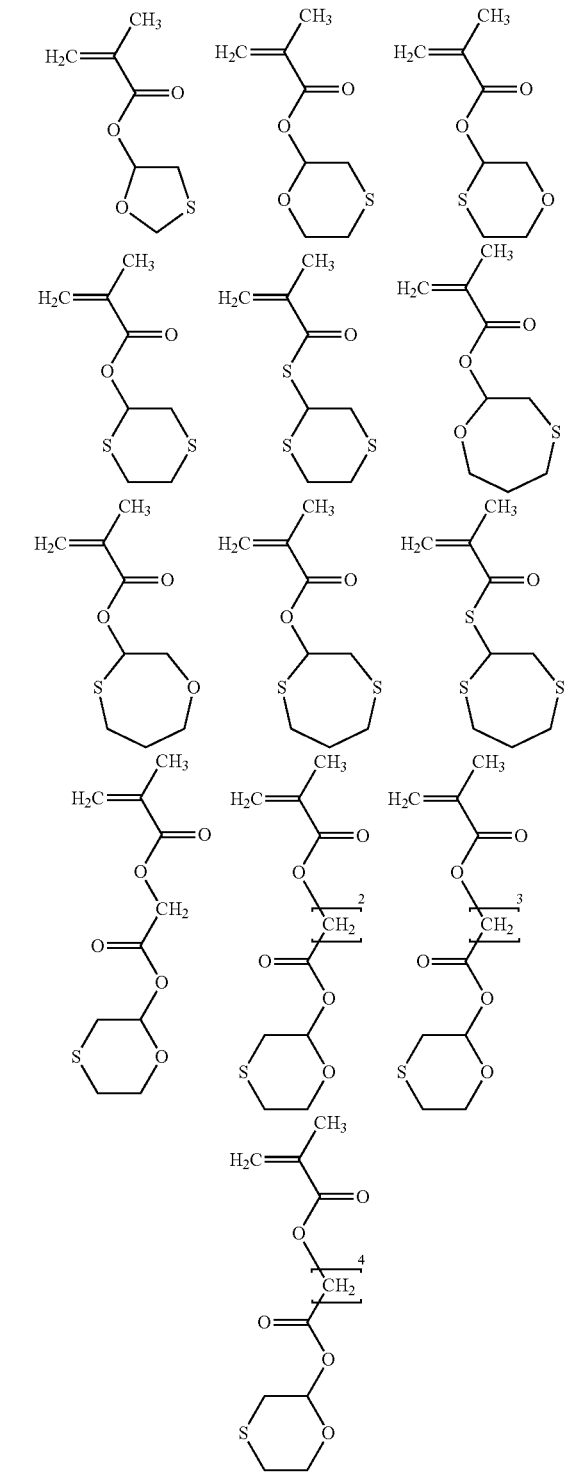

Also, examples of the monomer (a1-5) include monomers in which a partial structure V of the monomers above are replaced by a partial structure P as described above.

When the resin (A) contains the structural unit derived from the monomer represented by the formula (a1-5), the proportion thereof is generally 10 to 95 mol %, preferably 15 to 90 mol %, and more preferably 20 to 85 mol %, with respect to the total structural units (100 mol %) constituting the resin (A).

When the resin (X) contains the structural unit derived from the monomer represented by the formula (a1-5), the proportion thereof is generally 5 to 50 mol %, preferably 10 to 45 mol %, and more preferably 15 to 40 mol %, with respect to the total structural units (100 mol %) constituting the resin (X).

<Acid-stable Structural Unit>

The resin (X) is preferably a copolymer having a structural unit derived from a monomer not having the acid-labile group (hereinafter may be referred to as an "acid-stable structural unit") in addition to the structural unit (aa), the structural unit (ab).

The resin (A) is preferably a copolymer having the acid-stable structural unit in addition to the acid-labile structural unit (a1).

The acid-stable structural unit may be used as a single unit or as a combination of two or more units.

As the acid-stable structural unit, a structural unit having a hydroxy group or a lactone ring is preferable. When a resin containing the structural unit having hydroxy group (hereinafter such acid-stable structural unit may be referred to as "acid-stable structural unit (a2)") or the acid-stable structural unit having a lactone ring (hereinafter such acid-stable structural unit may be referred to as "acid-stable structural unit (a3)") is used, the adhesiveness of resist to a substrate and resolution of resist tend to be improved.

<Acid-stable Structural Unit (a2)>

The acid-stable structural unit (a2) is preferably selected depending on the kinds of an exposure light source at producing the resist pattern.

For example, when KrF excimer laser lithography (248 nm), or high-energy irradiation such as electron beam or EUV light is used for the resist composition, using the acid-stable monomer having a phenolic hydroxy group (a2-0) such as hydroxystyrene as the acid-stable structural unit (a2) having the hydroxy group is preferable.

When ArF excimer laser lithography (193 nm), i.e., short wavelength excimer laser lithography is used, using the acid-stable monomer having a hydroxy adamantyl group represented by the formula (a2-1) as the acid-stable structural unit (a2) having the hydroxy group is preferable.

The acid-stable structural unit (a2) having the hydroxy group may be used as a single unit or as a combination of two or more units.

<Acid-stable Structural Unit (a2-0)>

Examples of the acid-stable structural unit (a2) having phenolic hydroxy group include a structural unit represented by the formula (a2-0) (hereinafter the structural unit may be referred to as "acid-stable structural unit (a2-0)") such as p- or m-hydroxystyrene.

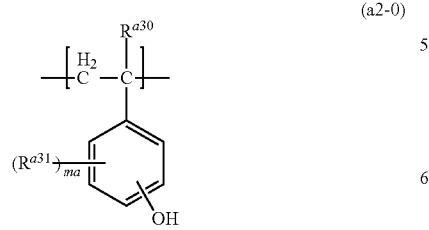

(a2-0)

wherein $R^{a30}$ represents a hydrogen atom, a halogen atom or a $C_1$ to $C_6$ alkyl group that optionally has a halogen atom; $R^{a31}$ in each occurrence independently represents a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

ma represents an integer 0 to 4.

In the formula (a2-0), examples of the alkyl group having a halogen atom of $R^{a30}$ include the same examples described in $R^{a32}$ of the formula (a1-4).

The alkyl group of $R^{a30}$ and $R^{a31}$ is preferably a $C_1$ to $C_4$ alkyl group, more preferably a $C_1$ to $C_2$ alkyl group, and still more preferably methyl group.

Examples of the alkoxy group of $R^{a31}$ include the same examples described in $R^{a33}$ of the formula (a1-4).

The alkoxy group of $R^{a31}$ is preferably a $C_1$ to $C_4$ alkoxy group, more preferably a $C_1$ to $C_2$ alkoxy group, and still more preferably methoxy group.

ma is preferably 0, 1 or 2, more preferably 0 or 1, and still more preferably 0.

Specific examples of the acid-stable structural unit (a2-0) include structural units derived from monomers below.

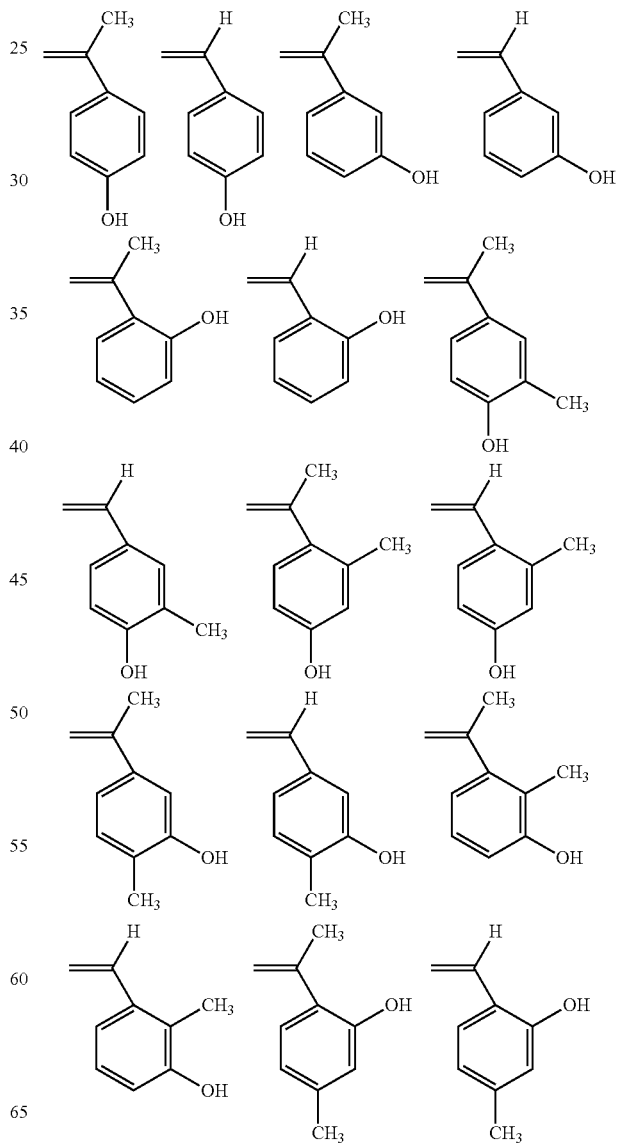

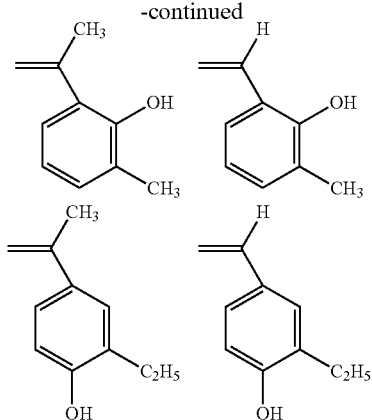

Also, examples thereof include a monomer in which methyl or ethyl group bonding the benzene ring is replaced by at least one substituent described in the examples of $R^{a31}$.

When the resin (A) is produced using the monomer providing the acid-stable structural unit (a2-0), a monomer in which the phenolic hydroxy group is protected by a protecting group can be used. Such protecting group may be a group which can be deprotected through contact with an acid or a base. Because the phenolic hydroxy group protected by the protecting group is deprotected through contact with the acid or the base, the acid-stable monomer (a2-0) can be easily obtained. However, because the resin (A) has the structural unit derived from the monomer having the acid-labile group (a1) as described above, when the phenolic hydroxy group protected by the protecting group is deprotected, the phenolic hydroxy group is preferably placed in contact with the base, so that the acid-labile group does not get seriously impaired. Examples of the protecting group which is deprotectable by the base include an acetyl group or benzoyl group. Examples of the base include 4-dimethylaminopyrizine and triethylamine.

Among these, 4-hydroxystyrene and 4-hydroxy-α-methylstyrene are preferable. These 4-hydroxystyrene and 4-hydroxy-α-methylstyrene may be protected its phenolic hydroxy group by an appropriate protecting group.

When the resin (A) contains the structural unit derived from the monomer represented by the formula (a2-0), the proportion thereof is generally 5 to 95 mol %, preferably 10 to 80 mol %, and more preferably 15 to 80 mol %, with respect to the total structural units (100 mol %) constituting the resin (A).

When the resin (X) contains the structural unit derived from the monomer represented by the formula (a2-0), the proportion thereof is generally 0 to 90 mol %, preferably 10 to 80 mol %, and more preferably 20 to 70 mol %, with respect to the total structural units (100 mol %) constituting the resin (X).

<Acid-stable Structural Unit (a2-1)>

Examples of the acid-stable structural unit having a hydroxy adamantyl group include a structural unit represented by the formula (a2-1) (hereinafter the structural unit may be referred to as "acid-stable structural unit (a2-1)").

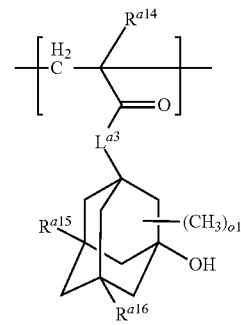

(a2-1)

wherein $L^{a3}$ represents *—O— or *—O—$(CH_2)_{k2}$—CO—O—, k2 represents an integer of 1 to 7, * represents a bond to a carbonyl group (—CO—);

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably *—O—, *—O—$(CH_2)_{k2'}$—CO—O—, here k2' represents an integer of 1 to 4, and more preferably *—O— or *—O—$CH_2$—CO—O—, and still more preferably *—O—;

$R^{a14}$ is preferably a methyl group.

$R^{a15}$ is preferably a hydrogen atom.

$R^{a16}$ preferably a hydrogen atom or a hydroxy group.

o1 is preferably an integer of 0 to 3, and more preferably an integer of 0 or 1.

Examples of the acid-stable structural unit (a2-1) having the hydroxy adamantyl group include units below.

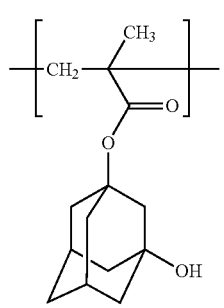

(a2-1-1)

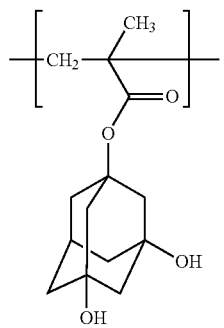

(a2-1-2)

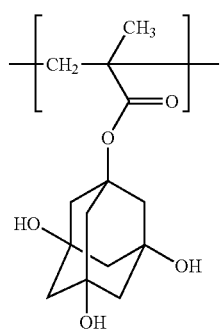 (a2-1-3)
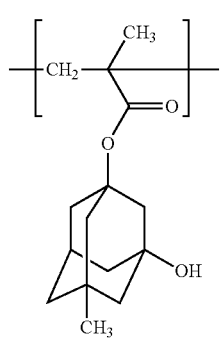 (a2-1-4)
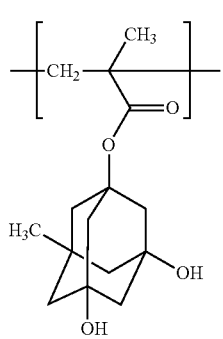 (a2-1-5)
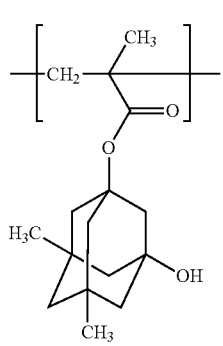 (a2-1-6)
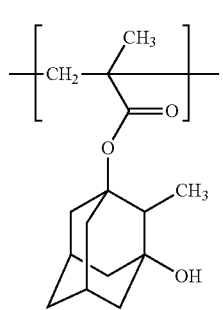 (a2-1-7)
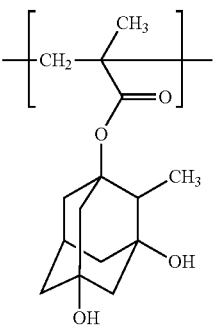 (a2-1-8)
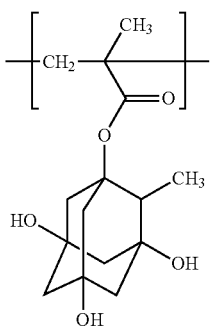 (a2-1-9)
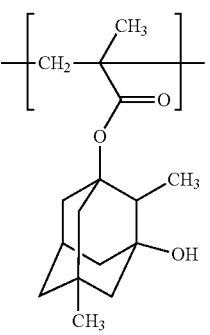 (a2-1-10)
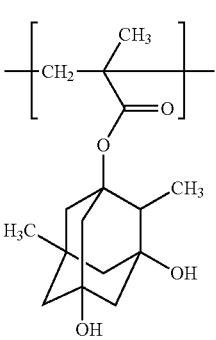 (a2-1-11)
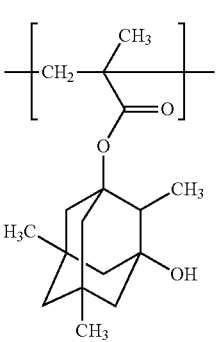 (a2-1-12)

(a2-1-13)

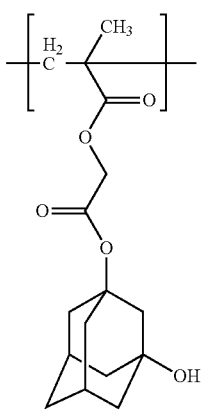

(a2-1-14)

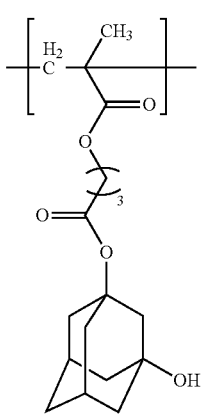

(a2-1-15)

(a2-1-16)

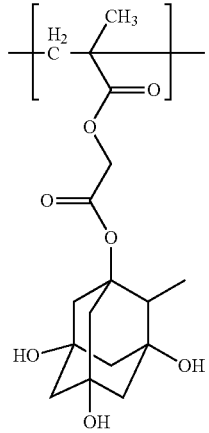

(a2-1-17)

Further, examples of the structural units (a2-1) include structural units in which a partial structure M of the structural units represented by the formula (a2-1-1) to the formula (a2-1-17) is replaced by a partial structure A as described above.

Among these, structural units represented by the formula (a2-1-1), the formula (a2-1-2), the formula (a2-1-13), the formula (a2-1-15) and the structural units in which a partial structure M of the structural units represented by the formula (a2-1-1), the formula (a2-1-2), the formula (a2-1-13) and the formula (a2-1-15) is replaced by a partial structure A are preferable, structural units represented by the formula (a2-1-1), the formula (a2-1-2), the formula (a2-1-13) and the formula (a2-1-15) are more preferable.

When the resin (A) having the structural unit of (a2-1) is produced, 3-hydroxyadamantane-1-yl(meth)acrylate, 3,5-dihydroxyadamantane-1-yl (meth)acrylate and 1-(3,5-dihydroxyadamantane-1-yl oxycarbonyl)methyl (meth)acrylate may be used as a starting material (i.e., monomer).

When the resin (A) contains the structural unit derived from the monomer represented by the formula (a2-1), the proportion thereof is generally 3 to 40 mol %, preferably 5 to 35 mol %, and more preferably 5 to 30 mol %, with respect to the total structural units (100 mol %) constituting the resin (A).

When the resin (X) contains the structural unit derived from the monomer represented by the formula (a2-1), the proportion thereof is generally 1 to 90 mol %, preferably 10 to 80 mol %, and more preferably 20 to 70 mol %, with respect to the total structural units (100 mol %) constituting the resin (X).

<Acid-stable Structural Unit (a3)>

The lactone ring included in the acid-stable structural unit (a3) may be a monocyclic compound such as β-propiolactone ring, γ-butyrolactone, δ-valerolactone, or a condensed ring with monocyclic lactone ring and other ring. Among these, γ-butyrolactone and condensed ring with γ-butyrolactone and other ring are preferable.

Examples of the acid-stable structural unit (a3) having the lactone ring include structural units represented by any of the formula (a3-1), the formula (a3-2) or the formula (a3-3). Hereinafter these structural units may be referred to as "acid-stable structural unit (a3-1)", "acid-stable structural unit (a3-2)" or "acid-stable structural unit (a3-3)". These structural units may be used as a single unit or as a combination of two or more units.

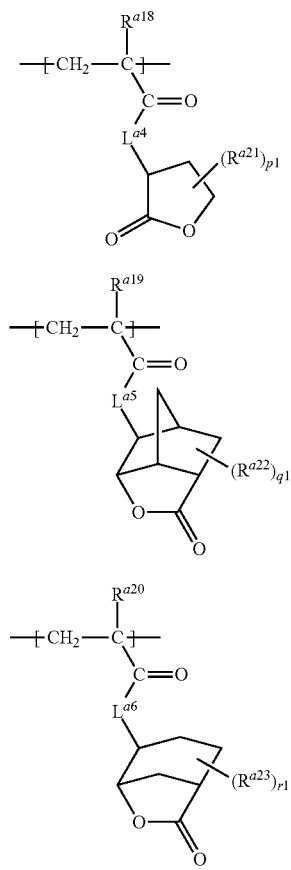

wherein $L^{a4}$, $L^{a5}$ and $L^{a6}$ independently represents *—O— or *—O—$(CH_2)_{k3}$—CO—O—, k3 represents an integer of 1 to 7, * represents a bond to a carbonyl group;

$R^{a18}$, $R^{a19}$ and $R^{a20}$ independently represent a hydrogen atom or a methyl group;

$R^{a21}$ in each occurrence represents a $C_1$ to $C_4$ aliphatic hydrocarbon group;

$R^{a22}$ and $R^{a23}$ in each occurrence independently represent a carboxy group, a cyano group or a $C_1$ to $C_4$ aliphatic hydrocarbon group;

p1 represents an integer of 0 to 5;

q1 and r1 independently represent an integer of 0 to 3.

In the formulae (a3-1) to (a3-3), $L^{a4}$ to $L^{a6}$ is independently preferably *—O—$(CH_2)_{k3'}$—CO—O—, here k3' represents an integer of 1 to 4, more preferably —O— or *—O—$CH_2$—CO—O—, and still more preferably *—O—.

$R^{a18}$ to $R^{a20}$ is preferably a methyl group.

$R^{a21}$ is preferably a methyl group.

$R^{a22}$ and $R^{a23}$ are independently preferably a carboxy group, a cyano group or a methyl group.

p1, q1 and r1 are independently preferably an integer of 0 to 2, and more preferably 0 or 1.

Examples of the acid-stable structural units having γ-butyrolactone ring (a3-1) include units below.

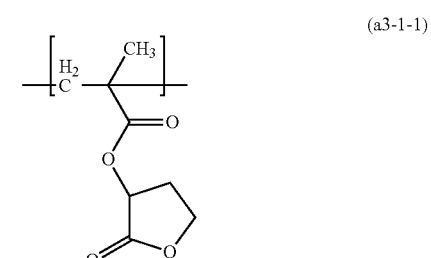

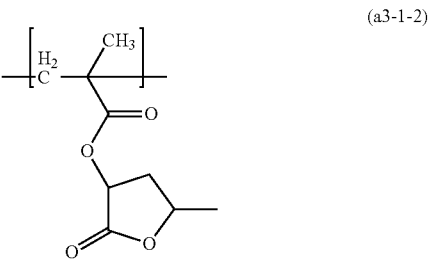

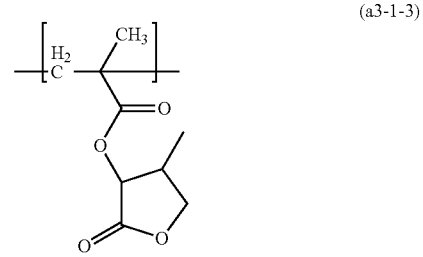

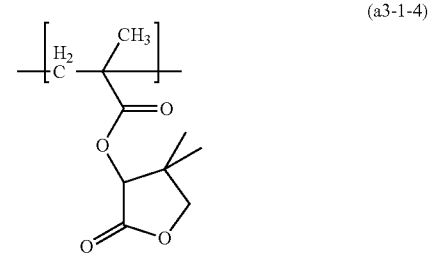

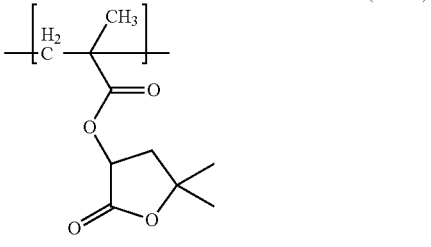

(a3-1-6)
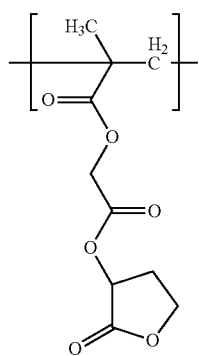
(a3-1-7)
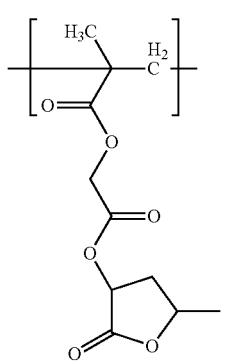
(a3-1-8)
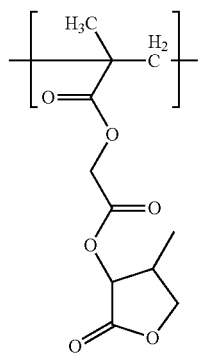
(a3-1-9)
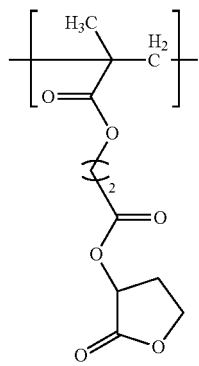
(a3-1-10)
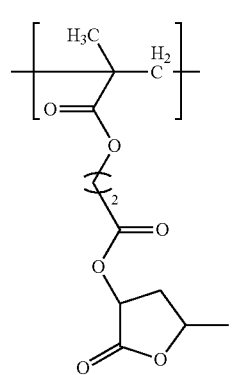
(a3-1-11)
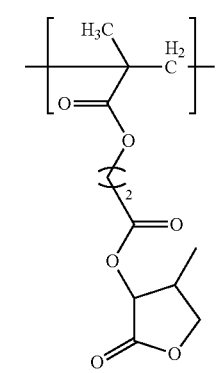
Examples of the acid-stable structural units having γ-butyrolactone ring and norbornene ring (a3-2) include units below.
(a3-2-1)
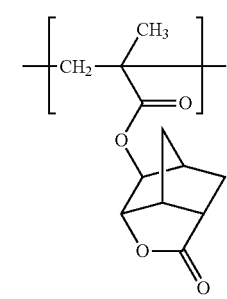
(a3-2-2)
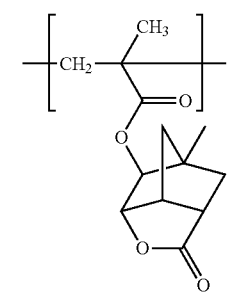

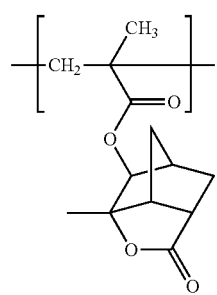 (a3-2-3)
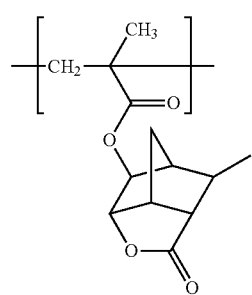 (a3-2-4)
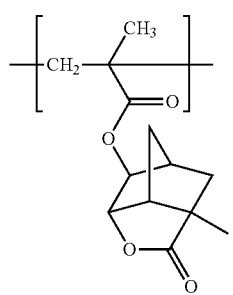 (a3-2-5)
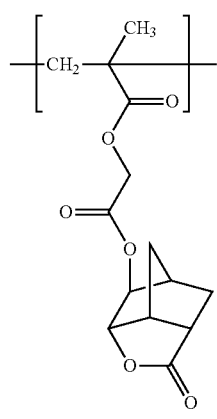 (a3-2-6)
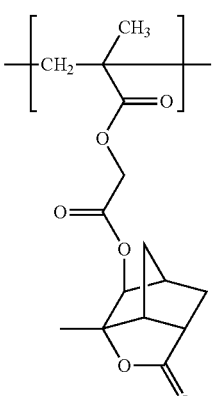 (a3-2-7)
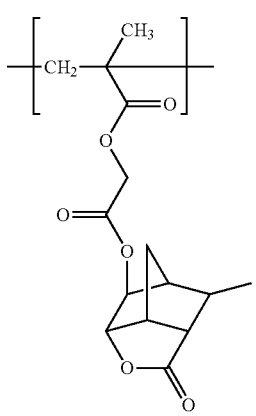 (a3-2-8)
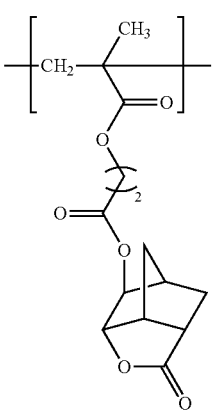 (a3-2-9)
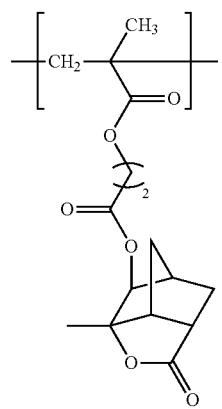 (a3-2-10)

(a3-2-11)

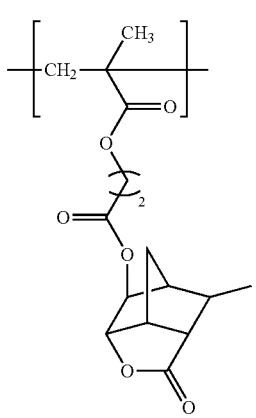

(a3-3-4)

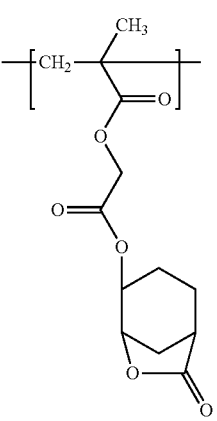

(a3-3-5)

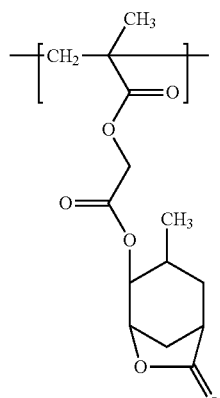

Examples of the acid-stable structural units having a condensed ring with γ-butyrolactone ring and cyclohexane ring (a3-3) include units below.

(a3-3-1)

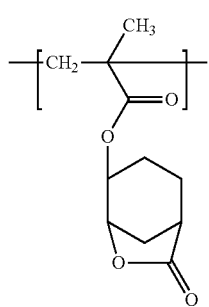

(a3-3-6)

(a3-3-2)

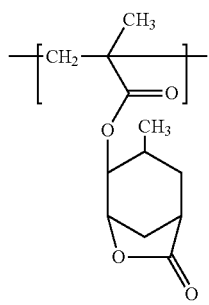

(a3-3-3)

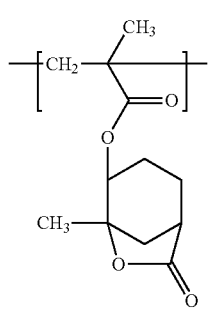

Also, examples of the structural units (a3-1), the structural units (a3-2) and the structural units (a3-3) include structural units in which a partial structure M of the structural units represented by the formula (a3-1-1) to the formula (a3-1-11), the structural units represented by the formula (a3-2-1) to the formula (a3-2-11) and the structural units represented by the formula (a3-3-1) to the formula (a3-3-6) is replaced by a partial structure A as described above.

Further, examples thereof include the structural units in which methyl group bonding the lactone ring is replaced by at least one substituent described in the examples of $R^{a21}$, $R^{a22}$ and $R^{a23}$.

Among the acid-stable structural unit having a lactone ring (a3), the acid-stable structural unit derived from α-(meth)acryloyloxy-γ-butyrolactone, β-(meth)acryloyloxy-γ-butyrolactone, α-(meth)acryloyloxy-β,β-dimethyl-γ-butyrolactone, α-(meth)acryloyloxy-α-methyl-γ-butyrolactone, β-(meth)acryloyloxy-α-methyl-γ-butyrolactone, (5-oxo-4-oxatricyclo[4.2.1.0$^{3,7}$]nonane-2-yl) (meth)acrylate, tetrahydro-2-oxo-3-furyl (meth)acrylate, and 2-(5-oxo-4-oxatricyclo[4.2.1.0 $^{3,7}$] nonane-2-yloxy)-2-oxoethyl (meth)acrylate are preferable.

When the resin (A) contains the structural unit represented by the formula (a3-1), the structural unit represented by the formula (a3-2) and/or the structural unit represented by the formula (a3-3), the total proportion thereof is preferably 5 to 50 mol %, more preferably 10 to 40 mol %, still more preferably 15 to 40 mol %, with respect to the total structural units (100 mil %) constituting the resin (A).

When the resin (A) contains the structural unit represented by the formula (a3-1), the structural unit represented by the formula (a3-2) and/or the structural unit represented by the formula (a3-3), the proportion thereof is preferably 5 to 60 mol %, more preferably 10 to 55 mol %, still more preferably 20 to 50 mol %, and further more preferably 20 to 45 mol %, with respect to the total structural units (100 mol %) constituting the resin (A), respectively.

When the resin (X) contains the structural unit represented by the formula (a3-1), the structural unit represented by the formula (a3-2) and/or the structural unit represented by the formula (a3-3), the total proportion thereof is generally 0 to 90 mol %, preferably 10 to 80 mol %, and more preferably 20 to 70 mol %, with respect to the total structural units (100 mol %) constituting the resin (X).

<Acid-stable Monomer (a4)>

Examples of the acid-stable monomer other than the above include maleic anhydride represented by the formula (a4-1), itaconic anhydride represented by the formula (a4-2) or an acid-stable monomer having norbornene ring represented by the formula (a4-3), for example, hereinafter the monomers may be referred to as "acid-stable monomer (a-4-1)", "acid-stable monomer (a-4-2)" and "acid-stable monomer (a-4-3)", respectively.

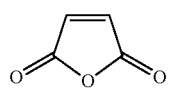
(a4-1)

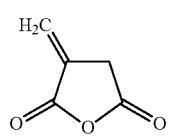
(a4-2)

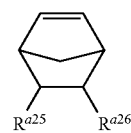
(a4-3)

wherein $R^{a25}$ and $R^{a26}$ independently represent a hydrogen atom, a $C_1$ to $C_3$ alkyl group that optionally has a hydroxy group, a cyano group, a carboxy group or —COOR$^{a27}$, or R$^{a25}$ and R$^{a26}$ may be bonded together to form —CO—O—CO—, R$^{a27}$ represents a $C_1$ to $C_{18}$ aliphatic hydrocarbon group, one or more —CH$_2$— contained in the aliphatic hydrocarbon group may be replaced by —O— or —CO—, provided that excluding a group in which the —COOR$^{a27}$ is an acid-labile group, that is, R$^{a27}$ does not include a group in which the tertiary carbon atom bonds to —O—.

Examples of the alkyl group that optionally has a hydroxy group of R$^{a25}$ and R$^{a26}$ include, for example, methyl, ethyl, propyl, hydroxymethyl and 2-hydroxyethyl groups.

The aliphatic hydrocarbon group of R$^{a27}$ has preferably a $C_1$ to $C_8$ alkyl group and a $C_4$ to $C_{18}$ alicyclic hydrocarbon group, and more preferably a $C_1$ to $C_6$ alkyl group and a $C_4$ to $C_{12}$ alicyclic hydrocarbon group, and still more preferably a methyl, ethyl, propyl, 2-oxo-oxorane-3-yl and 2-oxo-oxorane-4-yl groups.

Specific examples of the acid-stable monomer having the norbornene ring (a4-3) include 2-norbornene, 2-hydroxy-5-norbornene, 5-norbornene-2-carboxylic acid, methyl 5-norbornene-2-carboxylate, 2-hydroxy-1-ethyl 5-norbornene-2-carboxylate, 5-norbornene-2-methanol and 5-norbornene-2, 3-dicarboxylic acid anhydride.

When the resin (A) contains the structural unit derived from the monomer represented by the formula (a4-1), the monomer represented by the formula (a4-2) and/or the monomer represented by the formula (a4-3), the total proportion thereof is generally 2 to 40 mol %, preferably 3 to 30 mol %, and more preferably 5 to 20 mol %, with respect to the total structural units (100%) constituting the resin (A).

When the resin (X) contains the structural unit derived from the monomer represented by the formula (a4-1), the monomer represented by the formula (a4-2) and/or the monomer represented by the formula (a4-3), the total proportion thereof is preferably 5 to 20 mol %, with respect to the total structural units (100 mol %) constituting the resin (X).

Further, examples of the acid-stable monomer other than the above include a monomer having a sultone ring represented by the formula (a4-4).

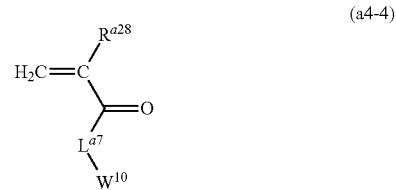
(a4-4)

wherein L$^{a7}$ represents an oxygen atom or *-T-(CH$_2$)$_{k2}$—CO—O—, k2 represents an integer of 1 to 7, T represents an oxygen atom or NH, * represents a single bond to carbonyl group;

R$^{a28}$ represents a hydrogen atom or a methyl group;

W$^{10}$ represent a group having an optionally substituted sultone ring.

The sultone ring is a ring in which two of adjacent methylene groups are replaced by an oxygen atom and a sulfonyl group, respectively, and examples thereof include a ring below. The sultone ring group is a group in which one or more hydrogen atom contained in the sultone ring below is replaced by a bond, which correspond to a bond to L$^{a7}$ in the formula (a4-4).

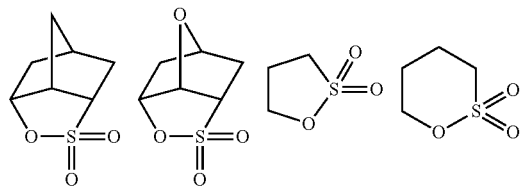

The group having an optionally substituted sultone ring means a group in which one or more hydrogen atom other than a hydrogen atom which has been replaced by a bond contained in the sultone ring is replaced by a substituent (monovalent group other than a hydrogen atom), and examples thereof include a hydroxy group, cyano group, a $C_1$ to $C_6$ alkyl group, a $C_1$ to $C_6$ fluorinated alkyl group, a $C_1$ to $C_6$ hydroxy alkyl group, a $C_1$ to $C_6$ alkoxy group, a $C_1$ to $C_7$ alkoxycarbonyl group, a $C_1$ to $C_7$ acyl group and a $C_1$ to $C_8$ acyloxy group.

Specific examples of the acid-stable monomer (a4-4) having a sultone ring include a monomer below.

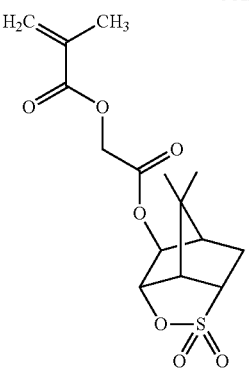
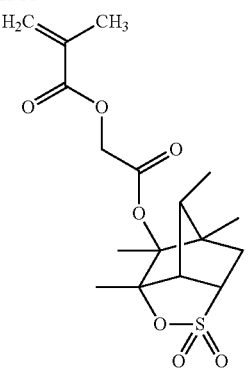

-continued

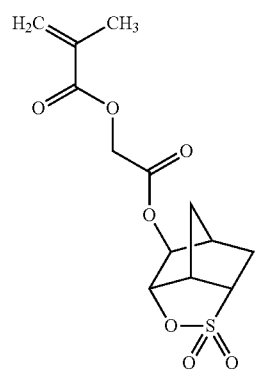
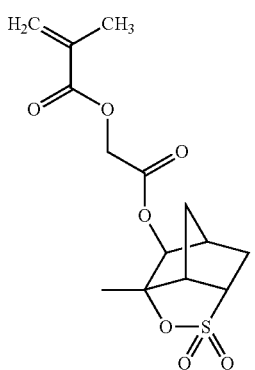

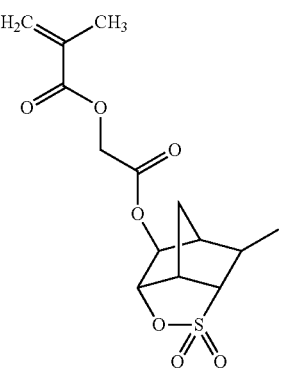
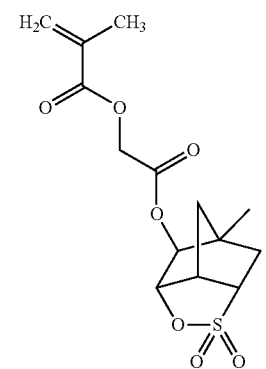
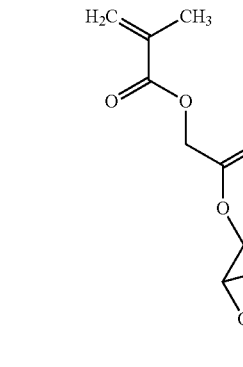

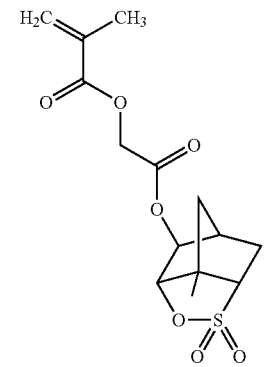
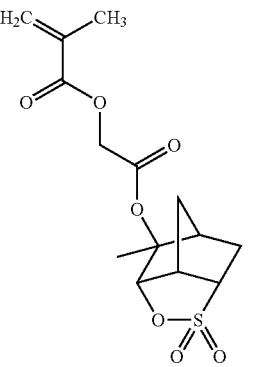
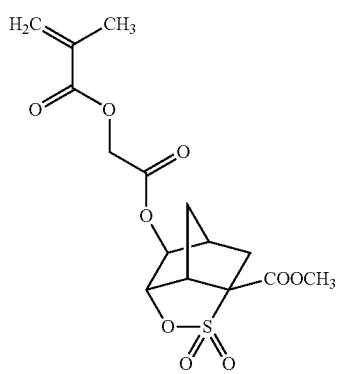

69
-continued
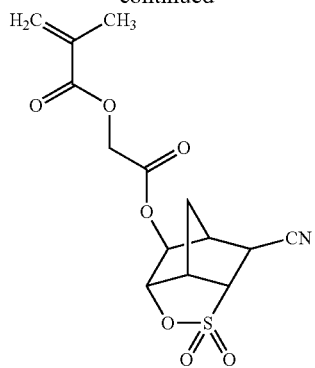
70
-continued
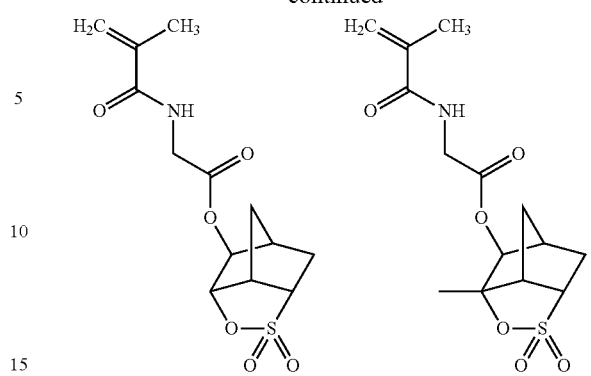
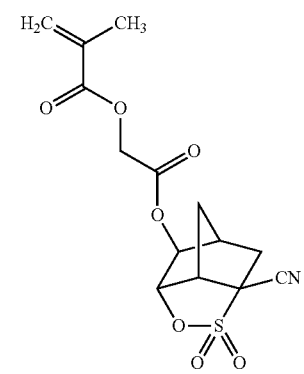
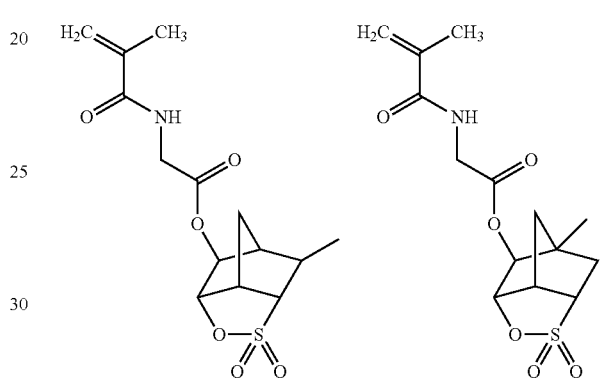
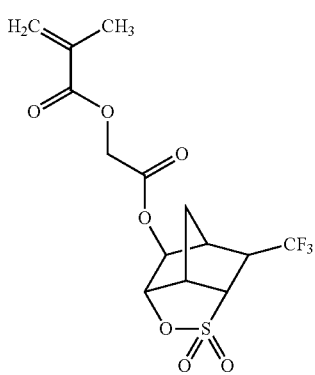
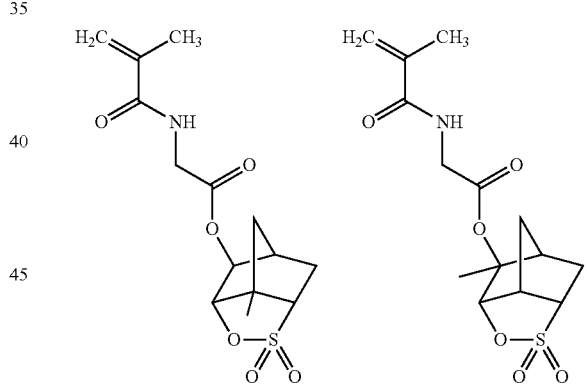
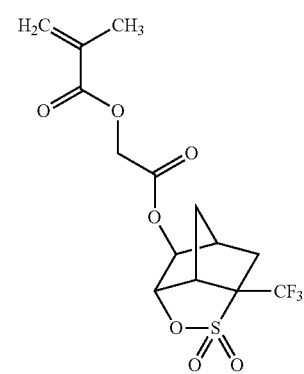
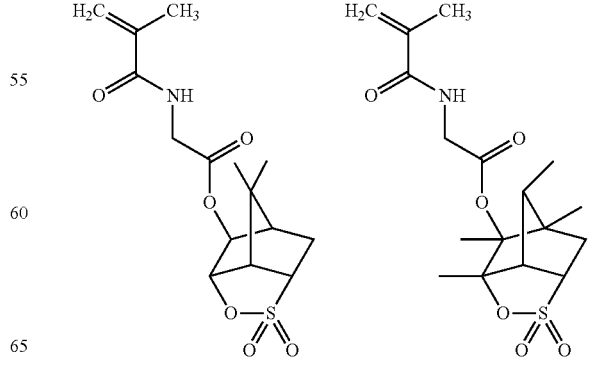

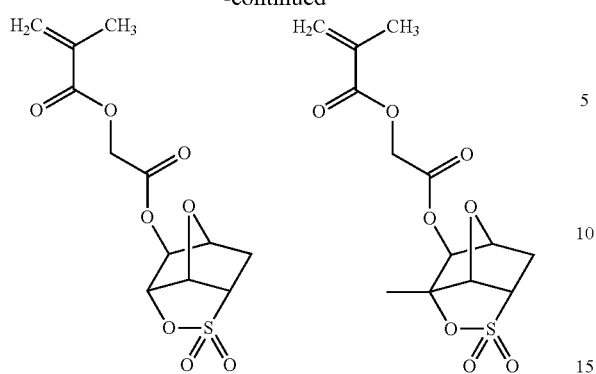
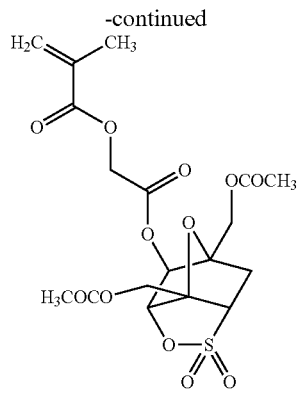
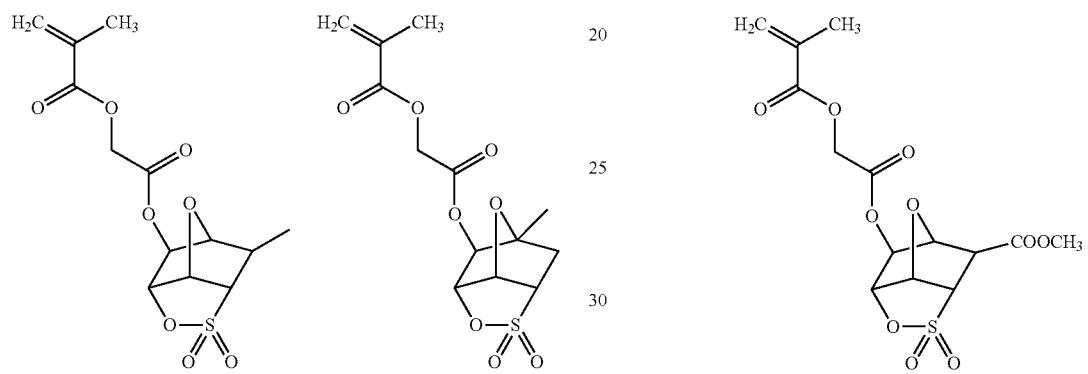
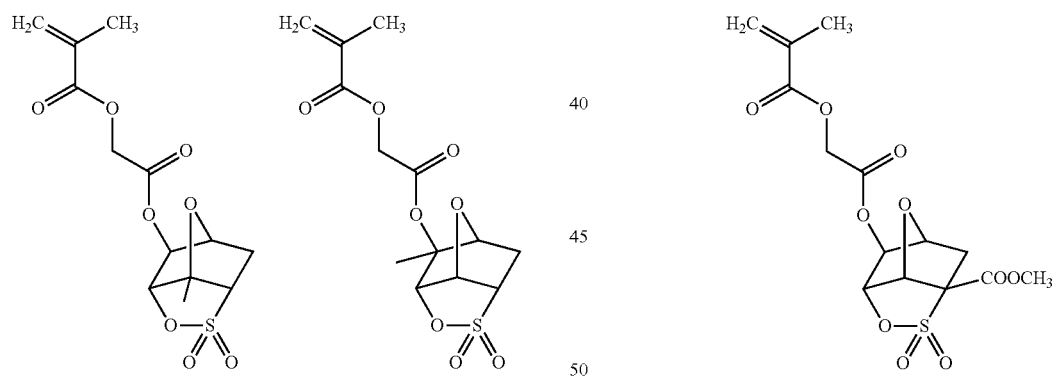
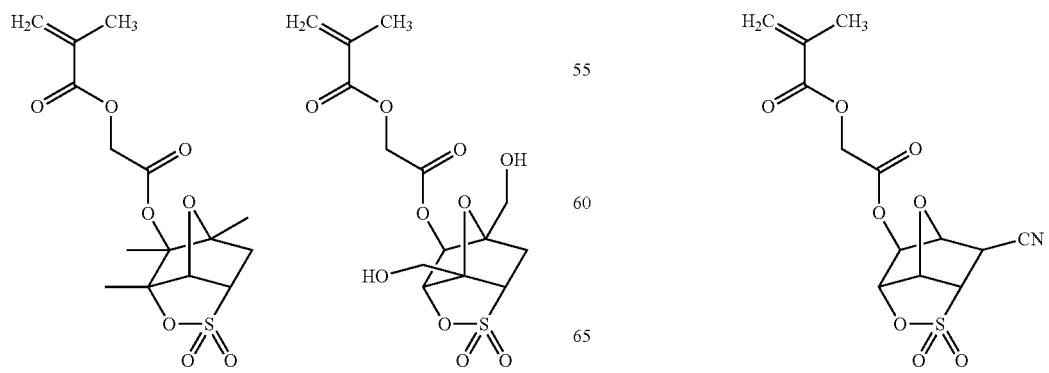

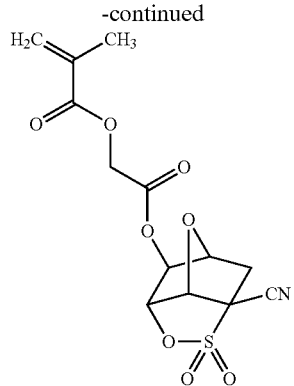
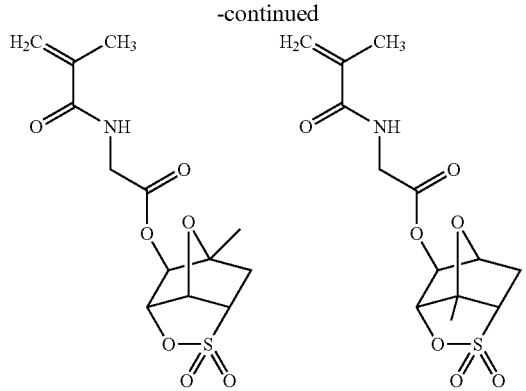
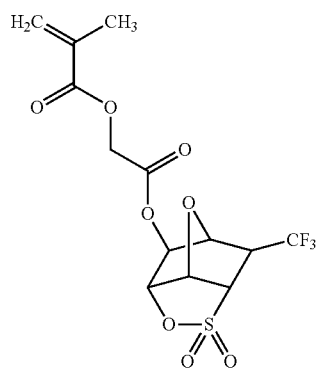
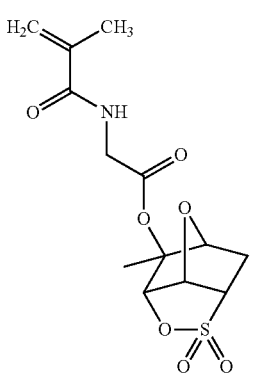
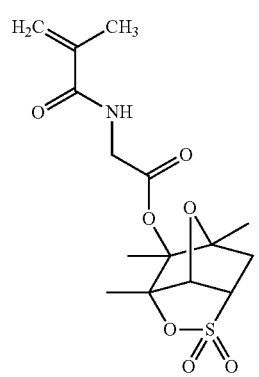
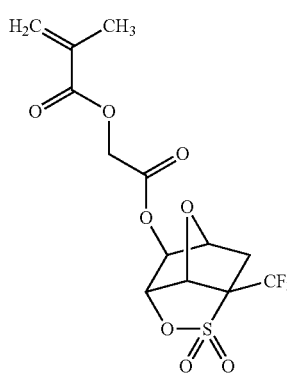
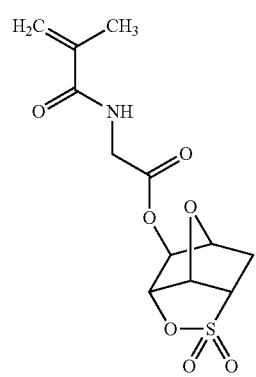
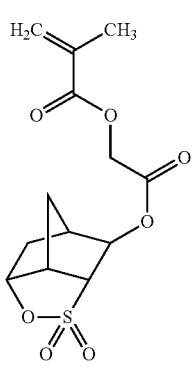
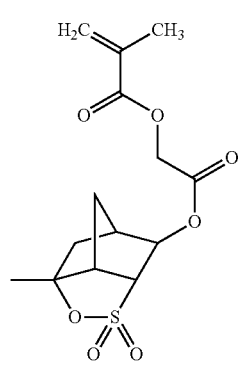
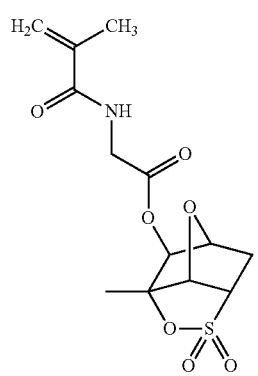
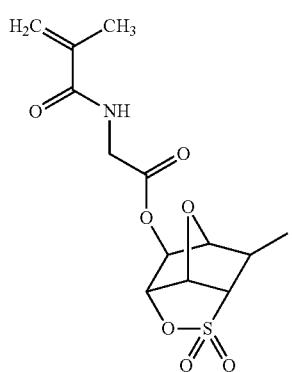
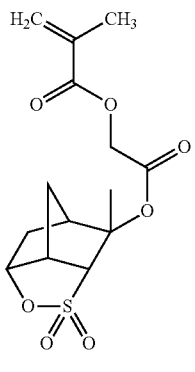
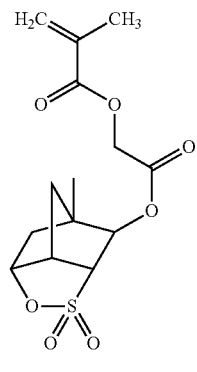

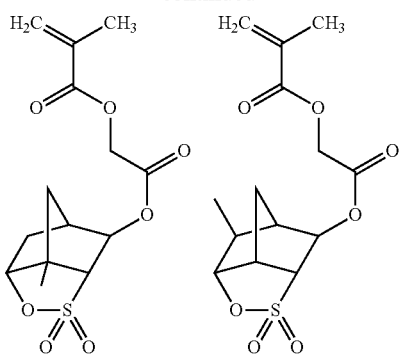
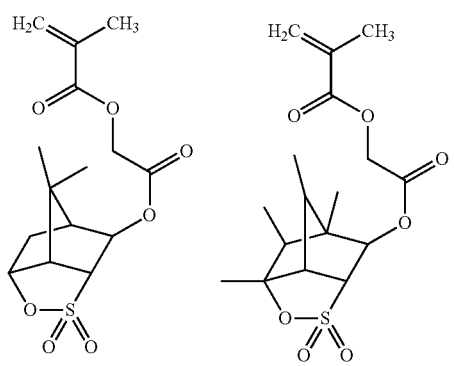
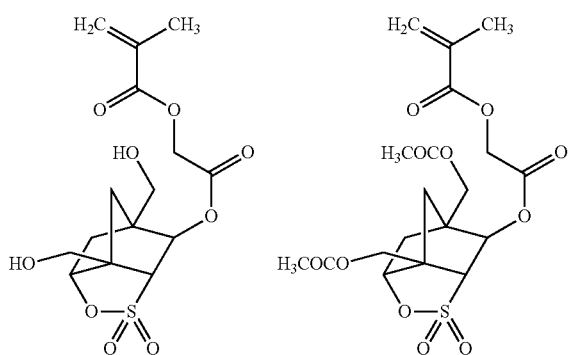
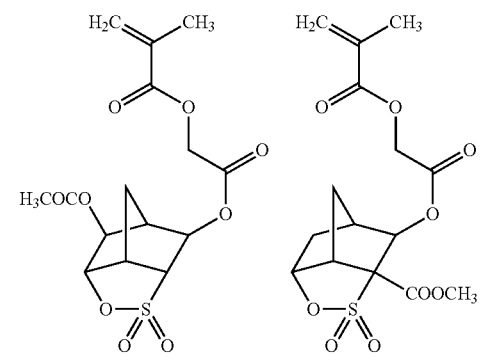
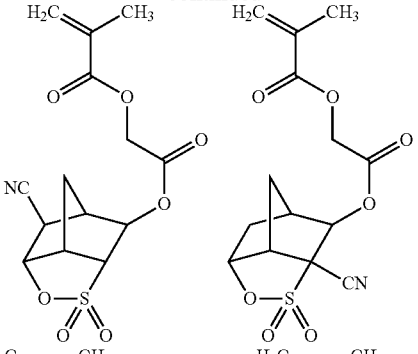
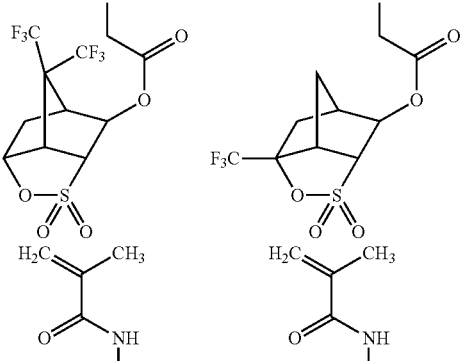
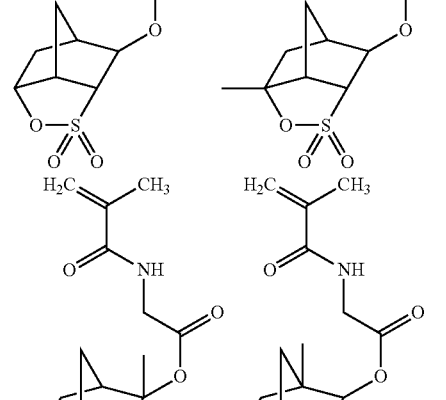
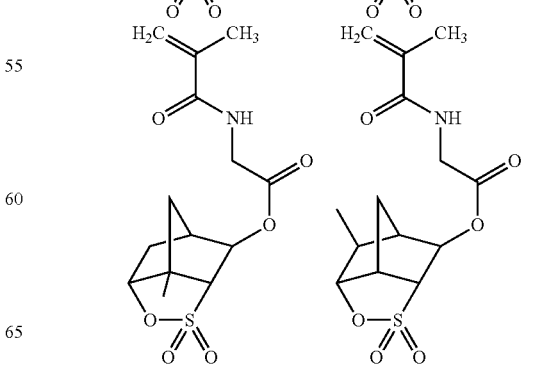

77
-continued
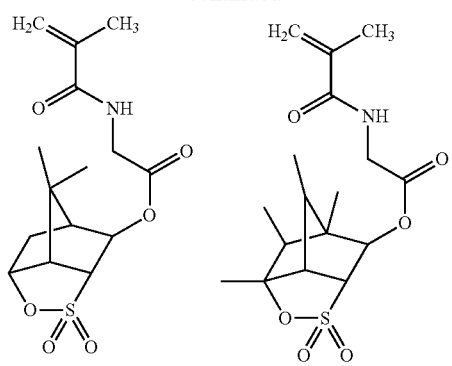
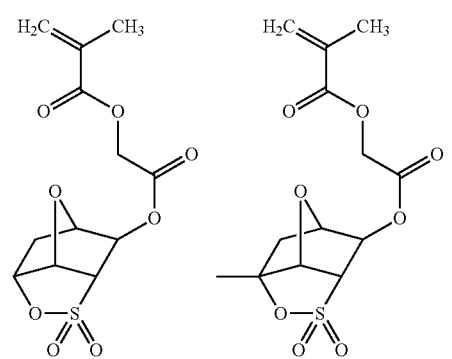
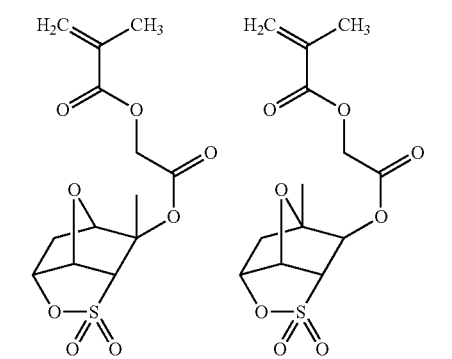
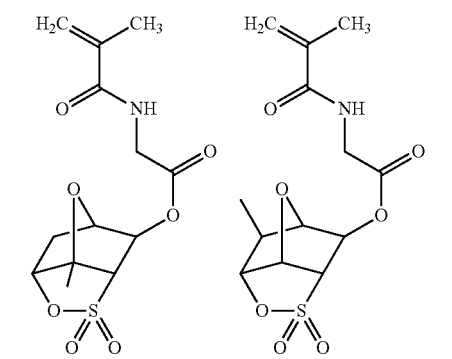
78
-continued
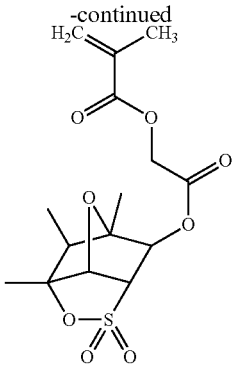
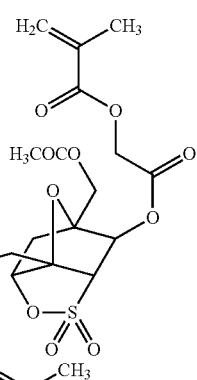
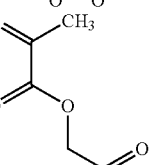
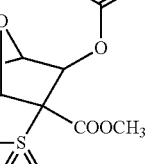
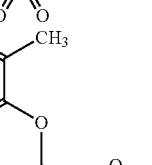
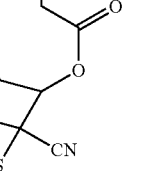
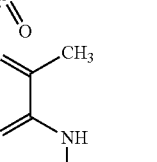
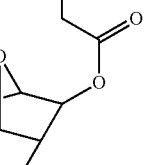

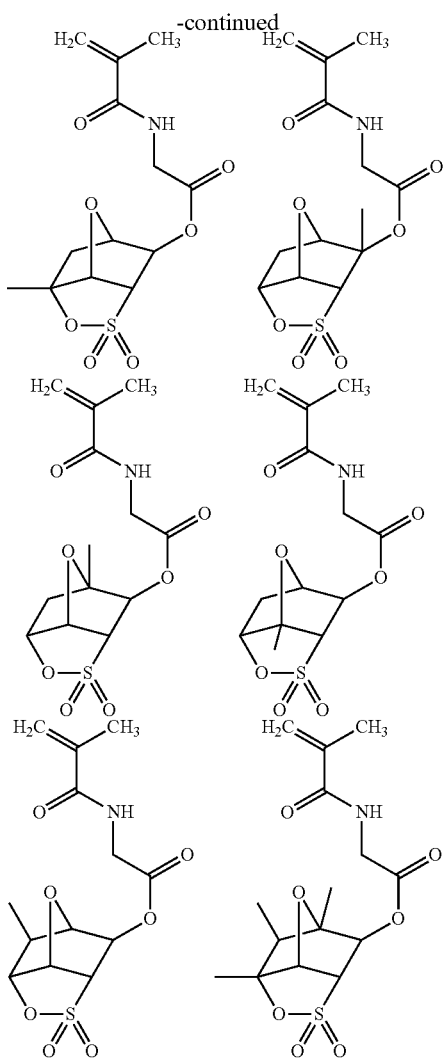

Further, examples of the structural units (a4-4) include structural units in which a partial structure V of the structural units above is replaced by a partial structure P as described above.

When the resin (A) contains the structural unit derived from the acid-stable monomer (a4-4), the proportion thereof is generally 2 to 40 mol %, preferably 3 to 35 mol %, and more preferably 5 to 30 mol %, with respect to the total structural units (100 mol %) constituting the resin (A).

When the resin (X) contains the structural unit derived from the acid-stable monomer (a4-4), the proportion thereof is generally 0 to 90 mol %, preferably 10 to 80 mol %, and more preferably 20 to 70 mol %, with respect to the total structural units (100 mol %) constituting the resin (X).

An acid-stable monomer (a4-5) containing a fluorine atom as follows is used for manufacturing the resin.

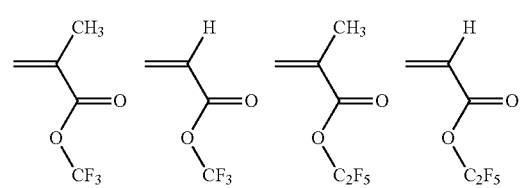

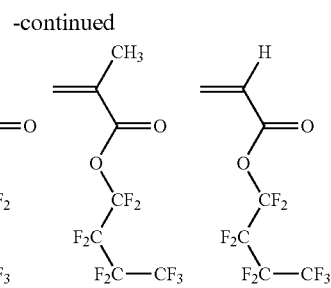

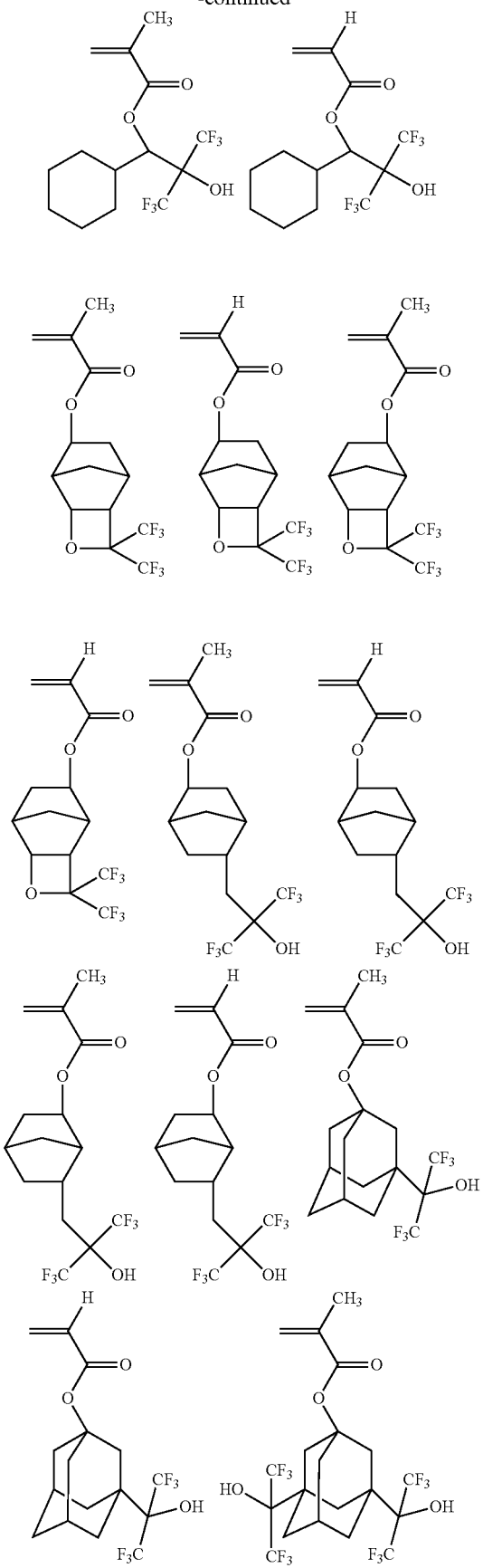
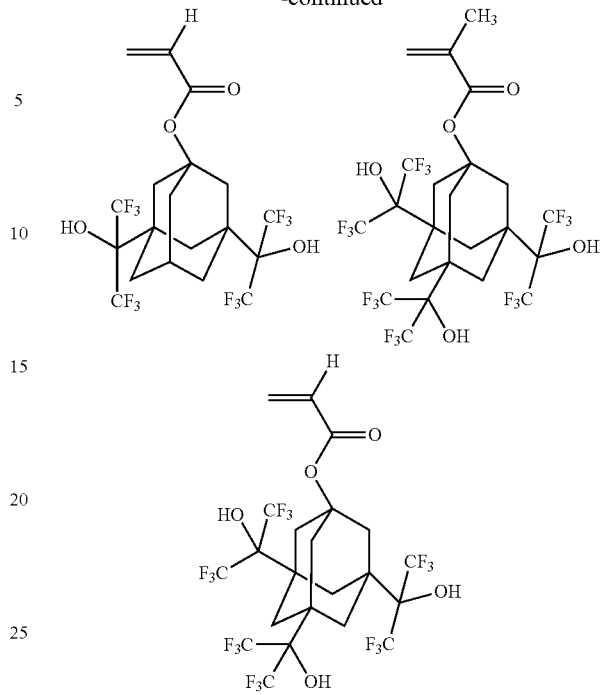

Among these, 5-(3,3,3-trifluoro-2-hydroxy-2-[trifluoromethyl]propyl) bicyclo[2.2.1]hept-2-yl(meth)acrylate, 6-(3,3,3-trifluoro-2-hydroxy-2-[trifluoromethyl]propyl) bicyclo[2.2.1]hept-2-yl(meth)acrylate, 4,4-bis(trifluoromethyl)-3-oxatricyclo[4.2.1.0$^{2,5}$]nonyl which have mono- or poly-alicyclic hydrocarbon group are preferable.

When the resin (A) contains the structural unit derived from the monomer represented by the formula (a4-5), the proportion thereof is generally 1 to 20 mol %, preferably 2 to 15 mol %, and more preferably 3 to 10 mol %, with respect to the total structural units (100 mol %) constituting the resin (A).

When the resin (X) contains the structural unit derived from the monomer represented by the formula (a4-5), the proportion thereof is preferably 5 to 40 mol %, with respect to the total structural units (100 mol %) constituting the resin (X).

The acid-stable monomer (a4) may have a group represented by the formula (3) below. The acid-stable monomer having a group represented by the formula (3) hereinafter may be referred to as "acid-stable monomer (a4-6)".

(3)

wherein R$^{10}$ represents a C$_1$ to C$_6$ fluorinated alkyl group; * represents a bond.

Examples of the fluorinated alkyl group of R$^{10}$ include difluoromethyl, trifluoromethly, 1,1-difluoroethyl, 2,2-difluoroothyl, 2,2,2-trilluoroethyl, perfluoroethyl, 1,1,2,2-tetrafluoropropyl, 1,1,2,2,3,3-hexafluoropropyl, perfluoroethylmethyl, 1-(trifluoromethyl)1,2,2,2-tetrafluoroethyl, perfluoropropyl, 1,1,2,2-tetratfluorobutyl, 1,1,2,2,3,3-hexafluorobutyl, 1,1,2,2,3,3,4,4-octafluorobutyl, perfluorobutyl, 1,1-bis(trifluoro)methyl-2,2,2-trifluoroethyl, 2-(per-fluoropropyl)ethyl, 1,1,2,2,3,3,4,4-octafluoropentyl, perfluoropentyl, 1,1,2,2,3,3,4,4,5,5-decalluoropentyl, 1,1-bis(trifluoromethyl)-2,2,3,3,3-pentafluoropropyl, 2-perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl and perfluorohexy groups.

The fluorinated alkyl group of $R^{10}$ preferably has 1 to 4 carbon atom, more preferably trifluoromethyl, perfluoroethyl and perfluoropropyl groups, and still more preferably trifluoromethyl group.

Specific examples of the acid stable monomer (a4-6) include monomers below.

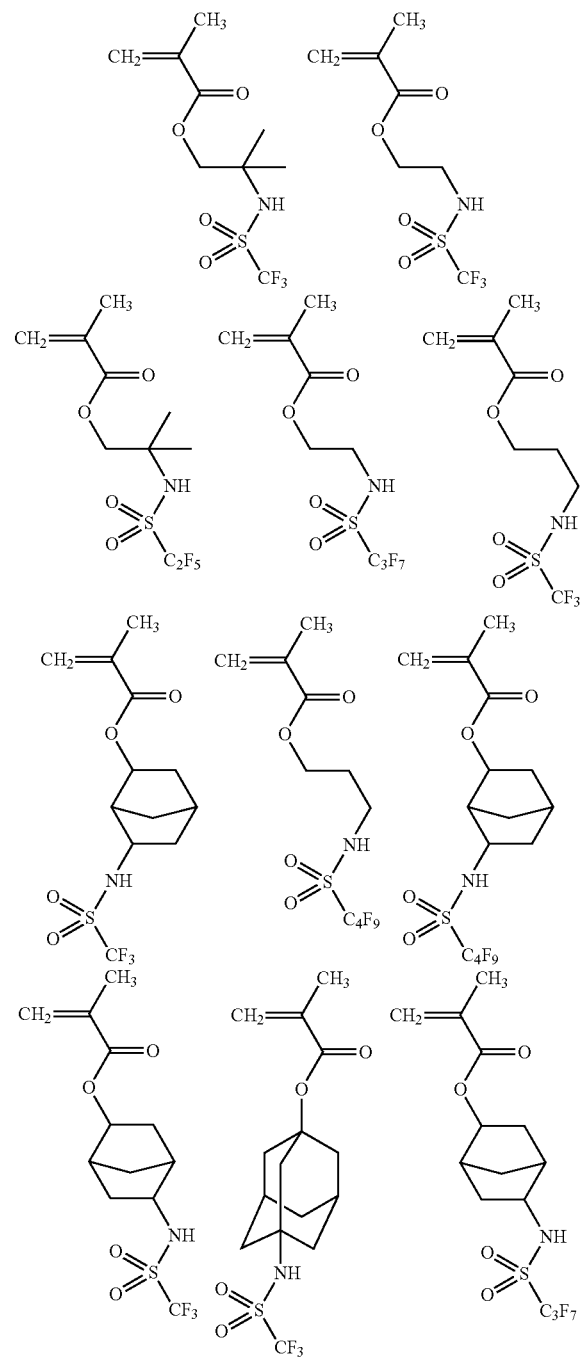

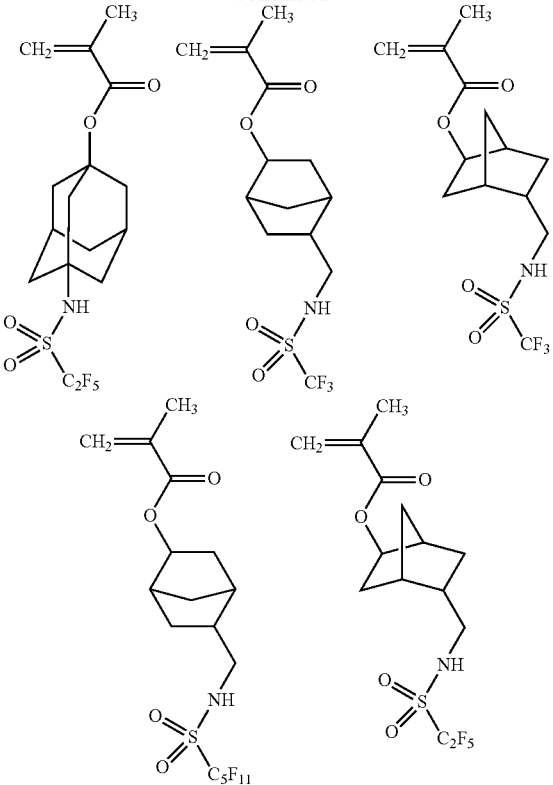

Further, examples of the structural units (a4-6) include structural units in which a partial structure V of the structural units above is replaced by a partial structure P as described above.

Other specific examples of the acid stable monomer (a4-6) include monomers below.

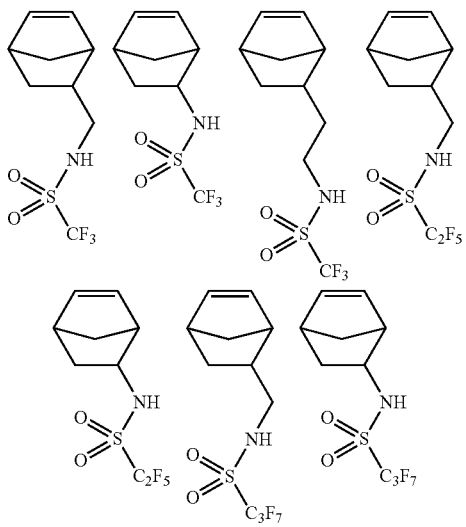

When the resin (A) contains the structural unit derived from the acid-stable monomer (a4-6), the proportion thereof is generally 5 to 90 mol %, preferably 10 to 80 mol %, and more preferably 20 to 70 mol %, with respect to the total structural units (100 mol %) of the resin (A).

When the resin (X) contains the structural unit derived from the acid-stable monomer (a4-6), the proportion thereof is generally 0 to 90 mol %, preferably 10 to 80 mol %, and more preferably 20 to 70 mol %, with respect to the total structural units (100 mol %) of the resin (X).

The acid-stable monomer (a4) may have a group represented by the formula (4).

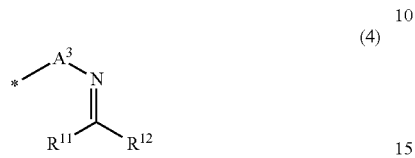

(4)

wherein $R^{11}$ represents an optionally substituted $C_6$ to $C_{12}$ aromatic hydrocarbon group;

$R^{12}$ represents an optionally substituted $C_1$ to $C_{12}$ hydrocarbon group, and the hydrocarbon group may contain a hetero atom;

$A^3$ represents a single bond, —$(CH_2)_{m10}$—$SO_2$—O—* or —$(CH_2)_{m10}$—CO—O—*, one or more —$CH_2$— contained in the [—$(CH_2)_{m10}$—] may be replaced by —O—, —CO— or —$SO_2$—, one or more hydrogen atom contained in the [—$(CH_2)_{m10}$—] may be replaced by a fluorine atom;

m10 represents an integer 1 to 12.

Examples of the aromatic hydrocarbon group of $R^{11}$ include the same examples described above.

One or more hydrogen atom contained in the aromatic hydrocarbon group may be replaced by a $C_1$ to $C_4$ alkyl group, a halogen atom, a phenyl group, a nitro group, a cyano group, a hydroxy group, a phenyloxy group or tert-butylphenyl group.

Specific examples of the preferable group for $R^{11}$ include a group below. * represents a bond to carbon atom.

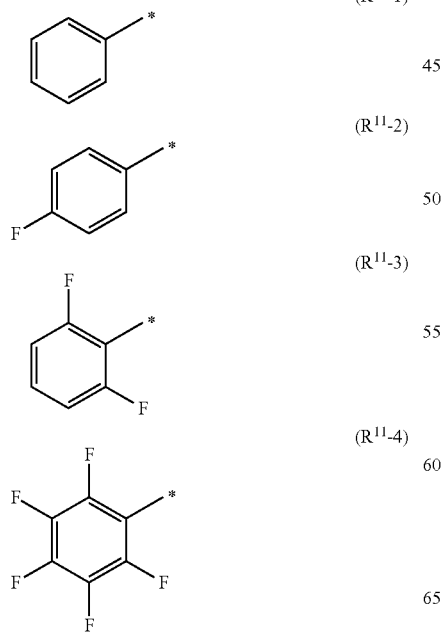

(R$^{11}$-1)

(R$^{11}$-2)

(R$^{11}$-3)

(R$^{11}$-4)

-continued

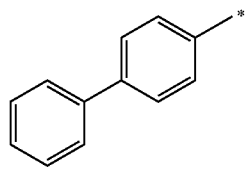

(R$^{11}$-5)

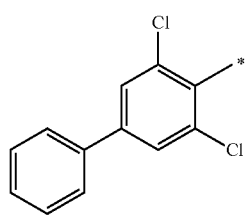

(R$^{11}$-6)

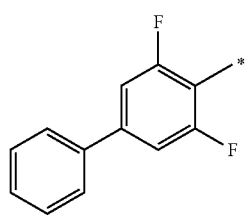

(R$^{11}$-7)

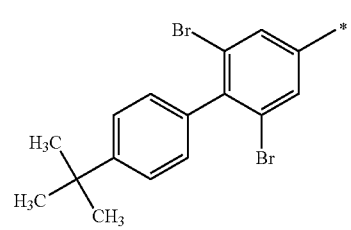

(R$^{11}$-8)

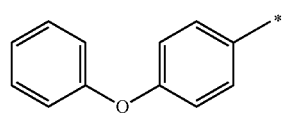

(R$^{11}$-9)

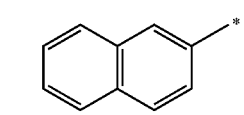

(R$^{11}$-10)

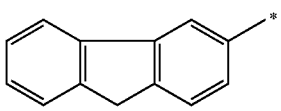

(R$^{11}$-11)

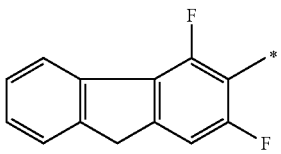

(R$^{11}$-12)

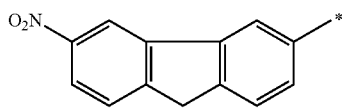

(R$^{11}$-13)

The hydrocarbon group of $R^{12}$ may be any of a chain aliphatic hydrocarbon group, an alicyclic hydrocarbon group and an aromatic hydrocarbon group.

Typical examples of the aliphatic hydrocarbon group are an alkyl group, and examples of the alkyl group include the same groups of $R^{a34}$ and $R^{a35}$ in the formula (a1-4).

When $R^{12}$ is an aliphatic hydrocarbon group or an alicyclic hydrocarbon group, these may contain a hetero atom. Examples of the hetero atom include a halogen atom, a sulfur atom, an oxygen atom and a nitrogen atom, and may include a configuration of linking group such as a sulfonyl group and a carbonyl group.

Specific examples of $R^{12}$ containing such hetero atom include a group below.

When $R^{12}$ is an aromatic hydrocarbon group, specific examples thereof include the same examples described above.

Specific examples of $A^3$ include a group below.

-continued
(A²-7) 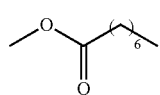
(A²-8) 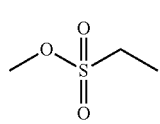
(A²-9) 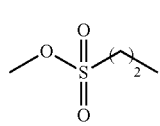
(A²-10) 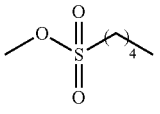
(A²-11) 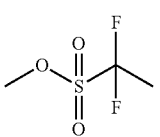
(A²-12) 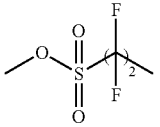
(A²-13) 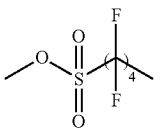
(A²-14) 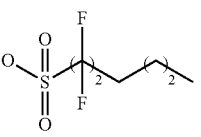
(A²-15) 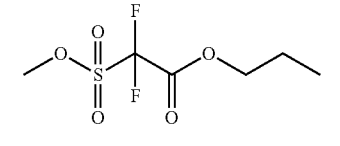
(A²-16) 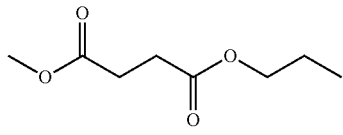
An acid-stable monomer (a4) containing a group represented by the formula (4) include an acid-stable monomer represented by the formula (a4-7).
(a4-7) 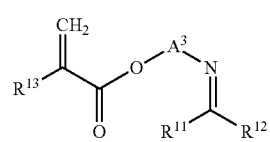
wherein $R^{13}$ represents a hydrogen atom or a methyl group; $R^{11}$, $R^{12}$ and $A^3$ are the same meanings described above.
Specific examples of the acid-stable monomer (a4-7) include a monomer below.
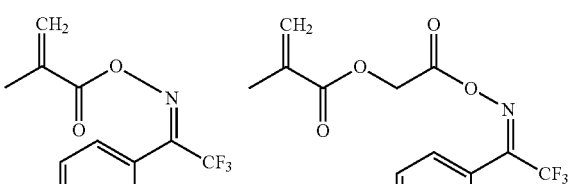
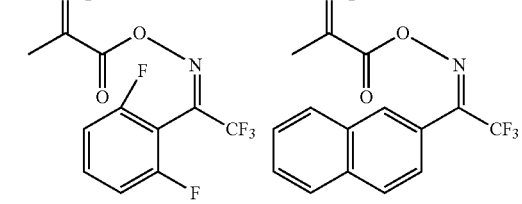
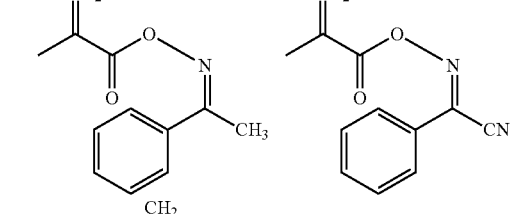
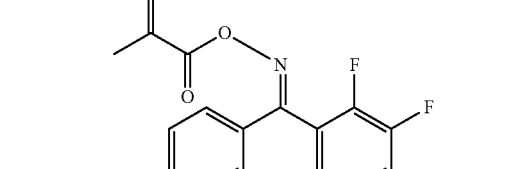
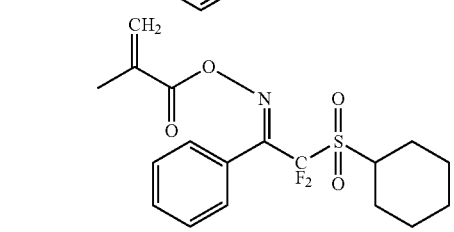

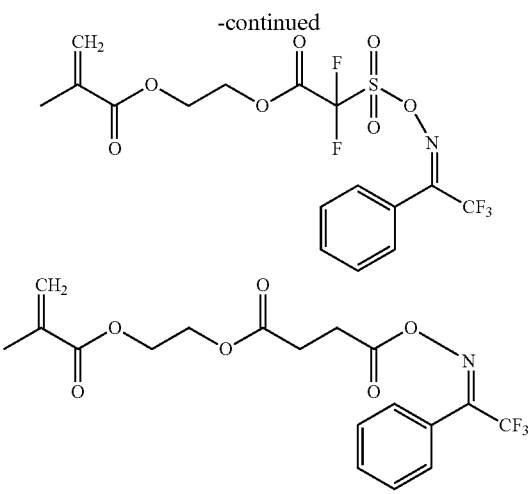

Further, examples of the structural units (a4-7) include structural units in which a partial structure V of the structural units above is replaced by a partial structure P as described above.

When the resin (A) contains the structural unit derived from the monomer represented by the formula (a4-7), the proportion thereof is generally 5 to 90 mol %, preferably 10 to 80 mol %, and more preferably 20 to 70 mol %, with respect to the total structural units (100 mol %) constituting the resin (A).

When the resin (X) contains the structural unit derived from the monomer represented by the formula (a4-7), the proportion thereof is generally 0 to 90 mol %, preferably 10 to 80 mol %, and more preferably 20 to 70 mol %, with respect to the total structural units (100 mol %) constituting the resin (X).

The acid-stable monomer (a4) may also have a (meth)acrylic monomer having an alicyclic hydrocarbon group such as a monomer represented by the formula (a4-8).

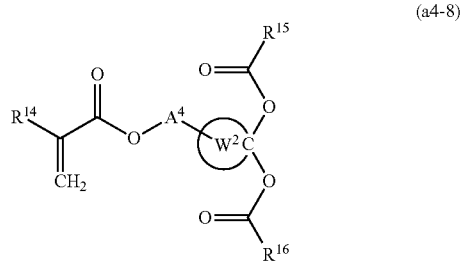
(a4-8)

wherein ring $W^2$ represents a $C_3$ to $C_{36}$ alicyclic hydrocarbon ring;

$A^4$ represents a single bond or an $C_1$ to $C_{17}$ divalent aliphatic hydrocarbon group, and one or more —$CH_2$— contained in the aliphatic hydrocarbon group may be replaced by —O— or —CO—, provided that an atom bonded to —O— is a carbon atom;

$R^{14}$ represents a $C_1$ to $C_6$ alkyl group that optionally has a halogen atom, a hydrogen atom or a halogen atom;

$R^{15}$ and $R^{16}$ independently represent a $C_1$ to $C_6$ alkyl group that optionally has a halogen atom.

The alicyclic hydrocarbon group of ring $W^2$ includes a monocyclic or polycyclic hydrocarbon group, preferably a $C_5$ to $C_{18}$ alicyclic hydrocarbon group, and more preferably a $C_6$ to $C_{12}$ alicyclic hydrocarbon group. Examples thereof include a ring represented by the formula (KA-1) to the formula (KA-22). That is, the group illustrated below

in the formula (a4-8) is a group in which one hydrogen atom bonded to an atom constituting any one of the ring represented by the formula (KA-1) to the formula (KA-22) is replaced by a bond to $A^4$, and other two hydrogen atoms bonded to another atom constituting the ring are replaced respectively with a bond to —O—CO—$R^{15}$ and a bond to —O—CO—$R^{16}$.

Examples of the ring $W^2$ preferably include a cyclohexane ring, an adamantane ring, a norbornene ring and a norbornane ring.

Examples of the divalent aliphatic hydrocarbon group of $A^4$ include a divalent chain alkanediyl group, a divalent alicyclic hydrocarbon group described above and a combination thereof.

Examples of the combination of the alkanediyl group and the alicyclic hydrocarbon group include groups below.

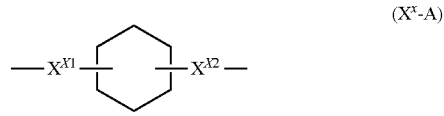
($X^x$-A)

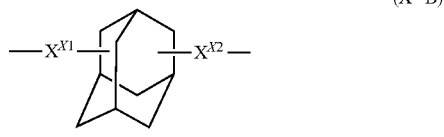
($X^x$-B)

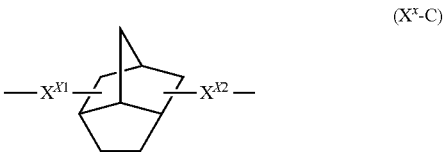
($X^x$-C)

wherein $X^{x1}$ and $X^{x2}$ independently represent a $C_1$ to $C_6$ alkanediyl group or a single bond, provided that both of $X^{x1}$ and $X^{x2}$ are not a single bond, and the total carbon number of the groups represented by the formula ($X^x$-A), the formula ($X^x$-B) and the formula ($X^x$-C) is 17 or less, respectively.

The aliphatic hydrocarbon group of $A^4$ may have a substituent.

Examples of $A^4$ in which one or more —$CH_2$— contained in the aliphatic hydrocarbon group is replaced by —O— or —CO— include, for example, the same example of the group (a-1) in the formula (aa).

$A^4$ is preferably a single bond or a group represented by *—$(CH_2)_{s1}$—CO—O—, s1 represents an integer of 1 to 6, and more preferably a single bond or *—$CH_2$—CO—O—, * represent a bond to —O—.

$R^{14}$ is preferably a hydrogen atom or a methyl group.

The halogen atom of $R^{14}$, $R^{15}$ and $R^{16}$ is preferably fluorine atom.

Examples of the alkyl group having a halogen atom include trifluoromethyl, perfluoroethyl, perfluoropropyl, perfluoro-isopropyl and perfluorobutyl groups. Among these, trifluoromethyl, perfluoroethyl and perfluoropropyl are preferable.

Examples of the acid-stable monomer (a4-8) include acid-stable monomers below. $R^{14}$ to $R^{16}$ and $A^4$ are the same meaning defined above.

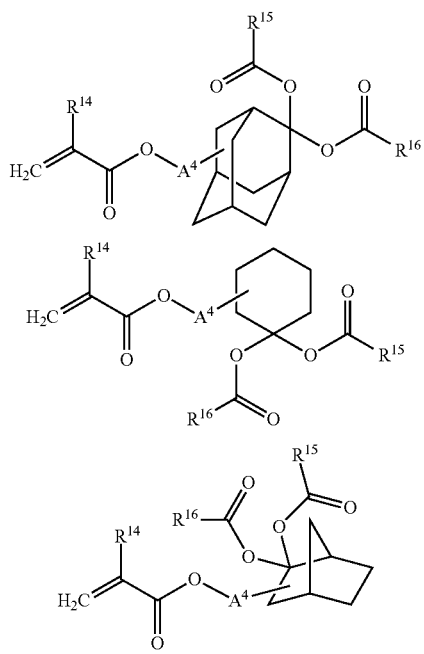

Among these, acid-stable monomers (a4-8) represented by the formula below are preferable.

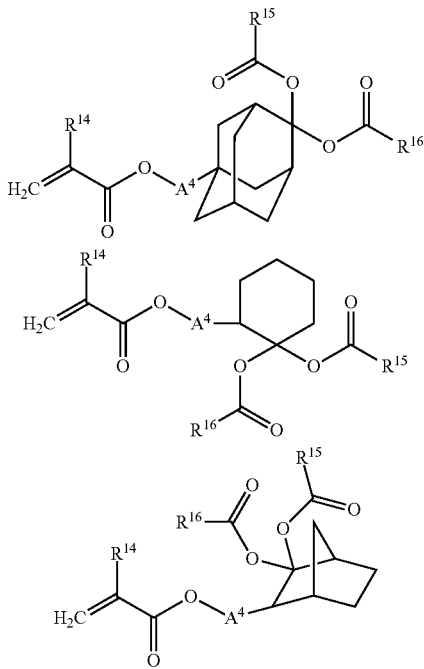

Specific examples of the acid-stable monomer (a4-8) include acid-stable monomer below.

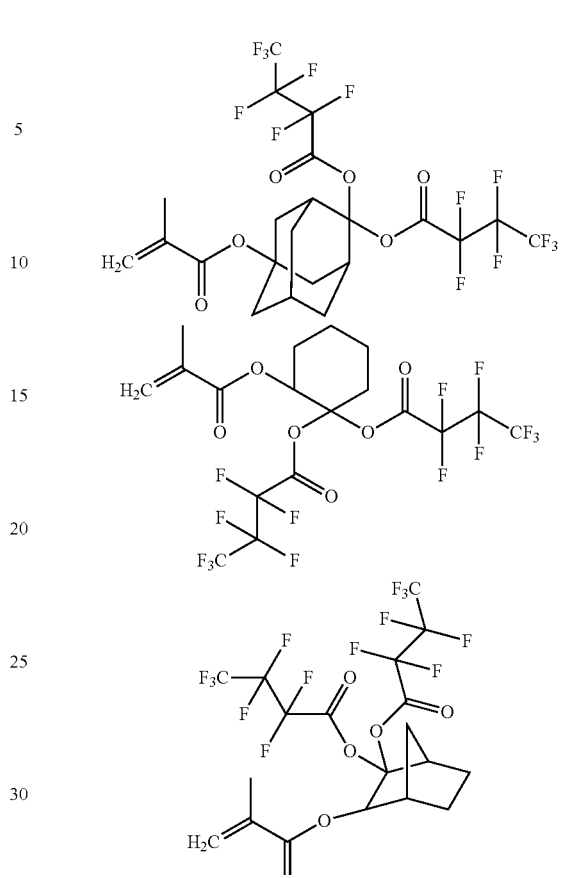

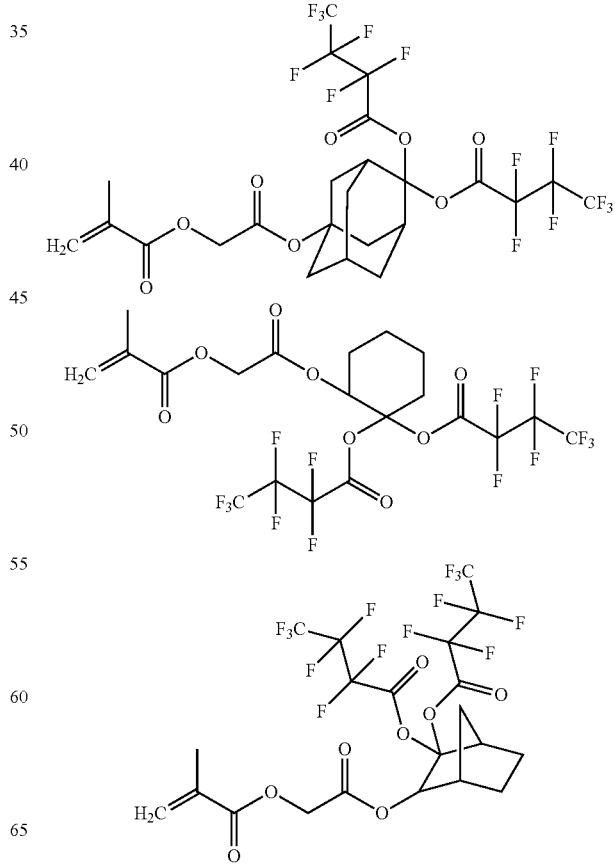

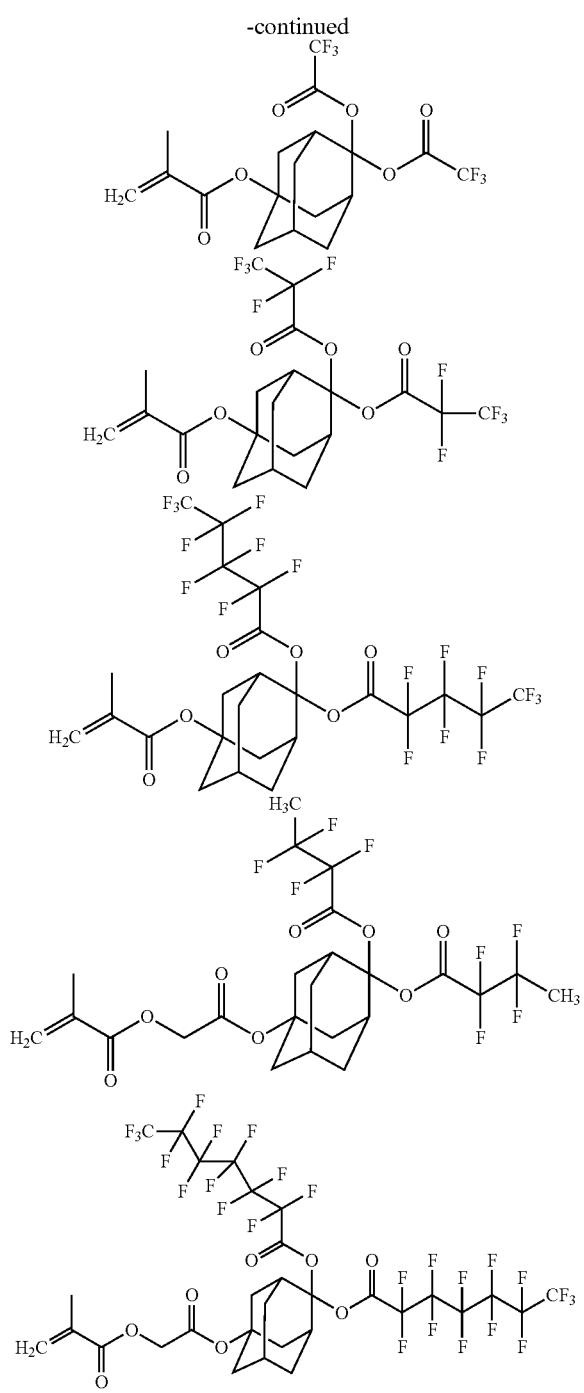

Further, examples of the structural units (a4-8) include structural units in which a partial structure V of the structural units above is replaced by a partial structure P as described below.

Preferable acid-stable monomer (a4-8) can be produced by reacting a compound represented by the formula (a4-8-a) and a compound represented by the formula (a4-8-b).

Typical compound represented by the formula (a4-8-a) is 1-methacryloyloxy-4-oxoadamantane described in JP2002-226436-A.

Examples of the compound represented by the formula (a4-8-b) include pentafluoropropionic anhydride, heptafluoro butyric anhydride and trifluoro butyric anhydride.

The reaction is preferably carried out at around a boiling point of the compound represented by the formula (a4-8-b) to be used.

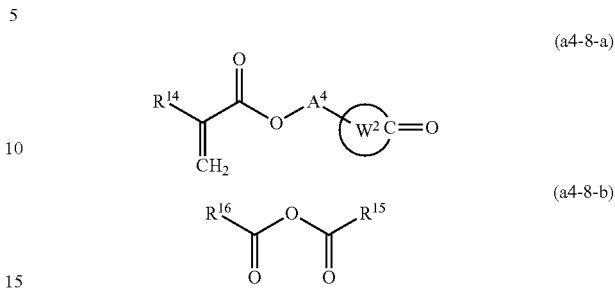

wherein $R^{14}$, $R^{15}$, $R^{16}$, $A^4$ and $W^2$ have the same meaning as defined above.

When the resin (A) contains the structural unit derived from the monomer represented by the formula (a4-8), the proportion thereof is generally 5 to 90 mol %, preferably 10 to 80 mol %, and more preferably 20 to 70 mol %, with respect to the total structural units (100 mol %) constituting the resin (A).

When the resin (X) contains the structural unit derived from the monomer represented by the formula (a4-8), the proportion thereof is generally 0 to 90 mol %, preferably 10 to 80 mol %, and more preferably 20 to 70 mol %, with respect to the total structural units (100 mo %) constituting the resin (X).

<Production of the Resin>

The resin (X) may be a copolymer obtained by polymerizing the compound (aa'), the compound (ab') and the other monomer (e.g., the acid-stable monomer) as needed, in particular, a copolymer obtained by polymerizing the compound (aa'), the compound (ab') and the acid-stable monomer (a4). The acid-stable monomer (a4) is preferably the acid-stable monomer (a4-6) and/or the acid-stable monomer (a4-7), and more preferably the acid-stable monomer (a4-6).

When the resin (X) contains the structural unit (a1), the ratio of [the acid-labile structural unit (a1)]:[the acid-stable structural unit] is preferably 10 to 80 mol %:90 to 20 mol %, and more preferably 20 to 60 mol %:80 to 40 mol %. When the amount of the acid-stable structural unit is calculated, the structural unit (aa) and the structural unit (ab) are preferably included in the acid-stable structural unit.

The resin (A) preferably is a (co)polymer having the acid-labile structural unit (a1) (in particular, at least one of the acid-labile structural unit (a1-1) and the acid-labile structural unit (a1-2), and preferably the acid-labile structural unit (a1-1)), more preferably a copolymer having the acid-labile structural unit (a1) and the acid-stable structural unit, and still more preferably a copolymer having the acid-labile structural unit (a1-1) and/or the acid-labile structural unit (a1-2) and the acid-stable structural unit. The acid-stable structural unit is preferably the structural unit (a2) (more preferably the structural unit having the hydroxyadamantyl group (a2-1)) and the structural unit (a3). The structural unit (a3) is preferably the structural unit having at least one of the γ-butyrolactone ring (a3-1), and the structural unit having the condensed ring of the γ-butyrolactone ring and the norbornene ring (a3-2).

When the resin (A) is produced with a monomer providing the acid-stable structural unit, the proportion of the acid-stable structural unit to be used can be adjusted based on the amount of the monomer providing the acid-labile structural unit (a1). For example, the ratio of [the acid-labile structural unit (a1)]:[the acid-stable structural unit] is preferably 10 to 80 mol %:90 to 20 mol %, and more preferably 20 to 60 mol %:80 to 40 mol %.

When the monomer having an adamantyl group is used as the monomer (a1), the proportion of the monomer having an adamantyl group (in particular, the monomer having the acid-labile group (a1-1)) is preferably 15 mol % or more with respect to the monomer having the acid-labile group (a1). As the mole ratio of the monomer having an adamantyl group increases within this range, the dry etching resistance of the resulting resist improves.

The combination of the resin (X) and the resin (A) is preferably used in the present resist composition, and the combination of the resin (X) not having the acid-labile group (a1) and the resin (A) is more preferable.

When the present resist composition contains the resin (X) and the resin (A), the weight ratio of the resin (X) and the resin (A) can be adjusted so as to produce a resist pattern by the present resist composition through the interaction of the resin and the acid generator (described below). When the resin (X) contains the acid-labile group (a1), the weight ratio of the resins (X):(A) is preferably, for example, 0.1 to 100:10, and more preferably 1 to 50:10. When the resin (X) does not contain the acid-labile group (a1), the weight ratio of the resins (X):(A) is preferably, for example, 0.01 to 2:10, and more preferably 0.1 to 1:10.

The resin (X) and the resin (A) can be produced by a known polymerization method, for example, radical polymerization method, using the monomers. The monomer may be used as a single compound or as a mixture of two or more compounds.

The weight average molecular weight of the resin (X) is preferably 5,000 or more (more preferably 8,000 or more and still more preferably 10,000 or more), and 80,000 or less (more preferably 60,000 or less and still more preferably 50,000 or less).

The weight average molecular weight of the resin (A) is preferably 2500 or more (more preferably 3000 or more, and still more preferably 3500 or more), and 50,000 or less (more preferably 30,000 or less, and still more preferably 10,000 or less).

The weight average molecular weight is a value determined by gel permeation chromatography using polystyrene as the standard product. The detailed condition of this analysis is described in Examples.

<Acid Generator (B)>

An acid generator (B) is classified into non-ionic-based or ionic-based acid generator. The present resist composition may be used either acid generators.

Examples of the non-ionic-based acid generator include organic halogenated compounds; sulfonate esters such as 2-nitrobenzyl ester, aromatic sulfonate, oxime sulfonate, N-sulfonyl oxyimide, sulfonyl oxyketone and diazo naphthoquinone 4-sulfonate; sulfones such as disulfone, ketosulfone and sulfone diazomethane.

Examples of the ionic acid generator includes onium salts containing onium cation (such as diazonium salts, phosphonium salts, sulfonium salts, iodonium salts).

Examples of anion of onium salts include sulfonate anion, sulfonylimide anion and sulfonylmethyde anion.

For the acid generator (B), compounds which generate an acid by radiation described in JP S63-26653-A, JP S55-164824-A, JP S62-69263-A, JP S63-146038-A, JP S63-163452-A, JP S62-153853-A, JP S63-146029-A, U.S. Pat. Nos. 3,779,778-B, 3,849,137-B, DE3,914,407-B and EP-126,712-A can be used.

Also, the acid generator (B) can be formed according to conventional methods.

The acid generator (B) is preferably a fluorine-containing acid generator represented by the formula (B1) as described below. In the acid generator (B1), electropositive Z+ hereinafter may be referred to as "an organic cation", and electronegative one in which the organic cation has been removed from the compound may be referred to as "sulfonate anion".

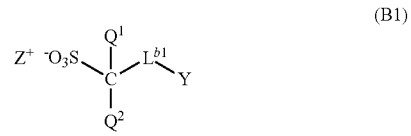

(B1)

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and one or more —$CH_2$— contained in the aliphatic hydrocarbon group may be replaced by —O— or —CO—;

Y represents an optionally substituted $C_1$ to $C_{18}$ aliphatic hydrocarbon group, and one or more —$CH_2$— contained in the aliphatic hydrocarbon group may be replaced by —O—, —CO— or —$SO_2$—; and Z+ represents an organic cation.

Examples of the perfluoroalkyl group of $Q^1$ and $Q^2$ include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

Among these, $Q^1$ and $Q^2$ are independently preferably trifluoromethyl or fluorine atom, and more preferably both a fluorine atom.

Examples of the a divalent aliphatic hydrocarbon group of $L^{b1}$ include;

a linear chain alkanediyl group such as methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups, methylidene, ethylidene, propylidene and 2-propyliden groups;

a branched chain alkanediyl group such as a group in which a linear chain alkanediyl group is bonded a side chain of a $C_1$ to $C_4$ alkyl group such as methyl, ethyl, propyl, isopropyl, butyl, sec-butyl and tert-butyl, for example, butan-1,3-diyl, 2-methylpropane-1,3-diyl, 2-methylpropane-1,2-diyl, pentane-1,4-diyl, 2-methylbutane-1,4-diyl groups;

a mono-alicyclic hydrocarbon group such as cyclobutan-1,3-diyl, cyclopentan-1,3-diyl, cyclohexane-1,2-diyl, 1-methylhexane-1,2-diyl, cyclohexane-1,4-diyl, cyclooctan-1,2-diyl, cyclooctan-1,5-diyl groups;

a poly-alicyclic hydrocarbon group such as norbornane-1,4-diyl, norbornane-2,5-diyl, adamantane-1,5-diyl and adamantane-2,6-diyl groups; and a combination of two or more groups.

Examples of the aliphatic hydrocarbon group of $L^{b1}$ in which one or more —$CH_2$— contained in the aliphatic hydrocarbon group is replaced by —O— or —CO— include groups represented by the formula (b1-1) to the formula (b1-6) below.

In the formula (b1-1) to the formula (b1-6), the group is represented so as to correspond with two sides of the formula (B1), that is, the left side of the group bonds to $C(Q^1)(Q^2)$- and the right side of the group bonds to —Y (examples of the formula (b1-1) to the formula (b1-6) are the same as above). * represents a bond.

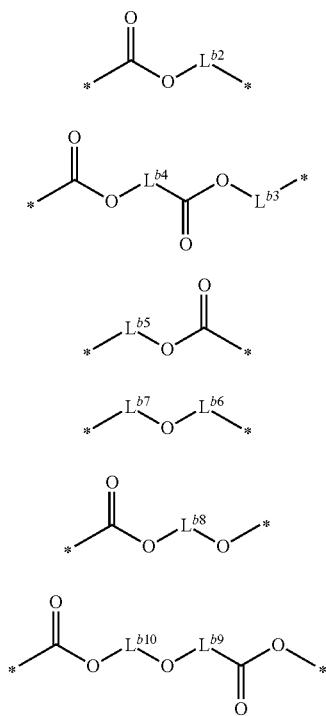

(b1-1)

(b1-2)

(b1-3)

(b1-4)

(b1-5)

(b1-6)

wherein $L^{b2}$ represents a single bond or a $C_1$ to $C_{15}$ divalent aliphatic hydrocarbon group, the aliphatic hydrocarbon group is preferably a saturated aliphatic hydrocarbon group;

$L^{b3}$ represents a single bond or a $C_1$ to $C_{12}$ divalent aliphatic hydrocarbon group, the aliphatic hydrocarbon group is preferably a saturated aliphatic hydrocarbon group;

$L^{b4}$ represents a $C_1$ to $C_{13}$ divalent aliphatic hydrocarbon group, the aliphatic hydrocarbon group is preferably a saturated aliphatic hydrocarbon group, the total number of the carbon atoms in $L^{b3}$ and $L^{b4}$ is at most 13;

$L^{b5}$ represents a $C_1$ to $C_{15}$ divalent saturated hydrocarbon group, the aliphatic hydrocarbon group is preferably a saturated aliphatic hydrocarbon group;

$L^{b6}$ and $L^{b7}$ independently represent a $C_1$ to $C_{15}$ divalent aliphatic hydrocarbon group, the aliphatic hydrocarbon group is preferably a saturated aliphatic hydrocarbon group, the total number of the carbon atoms in $L^{b6}$ and $L^{b7}$ is at most 16;

$L^{b8}$ represents a $C_1$ to $C_{14}$ divalent aliphatic hydrocarbon group, the aliphatic hydrocarbon group is preferably a saturated aliphatic hydrocarbon group;

$L^{b9}$ and $L^{b10}$ independently represent a $C_1$ to $C_{11}$ divalent aliphatic hydrocarbon group, the aliphatic hydrocarbon group is preferably a saturated aliphatic hydrocarbon group, the total number of the carbon atoms in $L^{b9}$ and $L^{b10}$ is at most 12.

Among these, the groups represented by the formula (b1-1) to the formula (b1-4) are preferable, the group represented by the formula (b1-1) to the formula (b1-3) is still more preferable, and the group represented by the formula (b1-1) or the formula (b1-2) is further more preferable. In particular, the divalent group represented by the formula (b1-1) is more preferable, and the divalent group represented by the formula (b1-1) in which $L^{b2}$ represents a single bond or —$CH_2$— is more preferable.

Specific examples of the divalent group represented by the formula (b1-1) include groups below. In the formula below, * represent a bond.

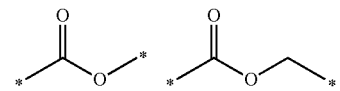

Specific examples of the divalent group represented by the formula (b1-2) include groups below.

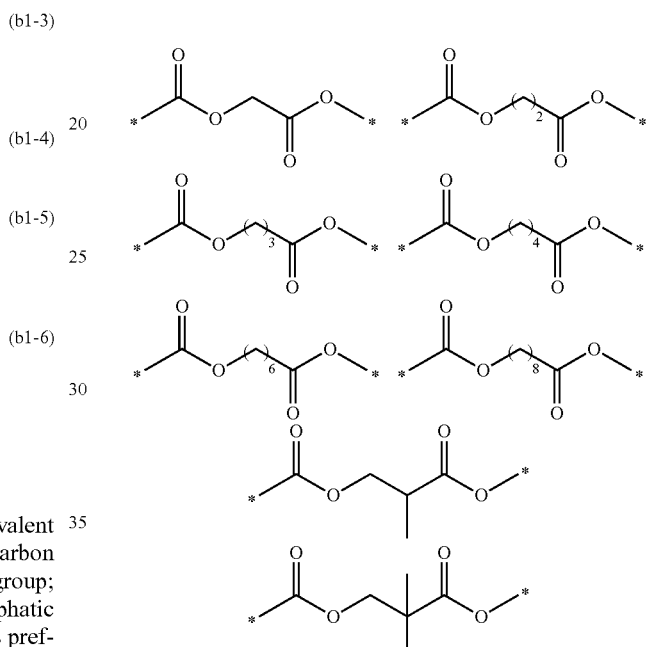

Specific examples of the divalent group represented by the formula (b1-3) include groups below.

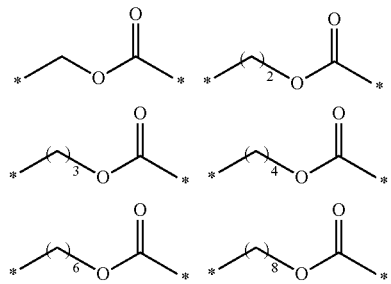

Specific examples of the divalent group represented by the formula (b1-4) include a group below.

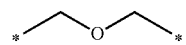

Specific examples of the divalent group represented by the formula (b1-5) include groups below.

Specific examples of the divalent group represented by the formula (b1-6) include groups below.

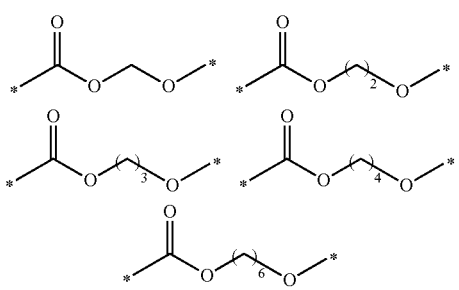

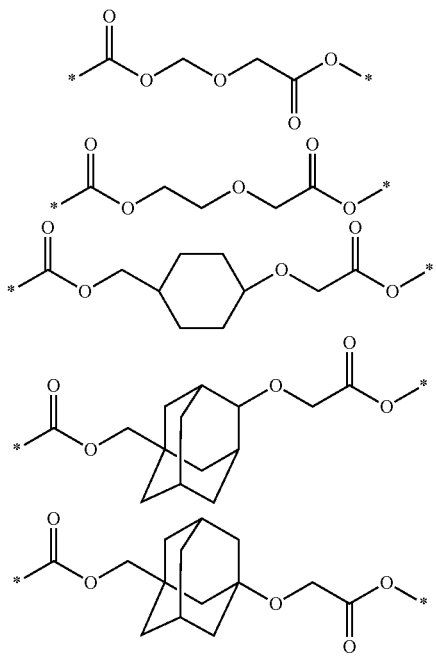

Examples of the substituent of the aliphatic hydrocarbon group of $L^{a1}$ include a halogen atom, a hydroxy group, a carboxy group, a $C_6$ to $C_{18}$ aromatic hydrocarbon group, a $C_7$ to $C_{21}$ aralkyl group, a $C_2$ to $C_4$ acyl group and a glycidyloxy group.

The aliphatic hydrocarbon group of Y is preferably an alkyl group and alicyclic hydrocarbon group or a combination group thereof, more preferably a $C_1$ to $C_6$ alkyl group and a $C_3$ to $C_{12}$ alicyclic hydrocarbon group, and still more preferably a $C_3$ to $C_{12}$ alicyclic hydrocarbon group.

Examples of the alkyl group include methyl, ethyl, 1-methylethyl, 1,1-dimethylethyl, 2,2-dimethylethyl, propyl, 1-methylpropyl, 2,2-dimethylpropyl, 1-ethylpropyl, butyl, 1-methylbutyl, 2-methylbutyl, 3-methylbutyl, 1 propylbuty, pentyl, 1-methypentyl, hexyl,1,4-dimethylhexyl, heptyl, 1-methylheptyl, octyl, methyloctyl, methylnonyl, 2-ethylhexyl, nonyl, decyl, undecyl and dodecyl groups. The aliphatic hydrocarbon group may be any of a liner and a branched chain alkyl groups.

Examples of the alicyclic hydrocarbon group include groups represented by the formula (KA-1) to the formula (KA-22) as described above from which two hydrogen atoms is removed.

Examples of Y in which one or more —$CH_2$— contained in the aliphatic hydrocarbon group is replaced by —O—, —CO— or $SO_2$— include, for example, an alkyl group in which one or more —$CH_2$— is replaced by one or more —O— or —CO—, a cyclic ether group (a group replaced one or two —$CH_2$— by one or two —O—), a cyclic ketone group (a group replaced one or two —$CH_2$— by one or two —CO—), a sultone ring group (a group replaced adjacent two —$CH_2$— by —O— and —$SO_2$—, respectively), or a lactone ring group (a group replaced adjacent two —$CH_2$— by —O— and —CO—, respectively).

Specific examples of the alicyclic group of Y include groups represented by the formula (Y-1) to the formula (Y-5) below, are preferably groups represented by the formula (Y-1), the formula (Y-2), the formula (Y-3) and the formula (Y-5), and are more preferably groups represented by the formula (Y-1) and the formula (Y-2).

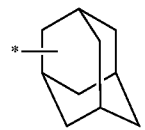
(Y1)

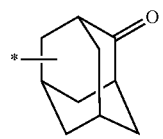
(Y2)

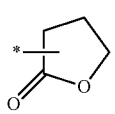
(Y3)

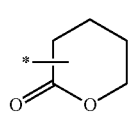
(Y4)

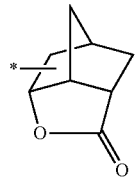
(Y5)

Examples of the substituent of Y include a halogen atom (other than a fluorine atom), a hydroxy group, a $C_1$ to $C_{12}$ alkoxy group, a $C_6$ to $C_{18}$ aromatic hydrocarbon group, a $C_7$ to $C_{21}$ aralkyl group, a $C_2$ to $C_4$ acyl group, a glycidyloxy group or a —$(CH_2)_{j2}$—O—CO—$R^{b1}$ group, wherein $R^{b1}$ represents a $C_1$ to $C_{16}$ hydrocarbon group, j2 represents an integer of 0 to 4. The aromatic hydrocarbon group and the aralkyl group may further have a substituent such as a $C_1$ to $C_6$ alkyl group, a halogen atom or a hydroxy group.

Examples of the halogen atom include chlorine, bromine and iodine atoms.

Examples of the alkoxyl group include methoxy, ethoxy, n-propoxy, isopropoxy, n-butoxy, sec-butoxy, tert-butoxy, n-pentyloxy and n-hexyloxy groups.

Examples of the aromatic hydrocarbon group include phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Examples of the aralkyl group include benzyl, phenethyl, phenylpropyl, trityl, naphthylmethyl and naphthylethyl groups.

Examples of the acyl group include acetyl, propionyl and butyryl groups.

Examples of Y include the groups below.

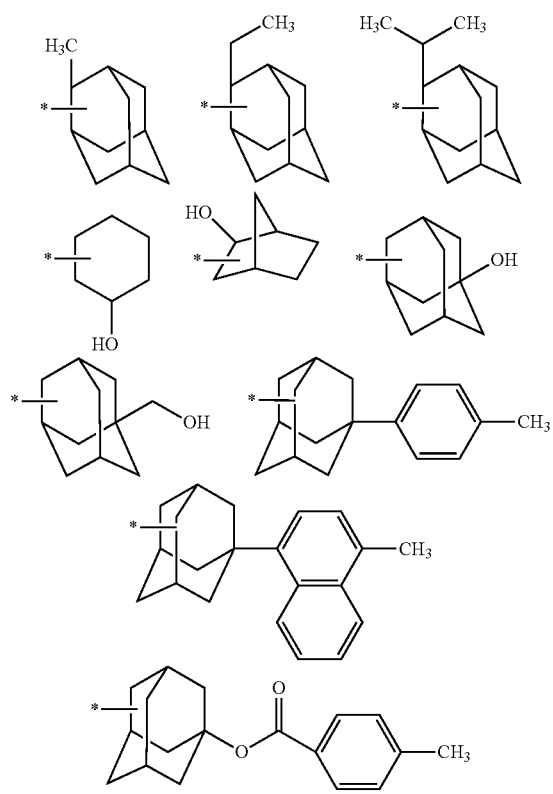

Y is preferably an optionally substituted $C_3$ to $C_{18}$ alicyclic hydrocarbon group, more preferably an adamantyl group which is optionally substituted, and more preferably an adamantyl group, an oxoadamantyl group or a hydroxyadamantyl group.

The sulfonate anion is preferably an anion represented by the formula (b1-1-1) to the formula (b1-1-9) below in which $L^{b1}$ is a group represented by the formula (b1-1).

In the formula (b1-1-1) to the formula (b1-1-9), $Q^1$, $Q^2$ and $L^{b2}$ represent the same meaning as defined above (preferably both fluorine atom for $Q^1$ and $Q^2$). $R^{b2}$ and $R^{b3}$ independently represent a group which is the same group described in the substituent of Y, is preferably a $C_1$ to $C_4$ aliphatic hydrocarbon group or a hydroxy group, and more preferably methyl group or a hydroxy group.

(b1-1-1)

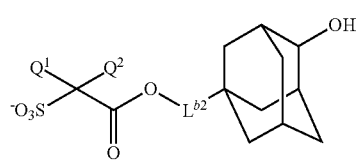

(b1-1-2)

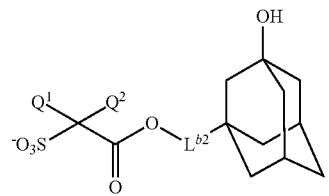

(b1-1-3)

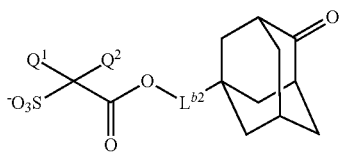

(b1-1-4)

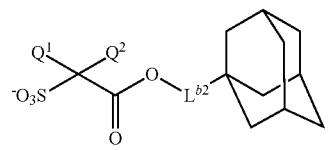

(b1-1-5)

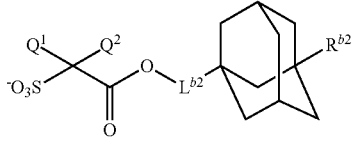

(b1-1-6)

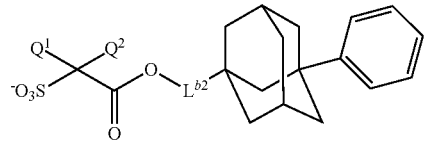

(b1-1-7)

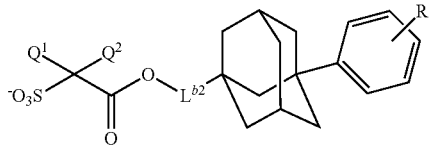

(b1-1-8)

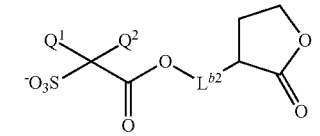

(b1-1-9)

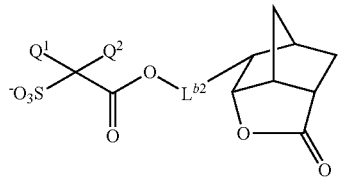

Examples of the sulfonate anion include sulfonate anions described in JP2010-204646A.

The sulfonate anion is more preferably an anion in which $L^{b1}$ is a group represented by the formula (b1-1) and Y is an alicyclic hydrocarbon group represented by the formula (Y-1) or the formula (Y-2).

Examples of the sulfonate anion in which Y is a non-substituted alicyclic hydrocarbon group include anions represented by the formula (b1-s-0) to the formula (b1-s-9).

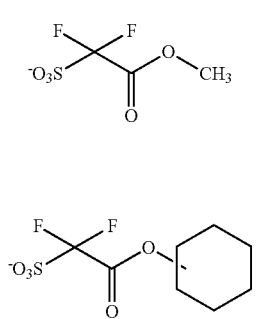 (b1-s-0)
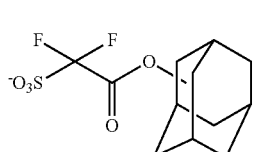 (b1-s-1)
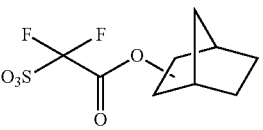 (b1-s-2)
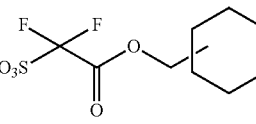 (b1-s-3)
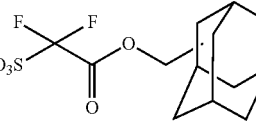 (b1-s-4)
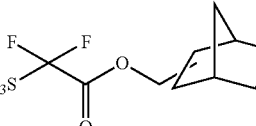 (b1-s-5)
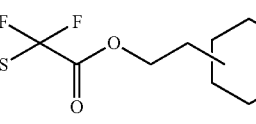 (b1-s-6)
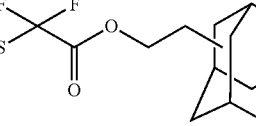 (b1-s-7)
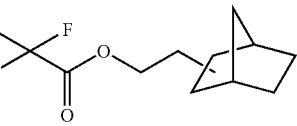 (b1-s-8)
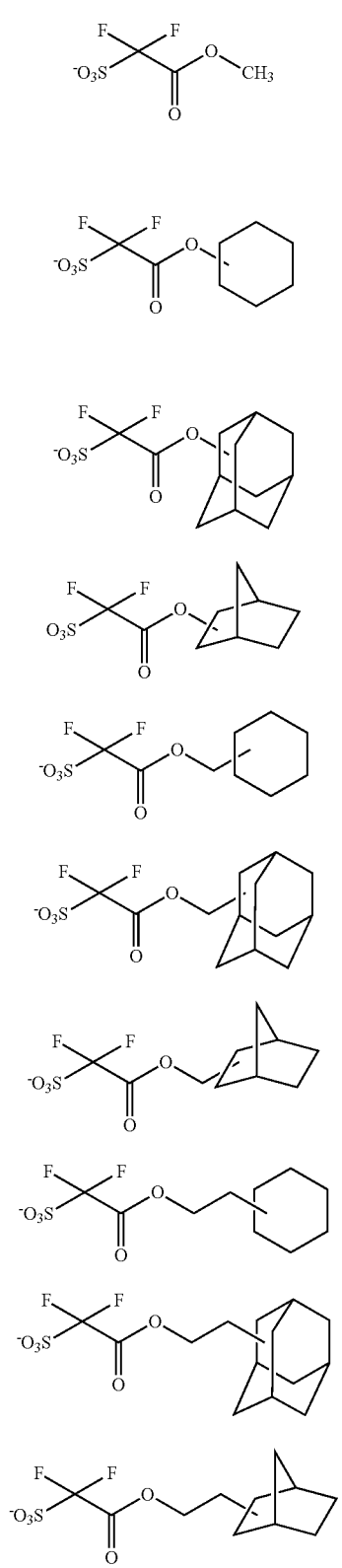 (b1-s-9)
Examples of the sulfonate anion in which Y is an alicyclic hydrocarbon group having a hydroxy group include anions represented by the formula (b1-s-10) to the formula (b1-s-18).
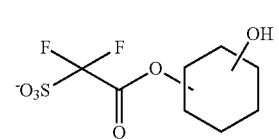 (b1-s-10)
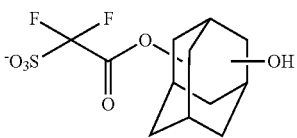 (b1-s-11)
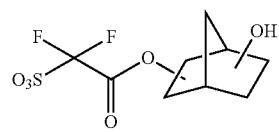 (b1-s-12)
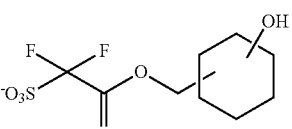 (b1-s-13)
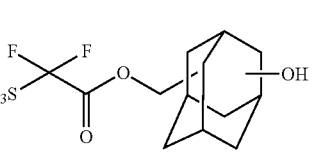 (b1-s-14)
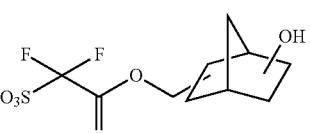 (b1-s-15)
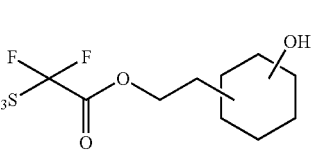 (b1-s-16)
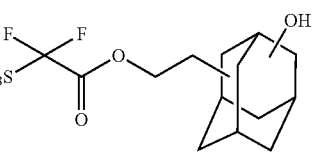 (b1-s-17)
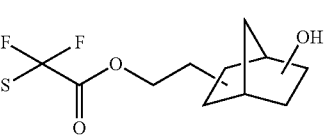 (b1-s-18)
Examples of the sulfonate anion in which Y is a cyclic ketone group include anions represented by the formula (b1-s-19) to the formula (b1-s-29).
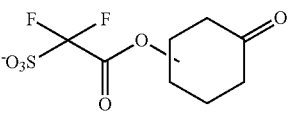 (b1-s-19)

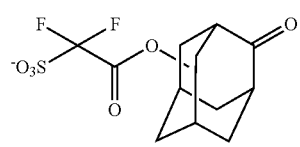
(b1-s-20)
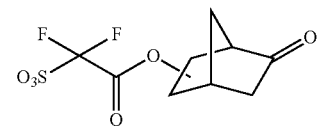
(b1-s-21)
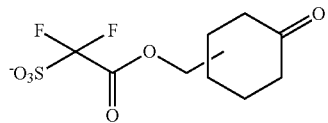
(b1-s-22)
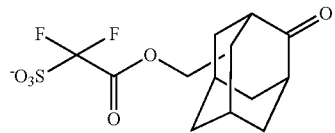
(b1-s-23)
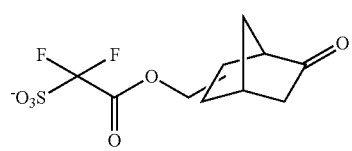
(b1-s-24)
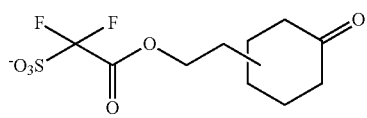
(b1-s-25)
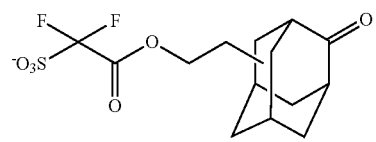
(b1-s-26)
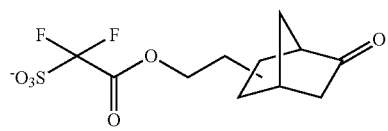
(b1-s-27)
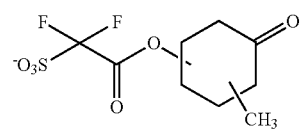
(b1-s-28)
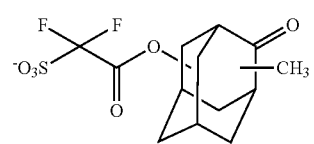
(b1-s-29)
Examples of the sulfonate anion in which Y is an aromatic hydrocarbon group include anions represented by the formula (b1-s-30) to the formula (b1-s-35).
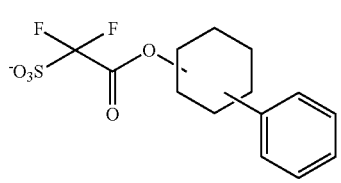
(b1-s-30)
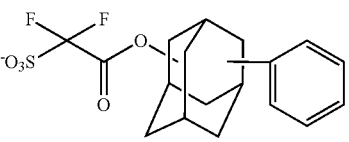
(b1-s-31)
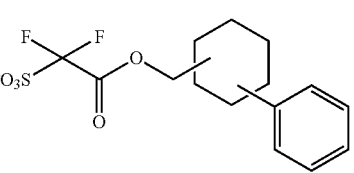
(b1-s-32)
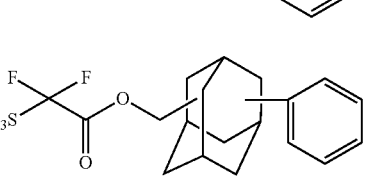
(b1-s-33)
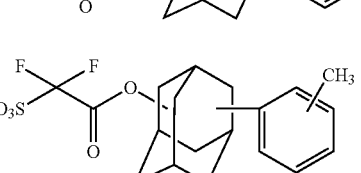
(b1-s-34)
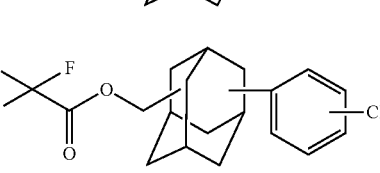
(b1-s-35)
Examples of the sulfonate anion in which Y is a lactone ring or sulfonate ring group include anions represented by the formula (b1-s-36) to the formula (b1-s-41).
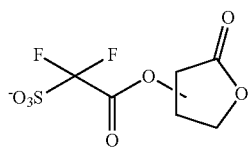
(b1-s-36)
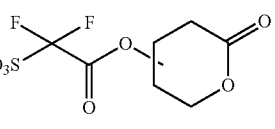
(b1-s-37)
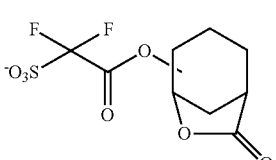
(b1-s-38)

-continued (b1-s-39)

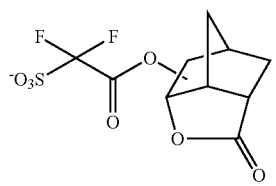

(b1-s-40)

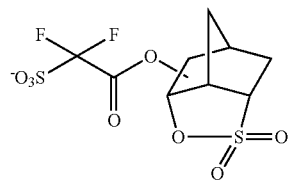

(b1-s-41)

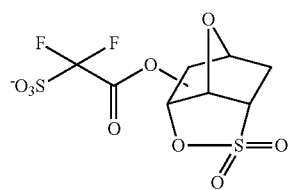

Examples of the cation of the acid generator (B) include an organic onium cation, for example, an organic sulfonium cation, an organic iodonium cation, an organic ammonium cation, an organic benzothiazolium cation and an organic phosphonium cation. Among these, an organic sulfonium cation and an organic iodonium cation are preferable, and organic sulfonium cations represented by any of the formula (b2-1), the formula (b2-3) and the formula (b2-4) are more preferable. The organic iodonium cation is represented by the formula (b2-2).

Z+ of the formula (B1) is preferably represented by any of the formula (b2-1) to the formula (b2-4).

(b2-1)

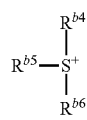

(b2-2)

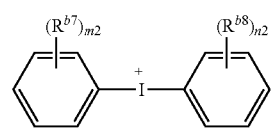

(b2-3)

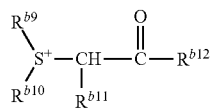

-continued (b2-4)

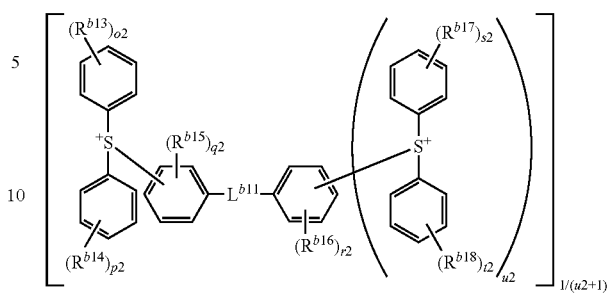

wherein $R^{b4}$, $R^{b5}$ and $R^{b6}$ independently represent a $C_1$ to $C_{30}$ hydrocarbon group which preferably includes a $C_1$ to $C_{30}$ alkyl group, a $C_3$ to $C_{18}$ alicyclic hydrocarbon group or a $C_6$ to $C_{18}$ aromatic hydrocarbon group, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group, or $R^{b9}$ and $R^{b10}$ may be bonded together with a sulfur atom bonded thereto to form a sulfur-containing 3- to 12-membered (preferably 3- to 7-membered) ring, and one or more —CH$_2$— contained in the ring may be replaced by —O—, —S— or —CO—;

$R^{b11}$ represents a hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{b12}$ represents a $C_1$ to $C_{18}$ hydrocarbon group which preferably includes a $C_1$ to $C_{18}$ alkyl group, a $C_3$ to $C_{18}$ alicyclic hydrocarbon group and a $C_6$ to $C_{18}$ aromatic hydrocarbon group, the aromatic hydrocarbon group may be substituted with a $C_1$ to Cu alkyl group, a $C_1$ to Cu alkoxy group, a $C_3$ to $C_{18}$ alicyclic hydrocarbon group or a $C_1$ to Cu alkyl carbonyloxy group;

$R^{b11}$ and $R^{b12}$ may be bonded together with —CH—CO— bonded thereto to form a 3- to 12-membered (preferably a 3- to 7-membered) ring, and one or more —CH$_2$— contained in the ring may be replaced by —O—, —S— or —CO—;

$R^{b13}$, $R^{b14}$, $R^{b15}$, $R^{b16}$, $R^{b17}$ and $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the alkyl group include methyl, ethyl, n-propyl, isopropyl, n-butyl, sec-butyl, tert-butyl, pentyl, hexyl, octyl and 2-ethylhexyl groups.

Examples of the alicyclic hydrocarbon group include a monocyclic hydrocarbon groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo [2.2.1]hexyl) and methyl norbornyl groups as well as groups as below.

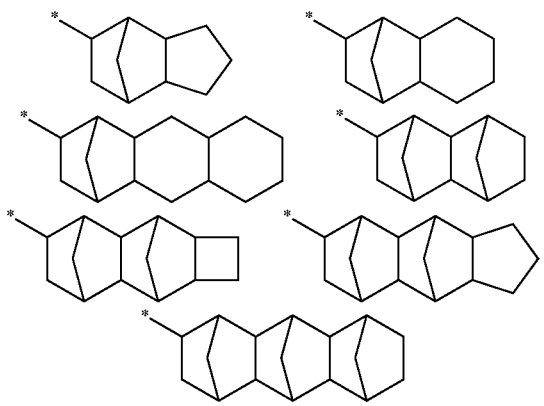

Examples of the aromatic hydrocarbon group include phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Examples of the alkoxyl group include methoxy, ethoxy, propoxy, butoxy, pentyloxy, hexyloxy, heptyloxy, octyloxy, decyloxy and dodecyloxy groups.

Examples of the halogen atom include fluorine, chlorine, bromine and iodine atoms.

Examples of the acyl group include acetyl, propionyl and butyryl groups.

Examples of the alkylcarbonyloxy group of the $R^{b12}$ include methylcarbonyloxy, ethylcarbonyloxy, n-propylcarbonyloxy, isopropylcarbonyloxy, n-butylcarbonyloxy, sec-butylcarbonyloxy, tert-butylcarbonyloxy, pentylcarbonyloxy, hexylcarbonyloxy, octylcarbonyloxy, and 2-ethylhexylcarbonyloxy groups.

Preferred examples of the alkyl group include methyl, ethyl, propyl, butyl, hexyl, octyl, and 2-ethylhexyl groups, in particular, the alkyl group of $R^{b9}$ to $R^{b11}$ is preferably a $C_1$ to $C_{12}$ alkyl group.

Preferred examples of the alicyclic hydrocarbon group include a cyclopropyl, cyclobutyl, cyclopentyl, cyclohexyl, cycloheptyl, cyclodecyl, 2-alkyladamantane-2-yl, 1-(adamantane-1-yl)alkane-1-yl and isobornyl groups, in particular, the alicyclic hydrocarbon group of $R^{b9}$ to $R^{b11}$ is preferably a $C_3$ to $C_{18}$ alicyclic hydrocarbon group, and more preferably a $C_4$ to $C_{12}$ alicyclic hydrocarbon group.

Preferred examples of the aromatic hydrocarbon groups include phenyl, 4-methylphenyl, 4-etyhlphenyl, 4-tert-butylphenyl, 4-cyclohexylphenyl, 4-methoxyphenyl, biphenyl and naphthyl groups.

Examples of the aromatic group substituted with an alkyl group typically represent an aralkyl group such as benzyl, phenethyl, phenylpropyl, trityl, naphthylmethyl and naphthylethyl groups.

Examples of the ring having —CH—CO— and formed by $R^{b9}$ and $R^{b10}$ bonded together include thiolane-1-ium ring (tetrahydrothiophenium ring), thian-1-ium ring and 1,4-oxathian-4-ium ring.

Examples of the ring having a sulfur atom and formed by $R^{b11}$ and $R^{b12}$ bonded together include oxocycloheptane ring, oxocyclohexane ring, oxonorbornane ring and oxoadamantane ring.

Specific examples of the organic cations represented by the formula (b2-1) to the formula (b2-4) include, for example, compounds described in JP2010-204646-A.

Among the cations represented by the formula (b2-1) to the formula (b2-4), the cation represented by the formula (b2-1) is preferable, and triphenyl sulfonium cation (v2=w2=x2=0 in the formula (b2-1-1)) or tritolyl sulfonium cation (v2=w2=x2=1, and $R^{b19}$, $R^{b20}$ and $R^{b21}$ are a methyl group in the formula (b2-1-1)) are more preferable.

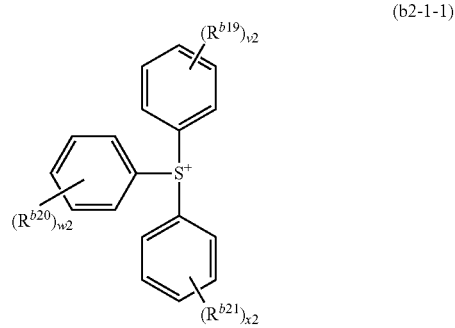

(b2-1-1)

wherein $R^{b19}$, $R^{b20}$ and $R^{b21}$ in each occurrence independently represent a halogen atom, a hydroxy group, a $C_1$ to $C_{18}$ aliphatic hydrocarbon group or a $C_1$ to $C_{12}$ alkoxy group;

v2 to x2 independently represent an integer of 0 to 5.

The aliphatic hydrocarbon group is preferably a $C_1$ to $C_{12}$ aliphatic hydrocarbon group, and more preferably a $C_1$ to $C_{12}$ alkyl group or a $C_4$ to $C_{18}$ alicyclic hydrocarbon group.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group; and v2 to $X^2$ independently represent preferably 0 or 1.

Specific examples of the cation of the formula (b2-1-1) include a cation below.

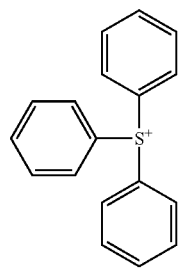

(b2-c-1)

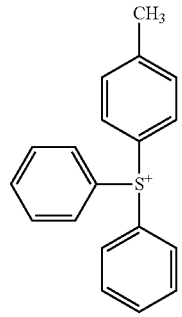

(b2-c-2)

(b2-c-3)
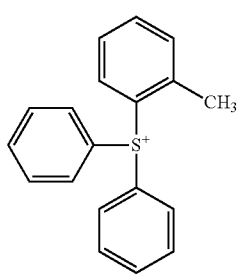
(b2-c-4)
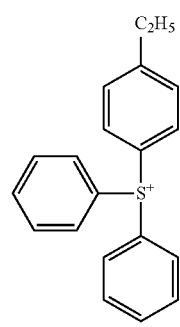
(b2-c-5)
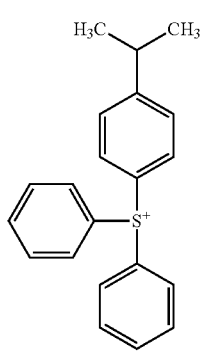
(b2-c-6)
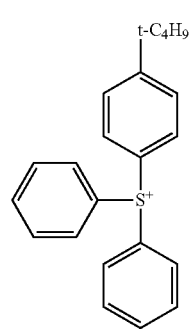
(b2-c-7)
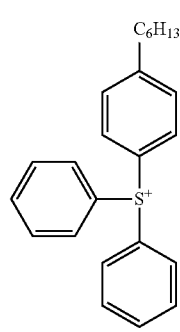
(b2-c-8)
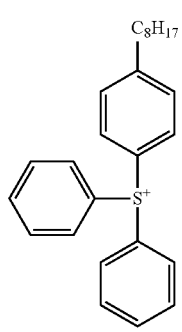
(b2-c-9)
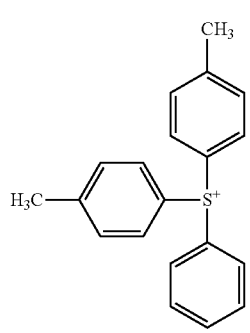
(b2-c-10)
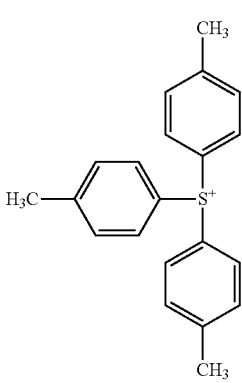
(b2-c-11)
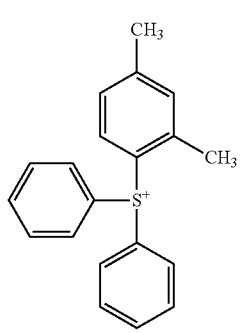
(b2-c-12)
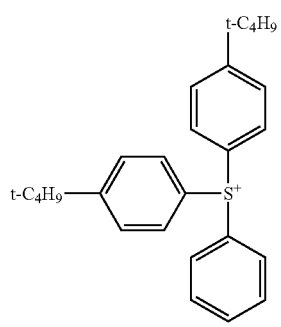

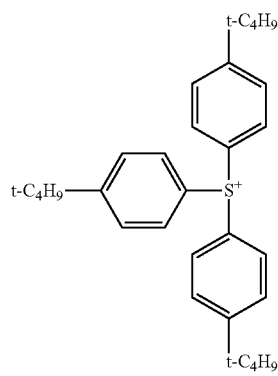 (b2-c-13)
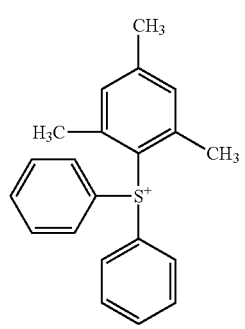 (b2-c-14)
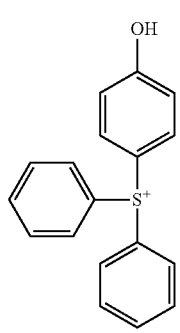 (b2-c-15)
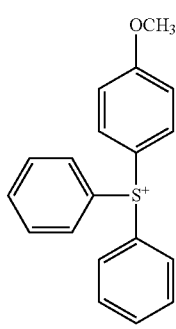 (b2-c-16)
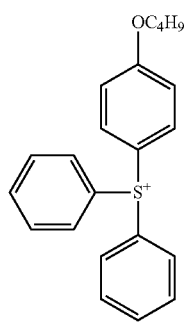 (b2-c-17)
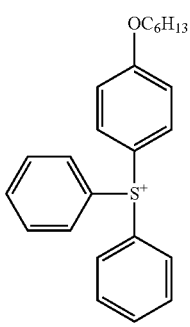 (b2-c-18)
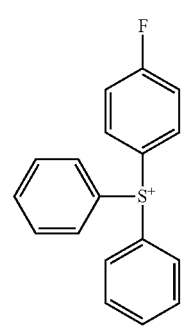 (b2-c-18)
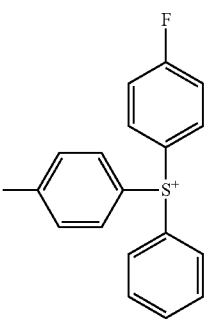 (b2-c-19)

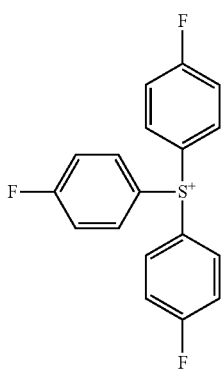
(b2-c-20)

Specific examples of the cation of the formula (b2-3) include a cation below.

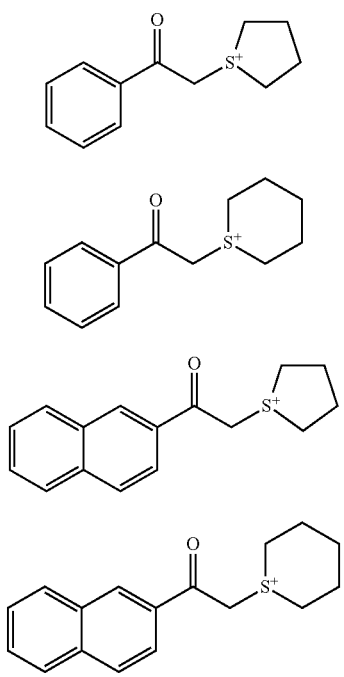

The acid generator (B1) is a compound in combination of the above sulfonate anion and an organic cation.

The above sulfonate anion and the organic cation may optionally be combined, for example, as described in the Table 2 below. The sulfonate anion represented by the formula (b1-s-2) is expressed "(b1-s-2)", and the organic cation represented by the formula (b2-c-1) is expressed "(b2-c-1)" in the table, for example.

TABLE 2

| Acid generator (B1) | Sulfonate Anion | Organic Cation |
|---|---|---|
| (B1-1P) | (b1-s-2) | (b2-c-1) |
| (B1-2P) | (b1-s-2) | (b2-c-21) |
| (B1-3P) | (b1-s-11) | (b2-c-1) |
| (B1-4P) | (b1-s-11) | (b2-c-2) |
| (B1-5P) | (b1-s-11) | (b2-c-6) |
| (B1-6P) | (b1-s-11) | (b2-c-10) |

TABLE 2-continued

| Acid generator (B1) | Sulfonate Anion | Organic Cation |
|---|---|---|
| (B1-7P) | (b1-s-11) | (b2-c-12) |
| (B1-8P) | (b1-s-11) | (b2-c-15) |
| (B1-9P) | (b1-s-11) | (b2-c-21) |
| (B1-10P) | (b1-s-11) | (b2-c-23) |
| (B1-11P) | (b1-s-14) | (b2-c-1) |
| (B1-12P) | (b1-s-14) | (b2-c-2) |
| (B1-13P) | (b1-s-14) | (b2-c-6) |
| (B1-14P) | (b1-s-14) | (b2-c-10) |
| (B1-15P) | (b1-s-14) | (b2-c-12) |
| (B1-16P) | (b1-s-14) | (b2-c-15) |
| (B1-17P) | (b1-s-14) | (b2-c-21) |
| (B1-18P) | (b1-s-14) | (b2-c-23) |
| (B1-19P) | (b1-s-20) | (b2-c-1) |
| (B1-20P) | (b1-s-20) | (b2-c-2) |
| (B1-21P) | (b1-s-20) | (b2-c-6) |
| (B1-22P) | (b1-s-20) | (b2-c-10) |
| (B1-23P) | (b1-s-20) | (b2-c-12) |
| (B1-24P) | (b1-s-20) | (b2-c-15) |
| (B1-25P) | (b1-s-20) | (b2-c-21) |
| (B1-26P) | (b1-s-20) | (b2-c-23) |
| (B1-27P) | (b1-s-4) | (b2-c-1) |
| (B1-28P) | (b1-s-35) | (b2-c-1) |
| (B1-29P) | (b1-s-36) | (b2-c-1) |
| (B1-30P) | (b1-s-39) | (b2-e-1) |
| (B1-31P) | (b1-s-40) | (b2-c-1) |
| (B1-32P) | (b1-s-41) | (b2-c-1) |
| (B1-33P) | (b1-s-42) | (b2-c-1) |

Preferred acid generators (B1) are a salt represented by the formula (B1-1) to the formula (B1-17) below. Among these, the formulae (B1-2), (B1-3), (B1-6), (B1-7), (B1-11) and (B1-14) are preferable.

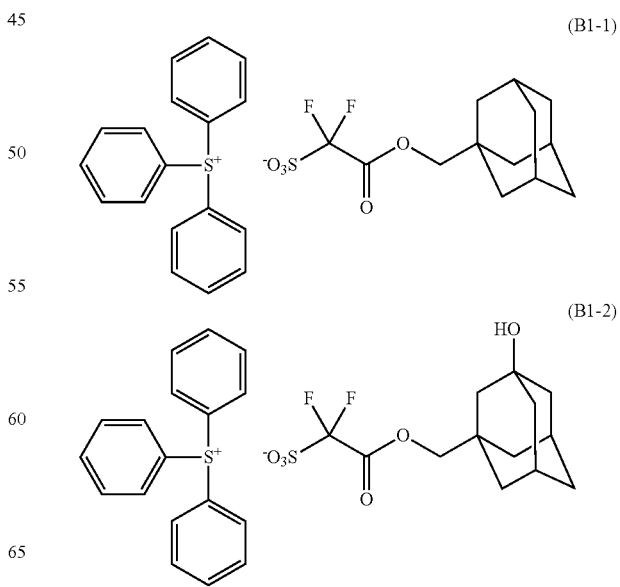

-continued
(B1-3)
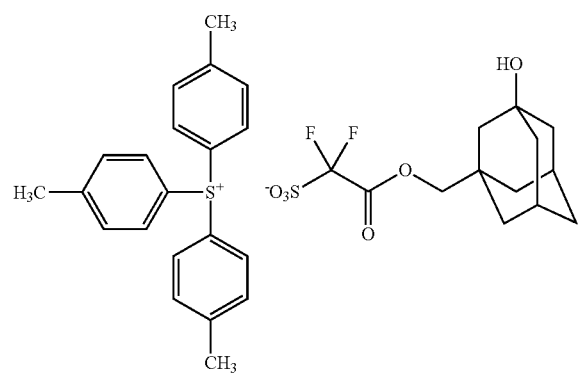
(B1-7)
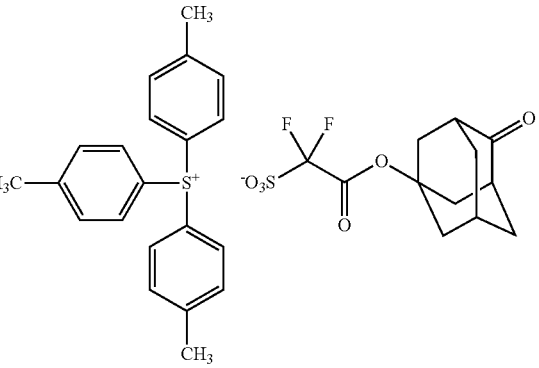
(B1-4)
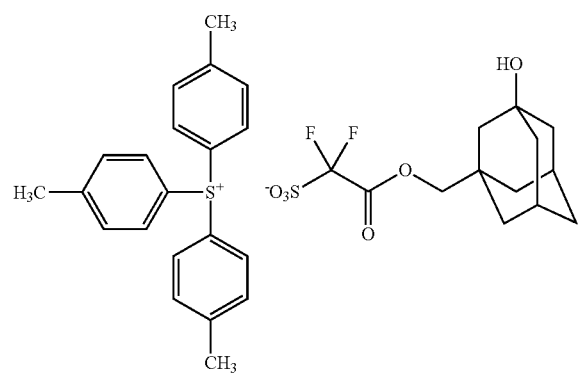
(B1-8)
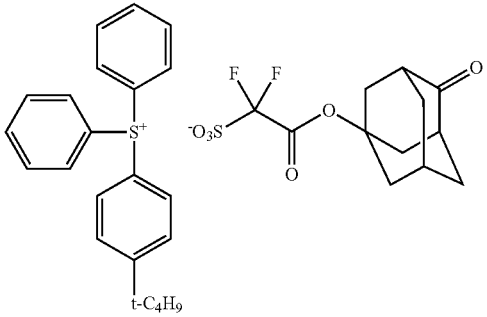
(B1-5)
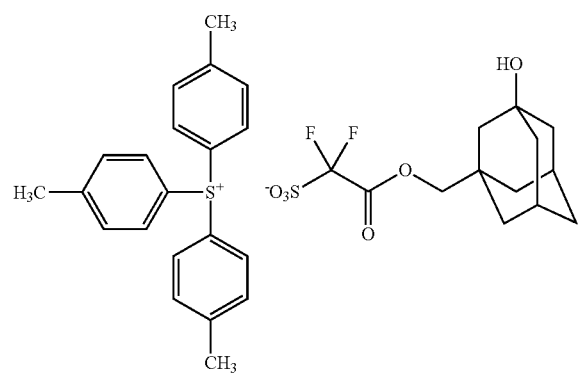
(B1-9)
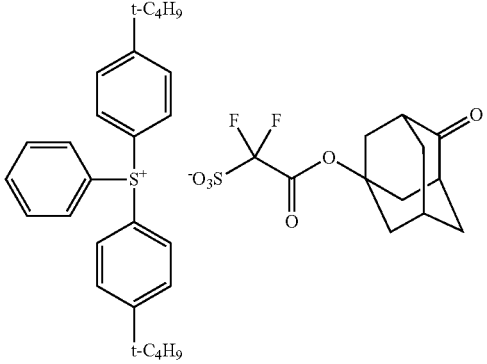
(B1-6)
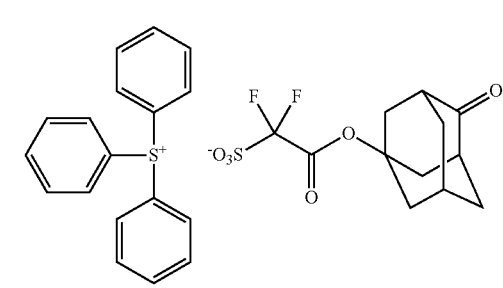
(B1-10)
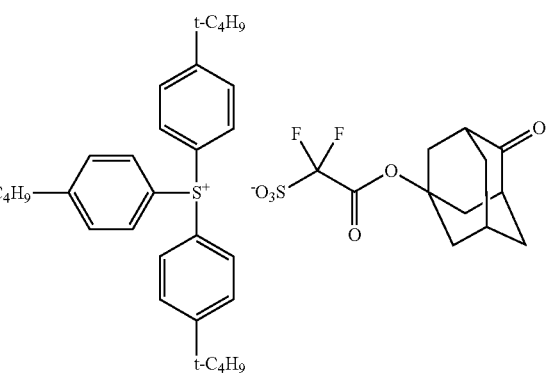

-continued (B1-11)
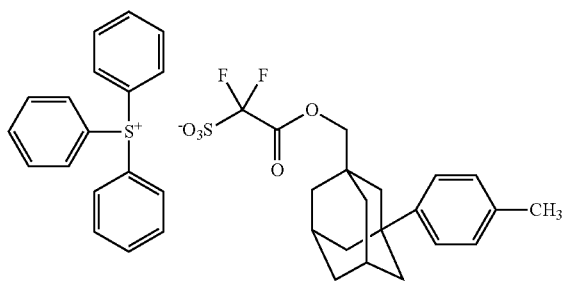

(B1-12)
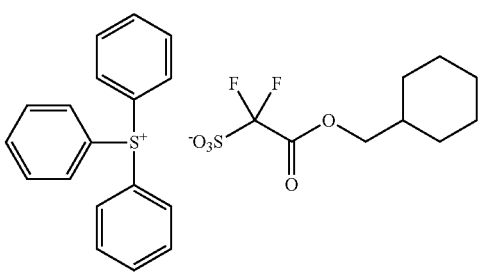

(B1-13)
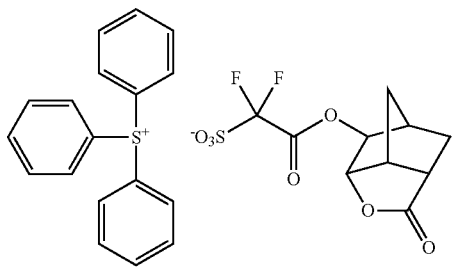

(B1-14)
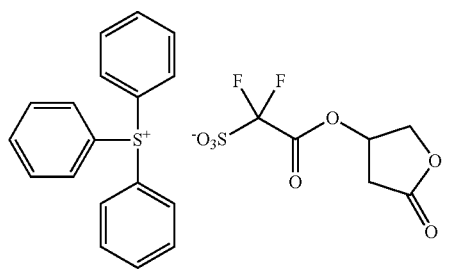

(B1-15)
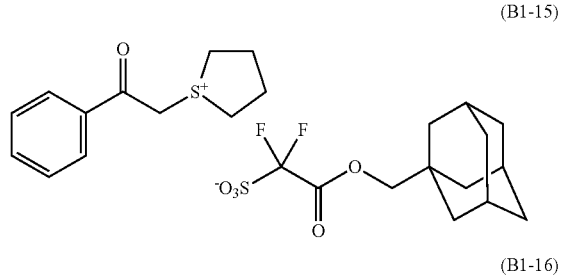

(B1-16)
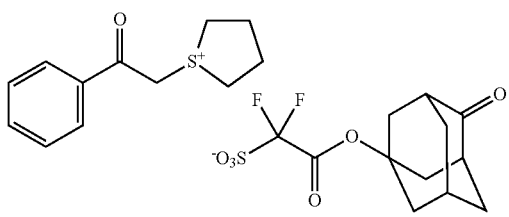

(B1-17)
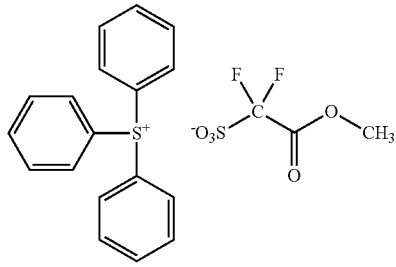

The acid generator (B) may include an acid generator other than the acid generator (B1) as described above, in this case, the proportion of the acid generator (B1) is preferably 70 weight % or more, more preferably 90 weight % or more, and still more preferably substantially 100 weight %, with respect to total weight (100 weight %) of acid generator (B).

<Basic Compound (C)">

The resist composition of the present invention may contain a basic compound (C). The basic compound (C) is a compound having a property to quench an acid, in particular, generated from the acid generator (B), and called "quencher".

As the basic compounds (C), nitrogen-containing basic compounds (for example, amine and basic ammonium salt) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and a heteroaromatic amine such as pyridine.

Preferred basic compounds (C) include compounds presented by the formula (C1) to the formula (C8) as described below. Among these, the basic compound presented by the formula (C1) is more preferable.

(C1)
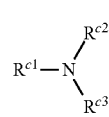

wherein $R^{c1}$, $R^{c2}$ and $R^{c3}$ independently represent a hydrogen atom, a $C_1$ to $C_6$ alkyl group, $C_5$ to $C_{10}$ alicyclic hydrocarbon group or a $C_6$ to $C_{10}$ aromatic hydrocarbon group, one or more hydrogen atom contained in the alkyl group and alicyclic hydrocarbon group may be replaced by a hydroxy group, an amino group or a $C_1$ to $C_6$ alkoxyl group, one or more hydrogen atom contained in the aromatic hydrocarbon group may be replaced by a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group.

(C1-1)
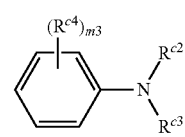

wherein $R^{c2}$ and $R^{c3}$ have the same definition of the above; $R^{c4}$ in each occurrence represents a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group;
m3 represents an integer 0 to 3.

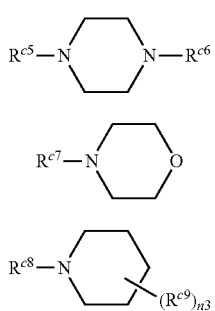

(C2)

(C3)

(C4)

wherein $R^{c5}$, $R^{c6}$, $R^{c7}$ and $R^{c8}$ independently represent the any of the group as described in $R^{c1}$ of the above;

$R^{c9}$ in each occurrence independently represents a $C_1$ to $C_6$ alkyl group, a $C_3$ to $C_6$ alicyclic hydrocarbon group or a $C_2$ to $C_6$ alkanoyl group;

n3 represents an integer of 0 to 8.

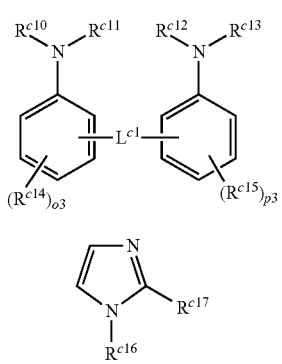

(C5)

(C6)

wherein $R^{c10}$, $R^{c11}$, $R^{c12}$, $R^{c13}$ and $R^{16}$ independently represent the any of the groups as described in $R^{c1}$;

$R^{c14}$, $R^{c15}$ and $R^{c17}$ in each occurrence independently represent the any of the groups as described in $R^{c4}$;

o3 and p3 represent an integer of 0 to 3;

$L^{c1}$ represents a divalent $C_1$ to $C_6$ alkanediyl group, —CO—, —C(=NH)—, —S— or a combination thereof;

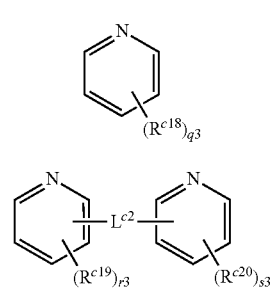

(C7)

(C8)

wherein $R^{c18}$, $R^{c19}$ and $R^{c20}$ in each occurrence independently represent the any of the groups as described in $R^{c4}$;

q3, r3 and s3 represent an integer of 0 to 3;

$L^{c2}$ represents a single bond, a divalent $C_1$ to $C_6$ alkanediyl group, —CO—, —C(=NH)—, —S— or a combination thereof.

Examples of the alkanoyl group include acetyl group, 2-methylacetyl group, 2,2-dimethylacetyl group, propionyl group, butylyl group, izobutylyl group, pentanoyl group, and 2,2-dimethylpropionyl group.

Specific examples of the amine represented by the formula ($C_1$) include 1-naphtylamine and 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Among these, diisopropylaniline is preferable, particularly 2,6-diisopropylaniline is more preferable as the basic compounds (C) contained in the present resist compound.

Specific examples of the compound represented by the formula (C2) include, for example, piperazine.

Specific examples of the compound represented by the formula (C3) include, for example, morpholine.

Specific examples of the compound represented by the formula (C4) include, for example, piperizine, a hindered amine compound having piperizine skeleton described in JP H11-52575-A.

Specific examples of the compound represented by the formula (C5) include, for example, 2,2'-methylenebisaniline.

Specific examples of the compound represented by the formula (C6) include, for example, imidazole and 4-methylimidazole.

Specific examples of the compound represented by the formula (C7) include, for example, pyrizine and 4-methylpyrizine.

Specific examples of the compound represented by the formula (C8) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

<Solvent (Hereinafter May be Referred to "Solvent (D)")>

The resist composition of the present invention preferably includes a solvent (D). The solvent (D) can be preferably selected depending on the kinds and an amount of the resin (X) having the structural unit derived from the compound (aa) and the structural unit derived from the compound (ab), and a kind and an amount of the acid generator from a viewpoint of good coating properties.

Examples of the solvent (D) include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

<Other Ingredient (Hereinafter May be Referred to "Other Ingredient (F)">

The resist composition can also include various additives as needed. Examples of the other ingredient (F) include sensitizers, dissolution inhibitors, surfactants, stabilizers and dyes.

<Preparing the Resist Composition>

The present resist composition can be prepared by mixing the resin (in particular a combination of the resin (A) and the resin (X)) and the acid generator (B), or by mixing the resin (in particular a combination of the resin (A) and the resin (X)), the acid generator (B1), and the basic compound (C), the solvent (D) and the other ingredient (F) as needed. There is no particular limitation on the order of mixing. The mixing may be performed in an arbitrary order. The temperature of mixing may be adjusted to an appropriate temperature within the range of 10 to 40° C., depending on the kinds of the resin and solubility in the solvent (D) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present resist compositions can be prepared by filtering the mixture through a filter having about 0.01 to 0.2 μm pore diameter.

The proportion of the resin (i.e., total amount of the resin (A) and the resin (X)) can be adjusted with respect to the total solid proportion of the resist composition. Foe example, the resist composition of the present invention preferably contains 80 weight % or more and 99 weight % or less of the resin, with respect to the total solid proportion of the resist composition.

In the specification, the term "solid proportion of the resist composition" means the entire proportion of all ingredients other than the solvent (D). For example, if the proportion of the solvent (D) is 90 weight %, the solid proportion of the resist composition is 10 weight %.

In the resist composition of the present invention, the proportion of the acid generator (B) is preferably 1 part by weight or more (and more preferably 3 parts by weight or more), and also preferably 30 parts by weight or less (and more preferably 25 parts by weight or less), with respect to 100 parts by weight of the resin.

When the resist composition includes the basic compound (C), the proportion thereof is preferably 0.01 to 1 weight % with respect to the total solid proportion of the resist composition.

The proportion of the solvent (D) may be adjusted depending on the kinds of the resin (X), and it may be 90 weight % or more, preferably 92 weight % or more, and more preferably 94 weight % or more, and also preferably 99 weight % or less and more preferably 99.9 weight % or less. If the resist composition contains the solvent within such range, such resist composition is preferable for forming the thin resist film which can be used for producing a composition layer of 30 to 300 nm thick.

The proportion of the resin (X), the acid generator (B), the basic compound (C), and solvent (D) can be adjusted depending on each ingredient used during the preparation of the present resist composition, and can be measured with a known analytical method such as, for example, liquid chromatography and gas chromatography, after preparing the present resist composition.

If the other ingredient (F) is used in the present resist composition, the proportion thereof can also be adjusted depending on the kinds thereof.

<Method for Forming Resist Pattern>

The method for forming resist pattern of the present invention includes the steps of:

(1) applying the resist composition of the present invention onto a substrate;

(2) drying the applied composition to form a composition layer;

(3) exposing the composition layer;

(4) heating the exposed composition layer, and (5) developing the heated composition layer.

Applying the resist composition onto the substrate can generally be carried out through the use of a resist application device, such as a spin coater known in the field of semiconductor microfabrication technique. The thickness of the applied resist composition layer can be adjusted by controlling the variable conditions of the resist application device. These conditions can be selected based on a pre-experiment carried out beforehand. The substrate can be selected from various substrates intended to be microfabricated. The substrate may be washed, and an organic antireflection film may be formed on the substrate by use of a commercially available antireflection composition, before the application of the resist composition.

Drying the applied composition layer, for example, can be carried out using a heating device such as a hotplate (so-called "prebake"), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0 \times 10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

The composition layer may be formed with an exposed portion and an unexposed portion by the above exposure carried out through the mask. In the exposed portion, acid is produced from the acid generator contained in the resist composition upon receiving the energy of the exposure. Thus, the acid-labile group contained in the resin (X) reacts with the acid to eliminate the protecting group and generate the hydrophilic group. As the result, the resin in the exposed portion of the composition layer becomes soluble in an alkali aqueous solution. On the other hand, in the unexposed portion, the resin (X) remains insoluble or poorly soluble in an alkali aqueous solution because of the lack of exposure. In this way, the solubility in the alkali solution will be different between the composition layer in the exposed portion and the composition layer in the unexposed portion.

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developing solution and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developing solution, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the proportion or amounts used in the Examples and Comparative Examples are based on weight, unless otherwise specified.

The weight average molecular weight is a value determined by gel permeation chromatography using polystyrene as the standard product.

Column: TSKgel Multipore HXL-Mx3 connecting+guardcolumn (Tosoh Co. ltd.)

Eluant: tetrahydrofuran

Flow rate: 1.0 mL/min

Detecting device: RI detector

Column temperature: 40° C.

Injection amount: 100 µL

Standard material for calculating molecular weight: standard polysthylene (Tosoh Co., ltd.)

Synthetic Example of the resin

The monomers used the synthesis of the resin are shown below.

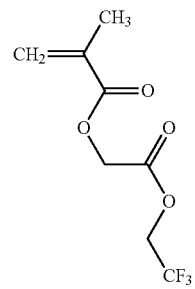
(M-A)

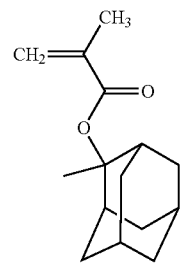
(M-B)

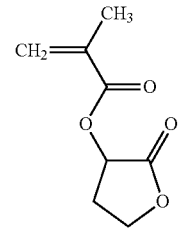
(M-C)

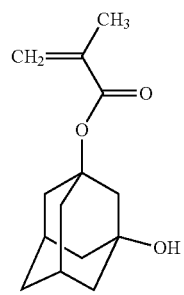
(M-D)

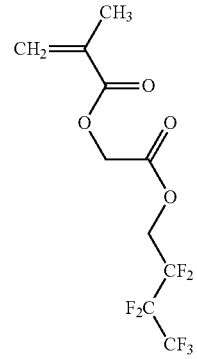
(M-E)

(M-F)
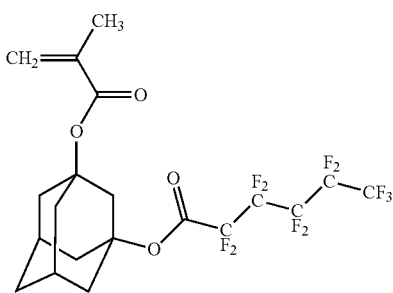

(M-G)
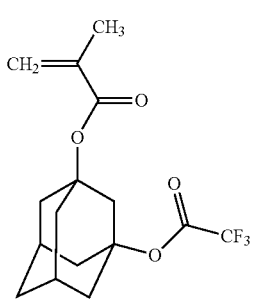

(M-H)
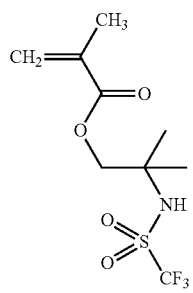

(M-I)
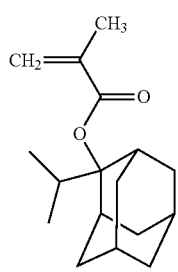

(M-J)
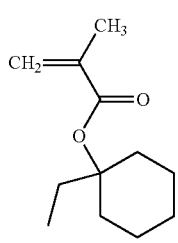

(M-K)
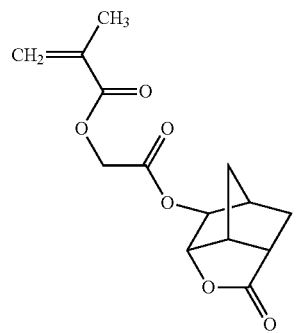

(M-L)

These monomers are referred to as "monomer (M-A)" to "monomer (M-L)".

Synthetic Example 1

Synthesis of Resin A1

Monomer (M-E) and monomer (M-G) were mixed together with a mole ratio of Monomer (M-E):monomer (M-G)=70:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 72° C. After that, the obtained reacted mixture was poured into a large amount of n-heptane to precipitate a resin. The obtained resin was filtrated, resulting in a 76% yield of copolymer having a weight average molecular weight of about 14000. This copolymer, which had the structural units derived from the monomers of the following formula, was referred to Resin A1.

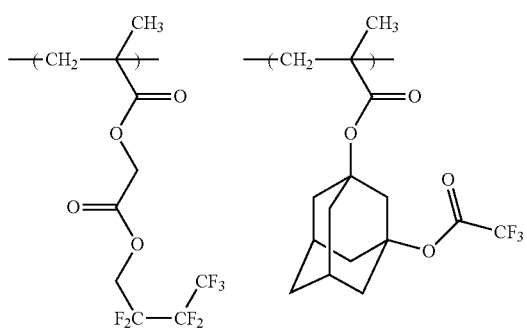

Synthetic Example 2

Synthesis of Resin A2

Monomer (M-E) and monomer (M-G) were mixed together with a mole ratio of Monomer (M-E):monomer (M-G)=80:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 72° C. After that, the obtained reacted mixture was poured into a large amount of n-heptane to precipitate a resin. The obtained resin was filtrated, resulting in a 78% yield of copolymer having a weight average molecular weight of about 13000. This copolymer, which had the structural units derived from the monomers of the following formula, was referred to Resin A2.

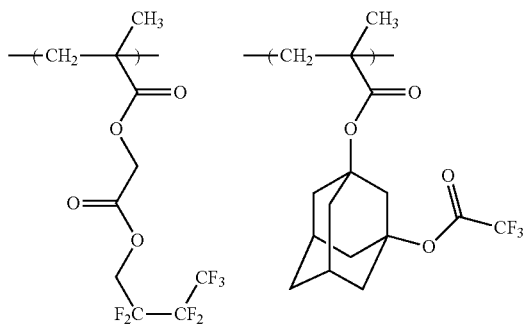

Synthetic Example 3

Synthesis of Resin A3

Monomer (M-E) and monomer (M-G) were mixed together with a mole ratio of Monomer (M-E):monomer (M-G)=90:10, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 72° C. After that, the obtained reacted mixture was poured into a large amount of n-heptane to precipitate a resin. The obtained resin was filtrated, resulting in a 75% yield of copolymer having a weight average molecular weight of about 14000. This copolymer, which had the structural units derived from the monomers of the following formula, was referred to Resin A3.

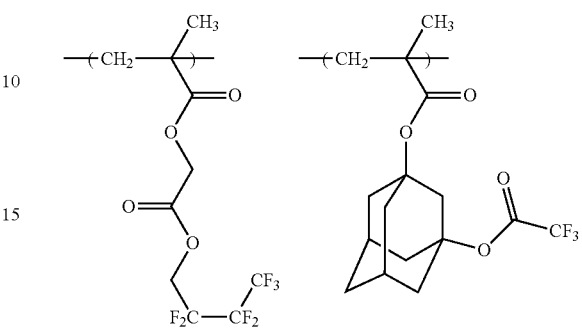

Synthetic Example 4

Synthesis of Resin A4

Monomer (M-E), monomer (M-F) and monomer (M-H) were mixed together with a mole ratio of monomer (M-E):monomer (M-F):monomer (M-H)=30:10:60, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.2 mol % and 3.6 mol % respectively with respect to the entire amount of monomers, and the reacted mixture was heated for about 5 hours at 72° C. After that, the obtained reaction mixture was poured into a large amount of n-heptane to precipitate a resin. The obtained resin was filtrated, resulting in a 93% yield of copolymer having a weight average molecular weight of about 15000. This copolymer, which had the structural units derived from the monomers of the following formula, was referred to Resin A4.

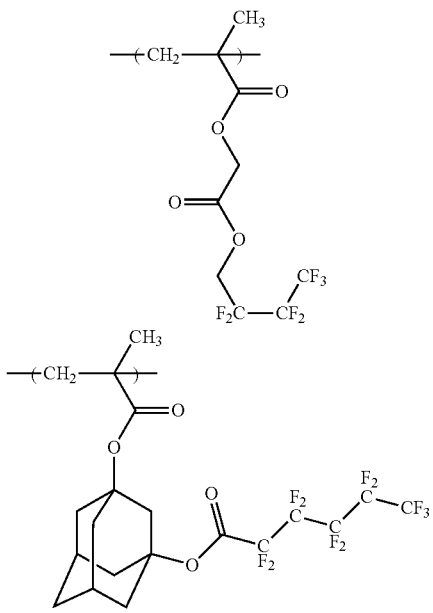

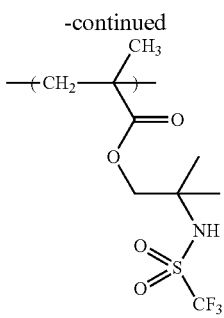

Synthetic Example 5

Synthesis of Resin A5

Monomer (M-I), monomer (M-J), monomer (M-D), monomer (M-K) and monomer (M-C) were mixed together with a mole ratio of monomer (M-I): monomer (M-J):monomer (M-D):monomer (M-K):monomer (M-C)=32:7:8:10:43, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 73° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated 2 times, resulting in a 63% yield of copolymer having a weight average molecular weight of about 7200. This copolymer, which had the structural units derived from the monomers of the following formula, was referred to Resin A5.

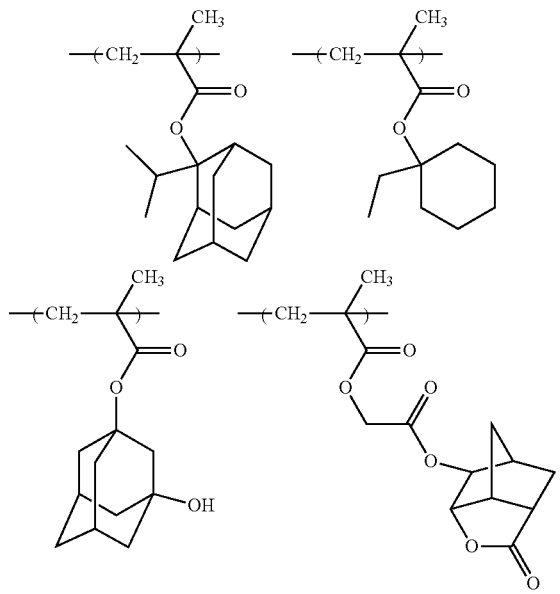

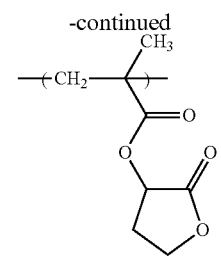

Synthetic Example 6

Synthesis of Resin A6

Monomer (M-B), monomer (M-C) and monomer (M-D) were mixed together with a mole ratio of monomer (M-B): monomer (M-C):monomer (M-D)=35:45:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.0 mol % and 3.0 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated 2 times, resulting in a 75% yield of copolymer having a weight average molecular weight of about 7000. This copolymer, which had the structural units derived from the monomers of the following formula, was referred to Resin A6.

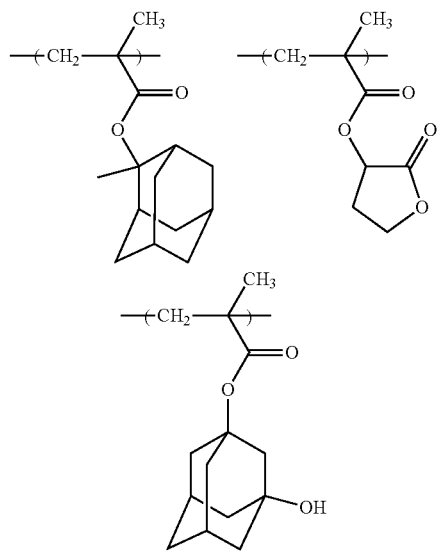

Synthetic Example 7

Synthesis of Resin A7

Monomer (M-A) and monomer (M-B) were mixed together with a mole ratio of monomer (M-A):monomer (M-B)=80:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.5 mol % and 1.5 mol % respectively with respect to the entire amount of monomers, and the resultant mixture was heated for about 5 hours at 70° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, resulting in a 70% yield of copolymer having a weight average molecular weight of about 28000. This copolymer, which had the structural units derived from the monomers of the following formula, was referred to Resin A7.

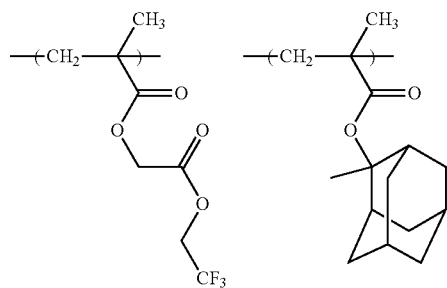

Synthetic Example 8

Synthesis of Resin A8

Monomer (M-L) and monomer (M-G) were mixed together with a mole ratio of Monomer (M-L):monomer (M-G)=90:10, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.9 mol % and 2.7 mol % respectively with respect to the entire amount of monomers, and the resultant mixture was heated for about 5 hours at 70° C. After that, the obtained reacted mixture was poured into a large amount of n-heptane to precipitate a resin. The obtained resin was filtrated, resulting in a 78% yield of copolymer having a weight average molecular weight of about 17000. This copolymer, which had the structural units derived from the monomers of the following formula, was referred to Resin A8.

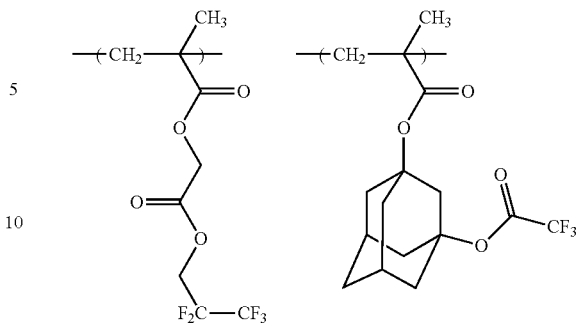

(Preparing Resist Composition)

Resist compositions were prepared by mixing and dissolving each of the components shown in Table 3, and then filtrating through a fluororesin filter having 0.2 μm pore diameter.

TABLE 3

| | Resin (parts) | Acid generator (parts) | Basic Comp. (parts) | PB/PEB (° C./° C.) |
|---|---|---|---|---|
| Ex. 1 | A1/A5 = 0.3/10 | B1 = 1.0 | C1 = 0.07 | 95/85 |
| Ex. 2 | A2/A5 = 0.3/10 | B1 = 1.0 | C1 = 0.07 | 95/85 |
| Ex. 3 | A3/A5 = 0.3/10 | B1 = 1.0 | C1 = 0.07 | 95/85 |
| Ex. 4 | A4/A5 = 0.3/10 | B1 = 1.0 | C1 = 0.07 | 95/85 |
| Ex. 5 | A1/A5 = 0.2/10 | B1 = 1.0 | C1 = 0.07 | 95/85 |
| Ex. 6 | A1/A5 = 0.1/10 | B1 = 1.0 | C1 = 0.07 | 95/85 |
| Ex. 7 | A1/A6 = 0.3/10 | B2/B3 = 1.0/0.1 | C1 = 0.07 | 110/110 |
| Ex. 8 | A8/A5 = 0.3/10 | B1 = 1.0 | C1 = 0.07 | 95/85 |
| Comp. Ex. 1 | A7/A6 = 0.1/10 | B2/B3 = 1.0/0.1 | C1 = 0.07 | 110/110 |

<Resin>

A1 to A8: Resin A1 to Resin A8 prepared by the Synthetic Examples

Resin (X): A1 to A4 and A8

<Acid Generator>

Acid generator B1: this was prepared by a method according to the method described in the Examples of JP2010-152341

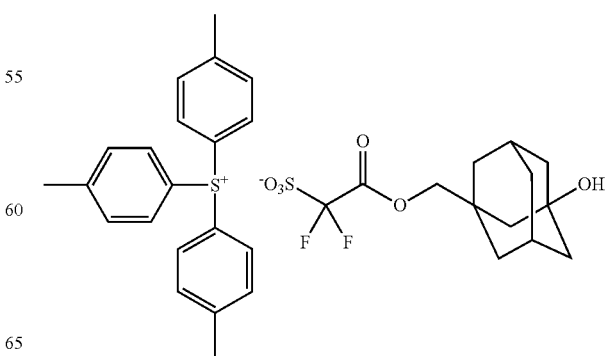

Acid generator B2: this was prepared by a method according to the method described in the Examples of WO 2008/99869

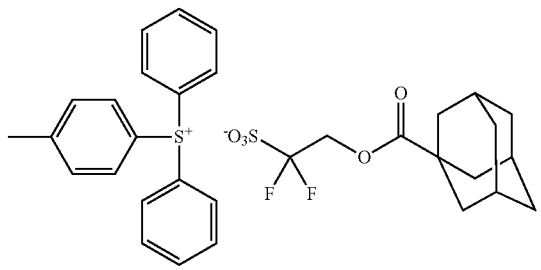

Acid generator B3: this was prepared by a method according to the method described in the Examples of JP2007-108581

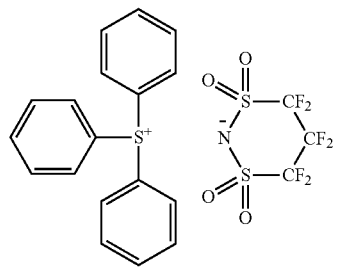 [SMILES: c1ccc([S+](c2ccccc2)c2ccccc2)cc1 ; O=S1(=O)[N-]S(=O)(=O)C(F)(F)C(F)(F)C1(F)F]

<Qencher>
C1: 2,6-diisopropylaniline (obtained from Tokyo Chemical Industry Co., LTD)
<Solvent>

| | |
|---|---|
| Propylene glycol monomethyl ether acetate | 265.0 parts |
| Propylene glycol monomethyl ether | 20.0 parts |
| 2-Heptanone | 20.0 parts |
| γ-Butyrolactone | 3.5 parts |

(Evaluation of Defects)

The above resist compositions were applied on each of the 12-inch-silicon wafers by spin coating so that the thickness of the resulting film became 150 nm after drying.

The obtained wafers were then pre-baked for 60 seconds on a direct hot plate at the temperatures given in the "PB" column in Table 3 to obtain a composition layer.

The thus obtained wafers with the produced composition layers were rinsed with water for 60 seconds using a developing apparatus (ACT-12, Tokyo electron Co. Ltd.).

Thereafter, the number of defects was counted using a defect inspection apparatus (KLA-2360, KLA-Tencor Co. Ltd.)

Table 4 illustrates the results thereof.

(Producing Resist Pattern by Immersion Lithography)

A composition for an organic antireflective film ("ARC-29", by Nissan Chemical Co. Ltd.) was applied onto silicon wafers and baked for 60 seconds at 205° C. to form a 78 nm thick organic antireflective film on each of the silicon wafers.

The above resist compositions were then applied thereon by spin coating so that the thickness of the resulting composition layer became 85 nm after drying (i.e., prebake).

The obtained wafers were then pre-baked for 60 seconds on a direct hot plate at the temperatures given in the "PB" column in Table 3 to form a composition layer.

Contact hole patterns were then exposed using a mask pattern (hole pitch: 100 nm, hole diameter: 70 nm) through stepwise changes in exposure quantity using an ArF excimer laser stepper for immersion lithography ("XT:1900Gi" by ASML Ltd.: NA=1.35, 3/42 annularX-Y polarization), on the wafers on which the composition layer had thus been formed. The ultrapure water was used as medium of immersion.

After the exposure, post-exposure baking was carried out for 60 seconds at the temperatures given in the "PEB" column in Table 3.

Then, puddle development was carried out with 2.38 wt % tetramethylammonium hydroxide aqueous solution for 60 seconds to obtain resist patterns.

Each resist pattern was produced based on the resist composition using the mask pattern (hole pitch: 100 nm, hole diameter: 70 nm) as described above. The exposure amount at which a 55 nm-hole diameter was achieved in the pattern was defined as the effective sensitivity.

(Critical Dimension Uniformity (CDU) Evaluation)

The resist patterns were formed by the same method described above with the effective sensitivity. The hole diameter was measured 24 times per one hole, and an average of those was an average hole diameter. The standard deviation was obtained from the average hole diameter based on the population which was 400 values of the above average hole diameter within the same wafer.

A Scanning Electron Microscope (CD SEM Hitachi CG-4000) was used for CDU evaluation.

Table 4 shows the results thereof.

TABLE 4

| | Defects | CDU |
|---|---|---|
| Ex. 1 | 320 | 1.68 |
| Ex. 2 | 340 | 1.64 |
| Ex. 3 | 370 | 1.63 |
| Ex. 4 | 400 | 1.62 |
| Ex. 5 | 380 | 1.78 |
| Ex. 6 | 460 | 1.58 |
| Ex. 7 | 550 | 1.95 |
| Ex. 8 | 420 | 1.59 |
| Comp. Ex. 1 | 720 | 2.15 |

The present resist composition (the resist compositions of Example 1 to Example 8) was possible to achieve an excellent CDU when producing the resist patterns.

Meanwhile, with the Comparative Example 1, there were a poor CDU when producing the resist pattern.

Also, the present resist composition (the resist compositions of Example 1 to Example 8) was possible to achieve few defects compared to the Comparative Example when producing the resist patterns.

According to the resist composition of the present invention, it is possible to produce a resist pattern with excellent CDU and with few defects when producing the resist pattern. Therefore, the present resist composition can be used for semiconductor microfabrication.

What is claimed is:

1. A resist composition comprising:
   a resin which is insoluble or poorly soluble in aqueous alkali solution, but becomes soluble in aqueous alkali solution by the action of acid;
   a resin, not having an acid-labile group, having a structural unit represented by the formula (aa) and a structural unit represented by the formula (ab);
   an acid generator; and
   a solvent,

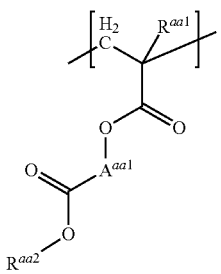
(aa)

wherein $R^{aa1}$ represents a hydrogen atom or a methyl group;
$A^{aa1}$ represents an optionally substituted $C_1$ to $C_6$ alkanediyl group or a group represented by the formula (a-1);

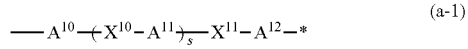
(a-1)

wherein s represents 0 or 1;
$X^{10}$ and $X^{11}$ independently represents an oxygen atom, a carbonyl group, a carbonyloxy group or an oxycarbonyl group;
$A^{10}$, $A^{11}$ and $A^{12}$ independently represent an optionally substituted $C_1$ to $C_5$ aliphatic hydrocarbon group;
* represents a bond to a carbon atom;
$R^{aa2}$ represents a $C_1$ to $C_{18}$ saturated aliphatic hydrocarbon group in which one or more hydrogen atoms contained in the group are substituted with one or more fluorine atoms; and one or more —$CH_2$— contained in the aliphatic hydrocarbon group may be replaced by —O— or —CO—;

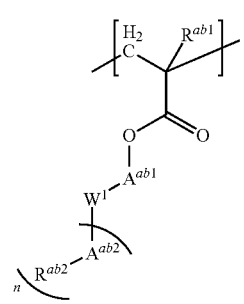
(ab)

wherein $R^{ab1}$ represents a hydrogen atom or a methyl group;
$A^{ab1}$ represents a single bond, an optionally substituted $C_1$ to $C_6$ alkanediyl group or a group represented by the formula(a-2);

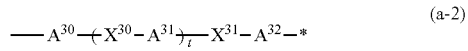
(a-2)

wherein t represents 0 or 1;
$X^{30}$ $X^{31}$ independently represents an oxygen atoms, a carbonyl group, a carbonyloxy group or an oxycarbonyl group;
$A^{30}$ and $A^{31}$ independently represent an optionally substituted $C_1$ to $C_5$ aliphatic hydrocarbon group;
$A^{32}$ represents an optionally substituted $C_1$ to $C_5$ aliphatic hydrocarbon group or a single bond;
* represents a bond to $W^1$;
$W^1$ represents an admantanediyl group or a cyclohexanediyl group;
n represents 1;
$A^{ab2}$ in each occurrence independently represents an optionally substituted $C_1$ to $C_6$ aliphatic hydrocarbon group, and one or more —$CH_2$— contained in the aliphatic hydrocarbon group may be replaced by —O— or —CO—;and
$R^{ab2}$ in each occurrence independently represents a $C_1$ to $C_{12}$ fluorinated alkyl group, and one or more hydrogen atom contained in the fluorinated alkyl group may be replaced by a hydroxy group or a hydroxymethyl group.

2. The resist composition according to claim 1, wherein $A^{aa1}$ of the formula (aa) is a $C_1$ to $C_6$ alkanediyl group.

3. The resist composition according to claim 1, wherein $A^{aa1}$ of the formula (aa) is a methylene group.

4. The resist composition according to claim 1, wherein the acid generator is an acid generator represented by the formula (B1);

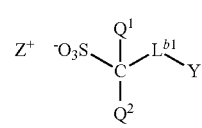
(B1)

wherein $Q^1$ and $Q^2$ independently represent a fluorine atom or a $C_1$ to $C_6$ perfluoroalkyl group;
$L^{b1}$ represents an optionally substituted $C_1$ to $C_{17}$ divalent aliphatic hydrocarbon group, and one or more —$CH_2$— contained in the aliphatic hydrocarbon group may be replaced by —O— or —CO—;
Y represents an optionally substituted $C_1$ to $C_{18}$ aliphatic hydrocarbon group, and one or more —$CH_2$— contained in the aliphatic hydrocarbon group may be replaced by —O—, —CO— or —$SO_2$—; and
$Z^+$ represents an organic cation.

5. The resist composition according to claim 4, wherein Y of the formula (B1) is an optionally substituted $C_3$ to $C_{18}$ alicyclic hydrocarbon group.

6. A method for producing a resist pattern comprising steps of:
(1) applying the resist composition according to claim 1 onto a substrate;
(2) drying the applied composition to form a composition layer;
(3) exposing the composition layer;
(4) heating the exposed composition layer; and
(5) developing the heated composition layer.

* * * * *